US008572539B2

(12) United States Patent
Cortadella et al.

(10) Patent No.: US 8,572,539 B2
(45) Date of Patent: Oct. 29, 2013

(54) VARIABILITY-AWARE SCHEME FOR HIGH-PERFORMANCE ASYNCHRONOUS CIRCUIT VOLTAGE REGULATION

(75) Inventors: Jordi Cortadella, Gelida (ES); Vigyan Singhal, Menlo Park, CA (US); Emre Tuncer, Santa Cruz, CA (US); Luciano Lavagno, Turin (IT)

(73) Assignee: eSilicon Corporation, Sunnyvale, CA (US)

( * ) Notice: Subject to any disclaimer, the term of this patent is extended or adjusted under 35 U.S.C. 154(b) by 967 days.

(21) Appl. No.: 12/265,585

(22) Filed: Nov. 5, 2008

(65) Prior Publication Data

US 2009/0115503 A1    May 7, 2009

Related U.S. Application Data

(60) Provisional application No. 60/985,878, filed on Nov. 6, 2007.

(51) Int. Cl.
| G06F 17/50 | (2006.01) |
| G06F 9/455 | (2006.01) |
| G06F 3/00 | (2006.01) |
| H03L 7/00 | (2006.01) |
| H03K 17/00 | (2006.01) |

(52) U.S. Cl.
USPC ........... 716/118; 716/104; 716/106; 716/108; 716/113; 716/120; 716/132; 716/133; 716/134; 716/136; 327/142; 327/291; 327/365

(58) Field of Classification Search
USPC ......... 716/104, 106, 108, 113, 120, 132, 133, 716/134, 136; 327/142, 291, 362, 365
See application file for complete search history.

(56) References Cited

U.S. PATENT DOCUMENTS

| 5,604,773 | A |  | 2/1997 | Urala |  |
| 6,118,319 | A | * | 9/2000 | Yamada et al. | 327/291 |
| 6,236,693 | B1 | * | 5/2001 | Haulin | 375/354 |
| 6,285,723 | B1 | * | 9/2001 | Yamada et al. | 375/354 |
| 6,314,553 | B1 |  | 11/2001 | Stevens et al. |  |
| 6,411,121 | B1 | * | 6/2002 | Culler | 326/30 |
| 6,771,096 | B1 | * | 8/2004 | Meyers et al. | 327/3 |

(Continued)

OTHER PUBLICATIONS

International Search Report for Related Foreign Application PCT/US2008/082679.

(Continued)

Primary Examiner — Helen Rossoshek
(74) Attorney, Agent, or Firm — Law Offices of John Stattler, PC

(57) ABSTRACT

A system for automatically transforming a given synchronous circuit description into an equivalent and provably correct desynchronized circuit description. Included in the automated transformation are techniques for synthesizing a variability-aware controller using a two-phase protocol, techniques for synthesizing a variability-aware controller using gated clocks and testability circuits, techniques for synthesizing a variability-aware controller optimized for performance, techniques for initializing the synthesized controller, techniques for dynamically minimizing power requirements, and techniques for interfacing the desynchronized circuit with external synchronous circuits. Also disclosed are techniques for implementing a system for automatically transforming a synchronous circuit description into an equivalent and provably correct desynchronized circuit description within the context of an electronic design automation design flow. Exemplary circuits used in the application of the aforementioned techniques are provided. Application of mathematical models and techniques used for proving equivalence between the input description and the resulting desynchronized circuit are presented and explained.

13 Claims, 33 Drawing Sheets

(56) References Cited

U.S. PATENT DOCUMENTS

| | | | |
|---|---|---|---|
| 6,941,484 B2* | 9/2005 | To et al. | 713/500 |
| 6,946,869 B2* | 9/2005 | Jacobson et al. | 326/33 |
| 7,099,786 B2* | 8/2006 | Nguyen et al. | 702/62 |
| 7,200,186 B2* | 4/2007 | Schoenborn | 375/316 |
| 7,511,535 B2* | 3/2009 | Chakraborty et al. | 326/93 |
| 7,522,686 B2* | 4/2009 | Nam et al. | 375/355 |
| 7,592,824 B2* | 9/2009 | Ware et al. | 324/750.3 |
| 7,701,255 B2* | 4/2010 | Cortadella et al. | 326/93 |
| 7,724,862 B2* | 5/2010 | Menolfi et al. | 375/376 |
| 2004/0025074 A1 | 2/2004 | Singh et al. | |
| 2004/0251939 A1* | 12/2004 | Brox et al. | 327/158 |
| 2006/0156050 A1 | 7/2006 | Sotiriou | |
| 2006/0190852 A1 | 8/2006 | Sotiriou | |
| 2006/0217919 A1 | 9/2006 | Sotiriou | |
| 2007/0170960 A1 | 7/2007 | Sakai et al. | |
| 2007/0277053 A1* | 11/2007 | Timmermans | 713/401 |
| 2009/0115469 A1* | 5/2009 | Cortadella et al. | 327/142 |
| 2009/0115488 A1* | 5/2009 | Cortadella et al. | 327/365 |
| 2009/0116597 A1* | 5/2009 | Cortadella et al. | 375/354 |
| 2009/0119621 A1* | 5/2009 | Cortadella et al. | 716/2 |
| 2009/0119622 A1* | 5/2009 | Cortadella et al. | 716/3 |
| 2009/0119631 A1* | 5/2009 | Cortadella et al. | 716/6 |
| 2009/0322370 A1* | 12/2009 | Ware et al. | 324/763 |
| 2011/0012639 A1* | 1/2011 | Tamura | 326/22 |
| 2011/0204932 A1* | 8/2011 | Cortadella et al. | 327/145 |

OTHER PUBLICATIONS

Cortadella, Jordi et al. 'Desynchronization: Synthesis of Asynchronous Circuits From Synchronous Specification' IEEE Transactions on Computer-Aided Design of Integrated Circuits and Systems. Oct. 2006, vol. 25, No. 10. pp. 1904-1921.

Blunno, I. et al. 'Handshake protocols for de-synchronization' In: proceedings of the 10$^{th}$ International Symposium on Asynchronous Circuits and Systems. Apr. 19-23, 2004, pp. 149-158, ISSN 1522-8681.

Cortadella, Jordi et al. 'A concurrent model for de-synchronization' In: Proceedings of the International Workshop on Logic Synthesis, 2003, pp. 294-301.

Cortadella, Jordi et al. 'From Synchronous to Asynchronous: An Automatic Approach,' Design, Automation and Test in Europe Conference and Exhibition, 2004. Proceedings, vol. 2, Feb. 16-20, 2004, pp. 1368-1369, Digital Object Identifier 10.1109/DATE.2004.1269092.

Cortadella, Jordi et al. 'Synthesis of Synchronous Elastic Architectures,' Design Automation Conference, 2006 43$^{rd}$ ACM/IEEE, pp. 657-662, Digital Object Identifier 10.1109/DAC.2006.229277.

Written Opinion of the International Searching Authority for Related Foreign Application PCT/US2008/082625.

International Search Report for Related Foreign Application PCT/US2008/082625.

Written Opinion of the International Searching Authority for Related Foreign Application PCT/US2008/082670.

International Search Report for Related Foreign Application PCT/US2008/082670.

Written Opinion of the International Searching Authority for Related Foreign Application PCT/US2008/082687.

International Search Report for Related Foreign Application PCT/US2008/082687.

U.S. Appl. No. 12/265,549, filed Nov. 5, 2008, Cortadella, et al.
U.S. Appl. No. 12/265,608, filed Nov. 5, 2008, Cortadella, et al.
U.S. Appl. No. 12/265,657, filed Nov. 5, 2008, Cortadella, et al.
U.S. Appl. No. 12/265,640, filed Nov. 5, 2008, Cortadella, et al.
U.S. Appl. No. 12/265,571, filed Nov. 5, 2008, Cortadella, et al.
U.S. Appl. No. 12/265,620, filed Nov. 5, 2008, Cortadella, et al.

Cortadelle, et al., Desynchronizations: Synthesis of Asynchronous Circuits from Synchronous Specifications, IEEE Transactions on Computer-Aided Design of Integrated Circuits and Systems, Oct. 2006, p. 1904-1921, vol. 25.

Varshavsky, et al., "Logical Timing (Global Synchronization of Asynchronous Arrays)," Proceedings of the First Aizu International Symposium on Parallel Algorithms/Architecture Synthesis (PAS '95), IEEE, 1995.

* cited by examiner

VARIABILITY-AWARE SCHEME FOR HIGH-PERFORMANCE ASYNCHRONOUS CIRCUIT VOLTAGE REGULATION

CLAIM OF PRIORITY

The present Application for Patent claims priority to Provisional Application No. 60/985,878 entitled "A Variability-Aware Asynchronous Scheme Based on Two-Phase Protocols and Delay Matching" filed Nov. 6, 2007, and assigned to the assignee hereof and hereby expressly incorporated by reference herein.

FIELD OF THE INVENTION

The present invention relates to asynchronous logic circuits and more particularly to automated synthesis thereof.

BACKGROUND OF THE INVENTION

A digital circuit is composed of two types of components: combinational and sequential. As shown in FIG. 1A the combinational components 1A10, 1A20, 1A30, and 1A40 implement Boolean functions, whereas the sequential components 1A50, 1A60, 1A70, and 1A80 act as memory elements that store the state of the circuit. The sequential components are usually implemented with flip-flops 1A50, or latches 1A60, and 1A70, or sometimes combinations of latches 1A80 in a master/slave arrangement. Most digital circuits use one or more clocks to synchronize the events produced in their components. Flip-flops are activated by one of the edges of a clock (rising or falling). Latches are activated by one of the levels of the clock (high or low). A register is a group of flip-flops or latches.

In conventional synchronous design, and as shown on FIG. 1B at 1B00, a clock 1B10 is a periodic signal with a period P 1B20 that is longer than the longest delay D 1B30 between pairs of sequential components 1B40, 1B50 separated by combinational logic 1B60. The frequency of a clock is generated externally from the circuit. For correct operation in real systems, the clock signals must be designed in such a way that the clock pulses arrive at the sequential components within close tolerances. In real systems, the sequential components require some finite duration tS (setup time) 1B80 during which duration the signal to be stored is stable (unchanging). It is only after this duration tS during which the signal to be stored has been stable that the signal can be reliably stored in the sequential component. Similarly, a finite duration tH (hold time) 1B90 is required for a stored value to propagate to the sequential element output after a clock edge. That is, for the sequential components to operate correctly, the setup and hold constraints must be satisfied before and after the corresponding active edges of the clock. As shown in the graph of FIG. 1C, the logic propagation delay of the components of the circuit may vary from one component to another due to process variations, and may vary dynamically due to environmental conditions (e.g. temperature and power supply variations). As shown, the transition from logic 1 to logic 0 under nominal conditions is shown as trace 1C10. Under conditions of low voltage, the transition requires more time to complete as shown in traces 1C20 and 1C30. Under conditions of high temperature, even at nominal voltage, the transition requires more time to complete as shown in trace 1C40. Also, the propagation delay through the combinational components may vary depending on the data involved in the computations. In a synchronous system using a global clock signal, the frequency of the clock signal must be defined in such a way that it can accommodate the worst-case delays under any process, environmental and operational conditions. For these reasons, designers are conservative in their design of synchronous circuits and, in the actual circuitry, the clock often runs at a frequency slower than the one it could run at if it could dynamically adapt to any combination of process variations, data variations, and changing environmental operating conditions.

Referring to FIG. 1D, while synchronous circuits such as those depicted in 1D00 include an external global clock, and thus operation is subject to the full range of variations and conditions explained above, asynchronous circuits 1D50 do not use a global clock for the synchronization of the sequential components. Instead, in asynchronous circuits 1D50, the clocking scheme is based on local handshakes between communicating components 1D60, 1D61, 1D70, and 1D71). Such schemes are typically implemented by a pair of signals called Request (Req) 1D80 and Acknowledge (Ack) 1D90. The events of these signals are used to perform data transfers between a sender and a receiver through a communication channel. Each event indicates a specific state of the channel and the data associated with it.

Mathematical techniques involving Petri Nets, specifically a type of Petri Net known as Marked Graphs (MGs) have been used in formally describing and analyzing systems with states and events. FIG. 1E at 1E00 shows a schematic representation of a pipeline with memory elements 1E01, 1E02, 1E03, and 1E04. The Marked Graph representation showing the same memory elements (states) 1E01, 1E02, 1E03, and 1E04 is depicted at 1E10, followed by alternate notations 1E30, and 1E50, (each using slightly different MG notation styles) of the event transitions possible in the marked graph of 1E10.

More specifically, the Marked Graph of 1E10 shows events abstracted as A, B, C, and D. The technique for creation of these events is not depicted in the Marked Graph of 1E10, and of course the Marked Graph is intended to be an abstraction that is unconcerned about the realization techniques for those events.

The paragraphs above have introduced external clocks and handshake signals, both techniques are able to create events. As regards the use of Request and Acknowledge signals for creating events, traditionally, two families of protocols have been proposed for real system realization of the Request and Acknowledge signals, namely (a) four-phase protocols, and (b) two-phase protocols. In four-phase protocols, only one of the edges of each the signals is ever active (i.e. able to raise an event). The other edge is used only to return to the state prior to raising the event. Every data transfer involves four events (e.g. rising and falling edges of each of the Request and Acknowledge signals). In two-phase protocols, every data transfer involves two events, one for each signal. The logic value of the signal is irrelevant with respect to creating an event; merely the transition from one logic value to another creates an event, thus providing a perfect symmetry between rising and falling edges. Various embodiments of the present invention are based on two-phase protocols, however similar embodiments might be implemented with four-phase protocols.

Abstractions for graphical presentations of synchronization logic proposed in the present disclosure uses the C-element shown in FIG. 1F, at 1F10. The C-element is found in the relevant literature and is known as a Muller C-element. A C-element is an abstraction of logic that can synchronize the events at the inputs. When the inputs have the same value, the output propagates the value at its inputs. When the inputs differ, the output remains unchanged. The symbol for a C-element and a possible implementation of a C-element using combinational gates are depicted at 1F10 and 1F20, respectively. Also shown in FIG. 1F at 1F30 is a C-element including a reset signal. The reset signal Reset, when asserted (logic 1, has the effect of producing a logic 0 at output Z.

C-elements are the basis of an architectural construction known as Muller's pipeline. FIG. 1G includes a depiction of a Muller pipeline 1G10. The Muller pipeline 1G10 shows the logic, including C-elements, that synchronizes the latches of a linear pipeline. The datapath contains blocks of combinational logic (CL) and transparent latches (L). The C-elements have one of the inputs complemented. The protocol implemented by the Muller pipeline shown at 1G10 belongs to the family of four-phase protocols.

C-elements are also used in Sutherland's micropipelines. A Sutherland micropipeline is a variation of Muller's pipeline adapted to operate using a two-phase protocol. The datapath of such a micropipeline requires special registers with two input control signals (capture and pass). The events on these signals indicate that the register must become transparent (pass) or opaque (capture).

Desynchronization

Desynchronization is a paradigm that can be implemented in an automatic conversion of a synchronous circuit into an asynchronous circuit. The underlying idea of the desynchronization paradigm consists of substituting the clock-generated synchronization events of the synchronous circuit with synchronization events generated by sets of local controllers. This paradigm is illustrated in FIG. 1H. Specifically shown are the contrasts between the synchronous global clock driven pipeline of 1H10 and the asynchronous two-phase controller-driven Sutherland micropipeline of 1H50.

Automatic desynchronization of a synchronized circuit seeks to preserve the behavior of the sequential elements of the circuit while substituting asynchronous controller-based synchronization. That is, instead of using a global clock to trigger the storage of state in the storage elements of the micropipeline, a distributed scheme based on local controller handshake signals is used. Every storage element has an associated local controller that determines when the incoming data is available and when the outgoing data has already been captured by the receivers. The local controller associated with every storage element communicates through the previously introduced pairs of handshake signals, usually called request and acknowledge.

Several schemes for desynchronization have been proposed, using different types of handshake protocols and logic in the datapath. Each scheme has its specific features regarding the complexity of the logic, the timing overhead introduced by the control, the power consumption and the robustness of the circuit to variability. Muller's pipeline and Sutherland's micropipelines can be considered as particular cases of desynchronization schemes.

Among the various schemes for desynchronization, one of those proposed is a transformation method from synchronous to asynchronous circuits in the context of the design of processor arrays. The method includes replacing the flip-flops with master-slave latches and creating a synchronization stratum with local controllers implementing a handshake protocol for event creation.

Embodiments of the present invention provide novel building blocks for a fully automated design flow that generates provably correct asynchronous circuits from synchronous specifications, especially using variability-aware local controllers 1H60, 1H61, 1H70, 1H71, 1H80, 1H81, etc, each implementing two-phase protocols with its neighbors.

The elasticity in the data transmission requires extra storage to implement those registers that receive new incoming data but have not been able to deliver the previously stored data. Without the extra storage, the synchronization is only possible by means of global signals (i.e., synchronous clocks). One way to provide this feature is to use the storage associated with the master and slave latches that implement the flip-flops. In a conventional synchronous design, it is not possible to store different data at each latch. However, the control layer of a desynchronization scheme can provide different and independently enabled signals for the master and slave latches.

Generally, and as previously indicated, two families of protocols have been proposed for implementing handshakes for local synchronization: four-phase protocols, and two-phase protocols. Originally, two-phase protocols with special latches were proposed for micropipelines. Later on, two-phase controllers using conventional latches were proposed. However, none of the previous proposals disclosed techniques adequate for a provably correct and fully automated flow covering any possible synchronous circuit.

Moreover, prior proposals included assumptions or limitations for desynchronization techniques that motivate the present disclosure. To advance the state of the art, the present invention considers methods for guaranteeing a correct timing after synthesis, techniques for local controller-based timing, techniques for clock gating, techniques for dealing with matched delays, techniques for performance tuning, techniques for initializing/resetting sequential circuits, techniques for communicating between asynchronous circuits and synchronous circuits, etc, and further discloses various methods to deal with several challenging aspects of the design and synthesis of circuits used in desynchronized systems.

It is the advancement of the art and limitations of such prior proposals that motivate the present invention disclosed herein.

SUMMARY OF THE INVENTION

A method for regulating voltage to maximize power efficiency in a desynchronized circuit, the method comprising, detecting a time separation between the speed of operation of a sender circuit and a receiver circuit, and adjusting a voltage in either the sender circuit or the receiver circuit. The method includes defining a time window between arrival of a request signal and arrival of an acknowledge signal, and adjusting the voltage so that the request and acknowledge signals both arrive within the time window.

DETAILED DESCRIPTION

Figure 1A:
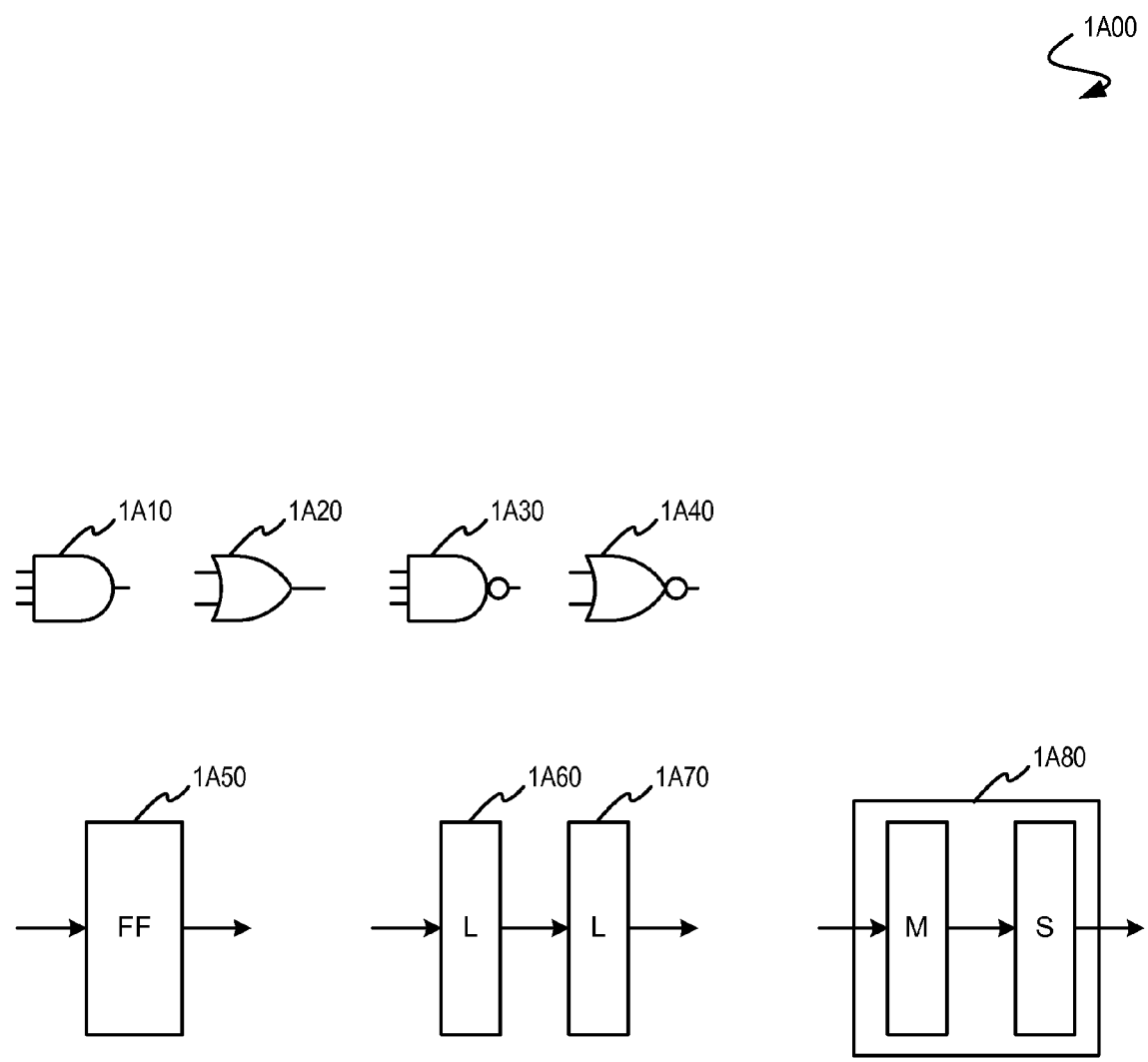
FIG. 1A depicts combinational and sequential elements.
Figure 1B:
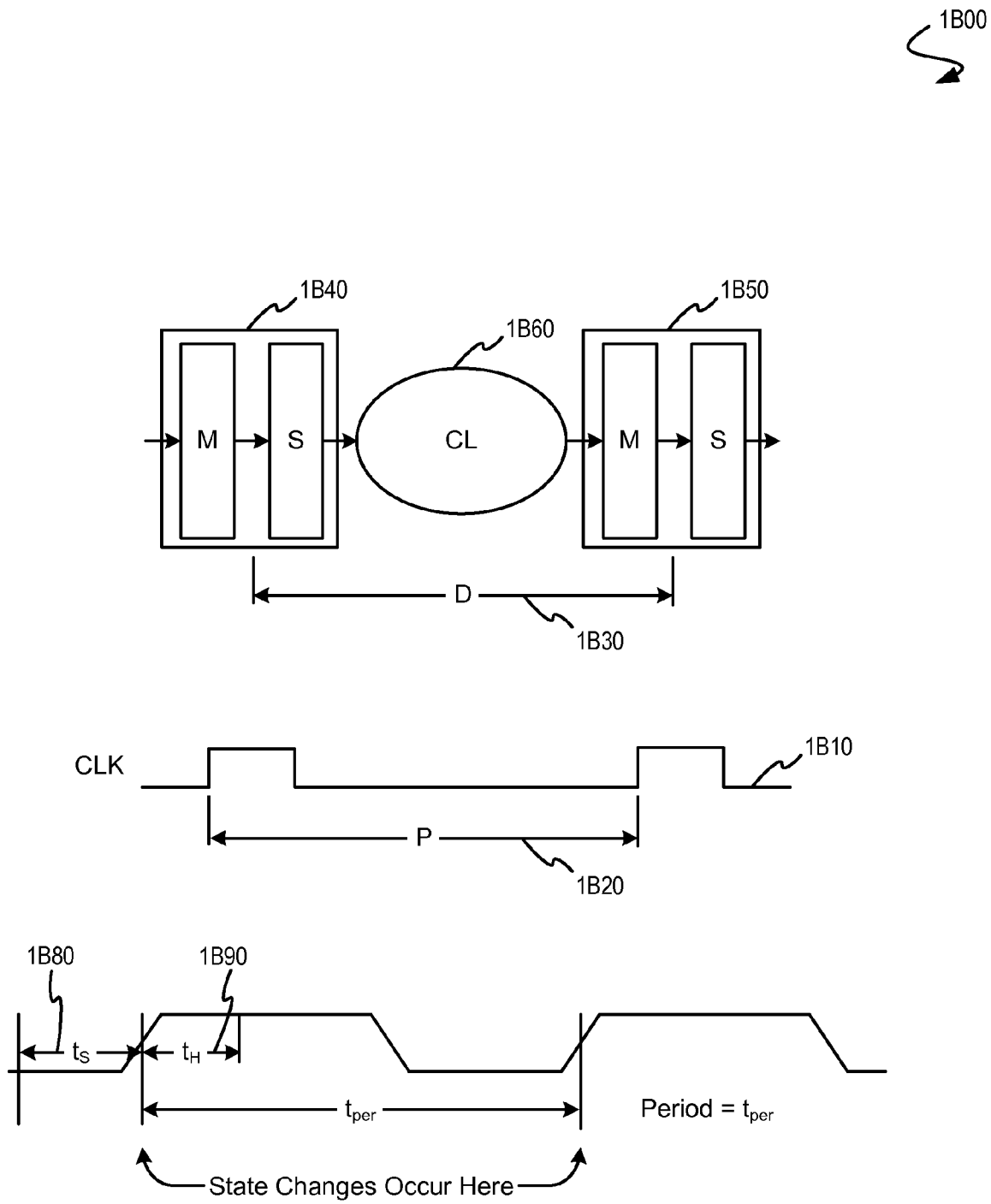
FIG. 1B depicts a global clock distributed to sequential elements, and the characteristics of a setup and hold time constraint in relation to a global clock signal.
Figure 1C:
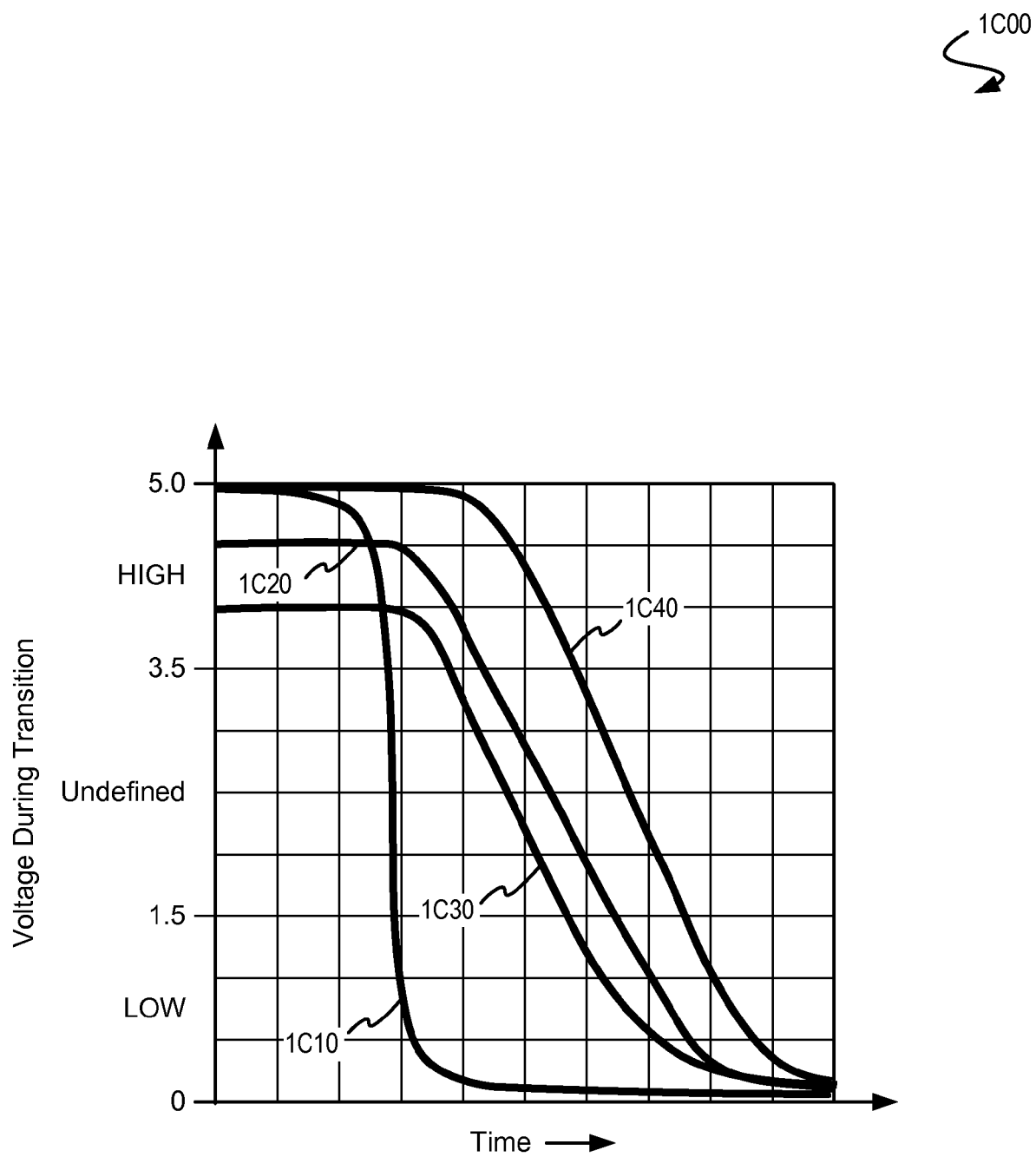
FIG. 1C is a graph showing an example of how signal transitions in a real system depend on environmental conditions.
Figure 1D:
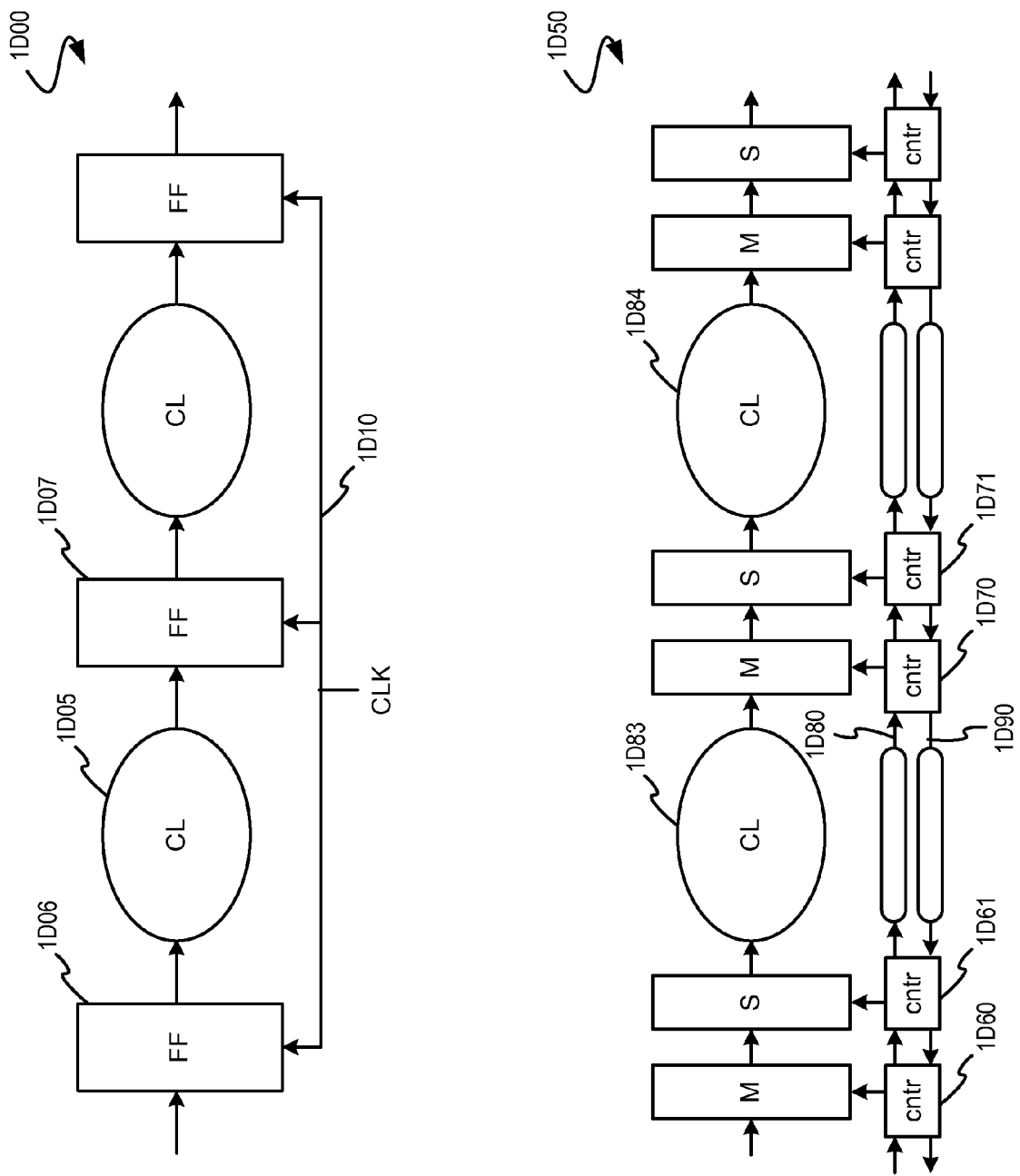
FIG. 1D depicts a schematic representation of a synchronous system as contrasted with a schematic representation of an asynchronous system.

The operation of asynchronous circuits and asynchronous techniques generally rely, at least in part, on in-situ feedback. That is, the response of an asynchronous circuit is, at least in part, a function of the actual characteristics of the system in which an asynchronous circuit operates. Systems employing such a closed-loop response are said to employ closed-loop feedback. Closed-loop feedback control is a classical engineering technique used to improve the performance of a design in the presence of manufacturing uncertainty, and this technique is used throughout many engineering disciplines. However, in traditional digital design, synchronization control is performed in an open-loop fashion, that is, without using closed-loop control to improve the performance of a design in the presence of manufacturing uncertainty. In traditional digital design, all synchronization mechanisms, including clock distribution, clock gating, and so on, are based on a feedforward network—from the oscillator to one or more phase-locked loops to a clock buffering tree and routing network. All delay uncertainties in both the clock tree and the combinational logic must be considered in the design. Traditionally, delay uncertainties are considered by means of assuming appropriate worst case margins, including delay variation introduced by manufacturing variations (e.g. semiconductor process variations, packaging variations) and environmental conditions (e.g. supply voltage, temperature).

This approach has worked for certain classes of design; however, current deep submicron manufacturing capabilities have outpaced the effectiveness of the aforementioned feedforward techniques. At deep submicron feature sizes, the tasks facing a designer include delay estimations at every design stage (e.g. floor planning, logic synthesis, placement, routing, mask preparation). Estimations of the effect that uncertainties inherent in design and fabrication steps will have on geometry, delays, performance, and power requirements of the circuit become less and less accurate as feature size becomes smaller and smaller. Especially in the case of delays and power requirements, traditional feedforward treatment of uncertainties tend to add up to huge margins that must be accounted for in order to ensure that a sufficiently large number of manufactured chips work within design and performance specifications. Statistical static timing analysis (SSTA) partially deals with the problem by identifying uncorrelated variations, which effects might be averaged out. However correlated variations often contribute to the aforementioned huge margins endemic to feedforward design techniques.

The disclosure herein addresses reducing the effect of variability in the manufacturing processes and variability in the environment in which the design is operating. It should be emphasized that sources of power and performance uncertainty such as supply voltage, operating temperature, and manufacturing process variations (e.g. reticle shape, optical imperfections, process and chemistry corner cases) cannot be taken into account purely by SSTA.

Further, traditional feedforward techniques intended to account for variability effects induced by process and operating conditions might include the use of circuit-level power minimization and equalization techniques, such as dynamic voltage scaling and adaptive body biasing. Application of such techniques may result in significant improvements in performance. Unfortunately, operating very close to the transistor threshold voltage increases the significance of nonlinearities and second-order effects, thus reducing the accuracy of delay predictions, especially considering a broad range of operating conditions.

Addressing yet another traditional feedforward technique, changing the clock frequency in order to match performance with scaled supply voltage introduces new uncertainties, since it multiplies the complexity of timing analysis by the number of voltage steps, and variability impact at low voltages (e.g. near the transistor threshold voltages) is quite significant. Performing frequency scaling in the presence of adaptive body biasing, and hence, variable threshold voltage, is even more complex and uncertain. Moreover, clocks generated by phase-locked loops cannot be used during frequency change transients.

The asynchronous design techniques described herein makes voltage-/frequency-based power optimization and control much more likely to be effective, since asynchronous designs are inherently more tolerant of delay variations.

Several kinds of applications, and in particular, those using complex processor architectures for part of the computation (e.g. general purpose computing and multimedia), and several others that are tolerant to environmental variations (e.g. wireless communications) do not have to obey strict timing constraints at all times. Due to the widespread use of caches, irregular processing speeds, and multitasking kernels, all these application areas inherently require algorithms that are tolerant to internal performance variations and offer only average case guarantees. For example, a digital camera takes about 1 second to process four or five million pixels. In many such cases, a design style in which the device provides average case guarantee, but may occasionally go slower (when used in high ambient temperature conditions) or faster (when used in low ambient temperature conditions) may be acceptable in actual use.

It is widely reported that, as technology progresses, the differences between the "official performance" and the "actual performance" of a chip is continuously broadening, and 100% margins (meaning that an integrated circuit can work twice as fast as it is officially rated) are not uncommon even today. This motivates us to disclose various asynchronous circuit schemes for measuring and controlling circuit delay at runtime, (e.g. after fabrication), rather than estimating it in the presence of an a priori understanding that the estimated margins may be on the order of 100% of actual.

The disclosure herein introduces various design and implementation schemes based on asynchronous circuits that may be applied in the context of traditional (i.e. synchronous design-centric) EDA tools and flows, yet including a panoply of asynchronous circuits and asynchronous circuit design and synthesis techniques.

Synthesis of Desynchronized Circuits

The discussion herein is expositive of the concept of desynchronization. In accordance with the definition herein, desynchronization seeks to incorporate asynchrony in a conventional EDA flow. Techniques described herein include the input of a synchronous circuit for transformation into a corresponding asynchronous circuit. In embodiments of such a transformation the global clock network of the synchronous circuit is replaced by a set of local control circuits, each implementing an asynchronous handshaking protocol. The asynchronous circuit is then realized for fabrication using standard tools, while maintaining fidelity to the flows originally developed for synchronous circuits.

The present invention includes techniques to implement a simple and efficient control scheme for automatic synthesis of desynchronized circuits based on a two-phase handshake protocol. The main features of the scheme are its simplicity, modularity and ease of use within a traditional design flow. The desynchronization approach assumes that a provided synchronous circuit is composed of (a) blocks of combinational logic and (b) registers implemented using edge-triggered flip-flops, all of them activated by a global clock signal. The desynchronization approach adapts the synchronous circuit for asynchronous control. In particular, the global clock signal is removed and the flip-flops are split into pairs of master/slave latches with independent enable signals, which independent enable signals are generated by a control layer.

Of course automated synthesis of synchronous circuits has been included in design practices of digital integrated circuit for decades. To the extent that embodiments of the invention disclosed herein may include implementation of CAD (Computer Aided Design) tools and methods for synthesis of asynchronous circuits, it is instructive to outline a commonly used automated flow, in particular, a common automated design flow for semi-custom design based on standard cells.

Figure 2:
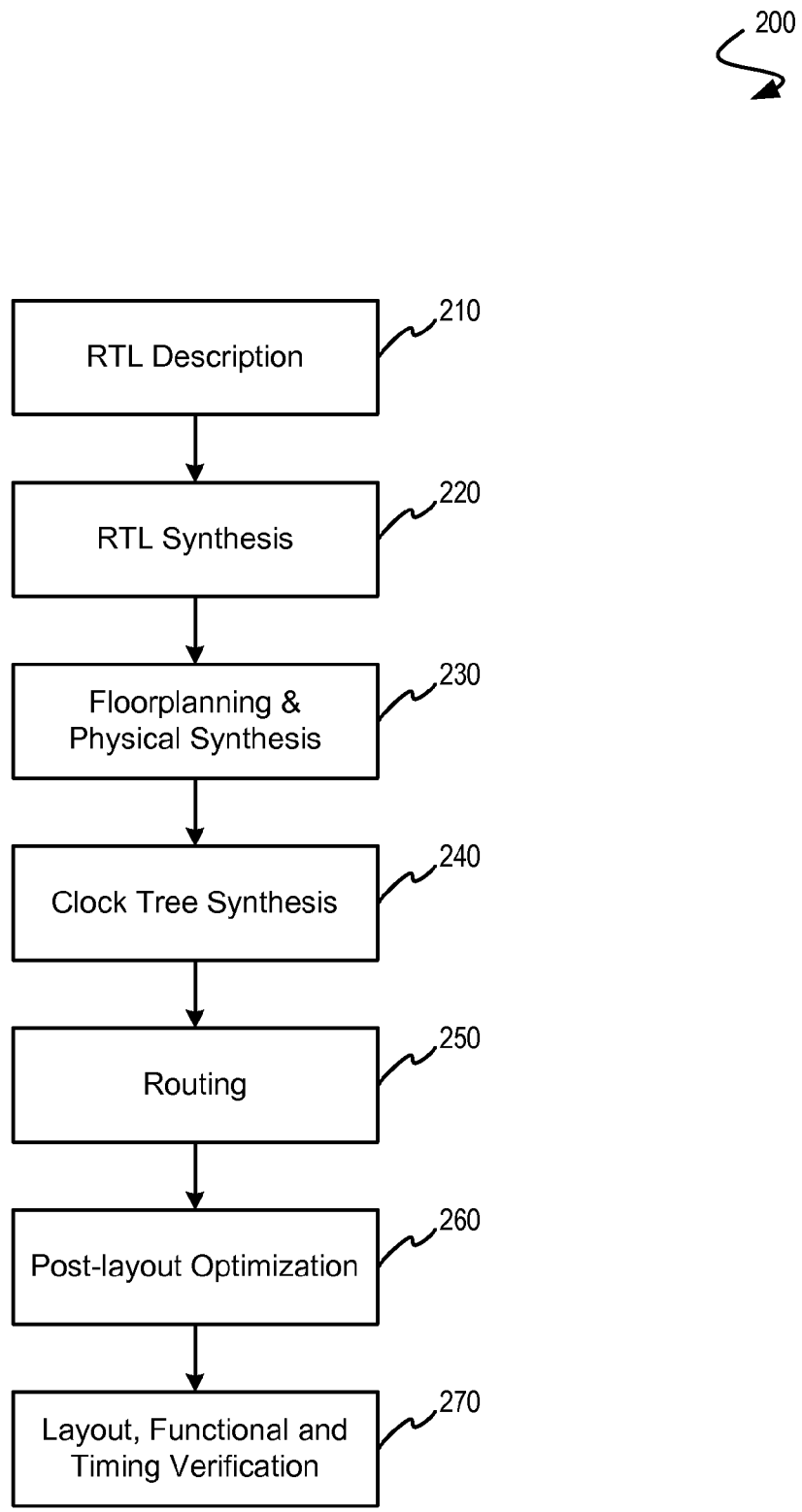
FIG. 2 is a flow diagram showing a possible design flow, according to one embodiment.

FIG. 2 includes such a design flow 200 and calls out the following operations: RTL description 210, RTL synthesis 220, physical synthesis (e.g. floorplanning, placement) 230, clock tree synthesis 240, routing 250, post-layout optimization 260, and various pre-tape-out checks 270.

During RTL description 210, one or more techniques are commonly used (e.g. schematic capture, modeling in a hardware description language, or a mixture of the both) are used to describe the design at an abstraction level known as Register-Transfer Level (RTL). While description of a synchronous design is not required at this step, or even at this level of abstraction, it is typical to capture a synchronous system using a global external clock inasmuch as the CAD tools employed in the steps of the design flow 200 make assumptions about the synchronous nature of the design, and further make assumptions about the use of a global clock.

During RTL synthesis, a Register-Transfer Level (RTL) specification is compiled (synthesized) into a standard-cell-based netlist (operation 220). The bodies (e.g. standard cells) of the netlist are placed (sometimes using interactive floorplanning) during physical synthesis (operation 230) and optimized to meet the timing constraints (setup and hold) taking into account the estimated wire delays. After placement, clock trees are synthesized (operation 240) to deliver synchronous clock signals with close-to-zero skew. During RTL and physical synthesis, the design is optimized to meet the required clock frequency, more specifically, each valid register-to-register combinational path in the circuit must have a delay shorter than the clock period. Routing is done to produce the complete layout of the circuit (see operation 250). After that, incremental post-layout optimizations (see operation 260) are performed to satisfy the timing constraints and improve the quality of the circuit. In this step, more accurate estimates of the parasitics and wire delays can be calculated based on the real geometries of the layout. Various pre-tape-out checks, including functional verification, timing rule checks, and layout checks are performed (see operation 270), including physical design rule checks to validate that each feature of the layout satisfies rules related to the manufacturing process, and hence is likely to operate properly across various pre-characterized operating conditions and limits.

Now, given that the desynchronization techniques discussed herein might be applied with efficacy within the context of the traditional design flow 200, it is instructive to map the application of desynchronization techniques to that design flow.

Figure 3:
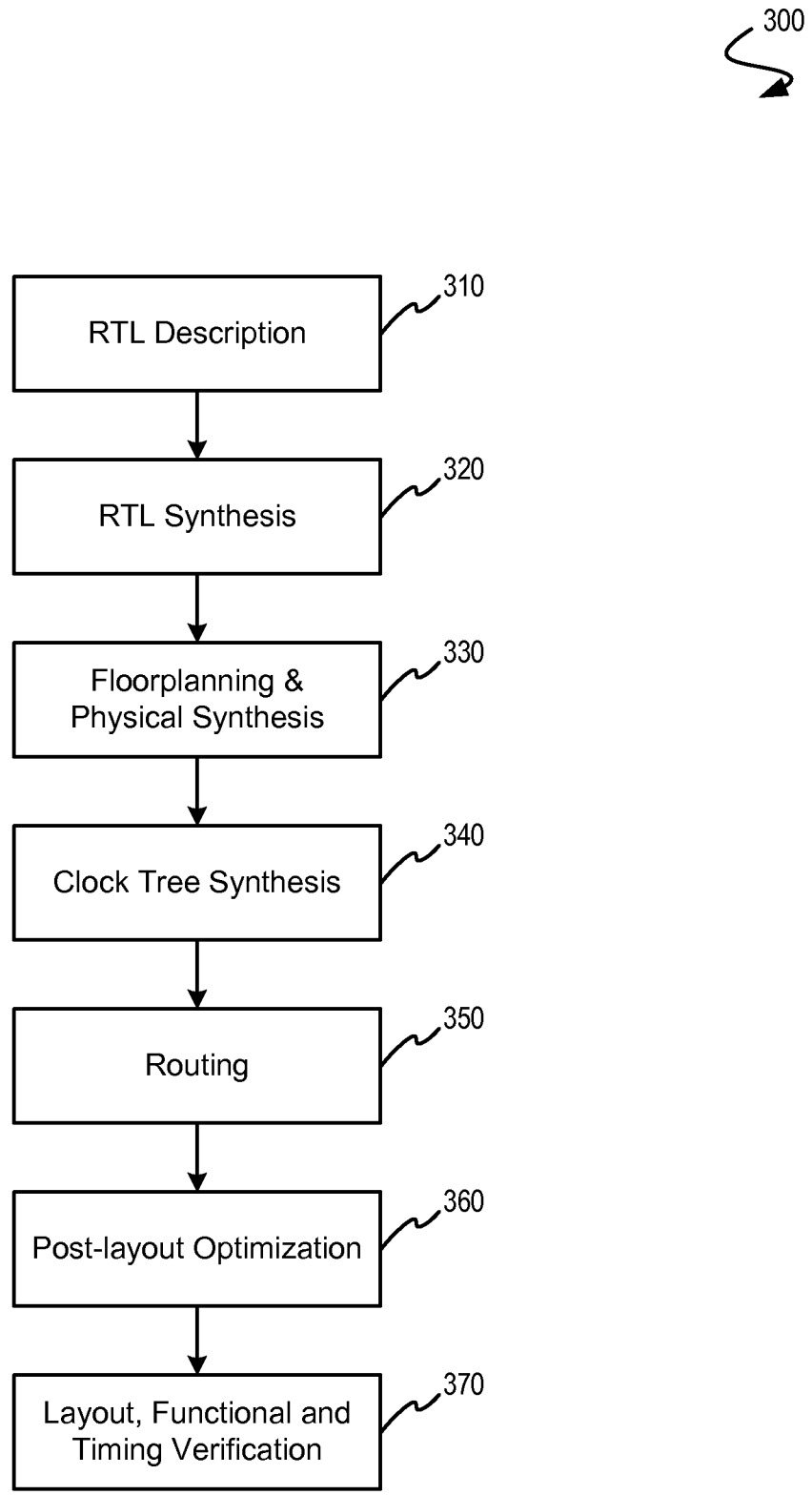
FIG. 3 is a flow diagram showing a possible design flow, according to one embodiment.

FIG. 3 depicts the application of desynchronization techniques within a desynchronization design flow 300. Note that many characteristics of the traditional design flow 200 are preserved in the desynchronization design flow 300. In particular, with few if any exceptions, an RTL description (operation 310) may proceed without required perturbations from the RTL capture operation 210. In fact, most desynchronization techniques may be performed once a gate-level netlist is available, that is after the completion of operation 320. During desynchronization, a set of desynchronization timing constraints are generated to guarantee the correct interaction of the control layer with the data path. The set of desynchronization timing constraints enforce a sequential behavior of the datapath equivalent to the one that would be produced in the original synchronous circuit. Some of these constraints also ensure that the conditions for the correct behavior of the sequential devices (e.g. setup, hold and pulse width) are not violated. During any one or more of the desynchronization circuit transformation operations, for example, during physical synthesis (operation 330), the desynchronization timing constraints are generated and used to drive the optimization tools towards synthesizing delay lines matching the corresponding data path delays.

Of course, a modern digital system may employ designs known as hard macros. Such hard macro designs are typically available only in physical representations (e.g. floorplanning perimeter, location of signals, etc), and those physical representations are typically introduced into the physical synthesis steps of the design flow 200 at operation 230. However within the context of a desynchronized design flow 300, the timing constraints of the hard macro are considered as a whole, and they may be included in the desynchronized circuit at an earlier step, for example at operation 320.

The set of desynchronized sequential device timing constraints are also used during the layout, functional and timing verification (see operation 370) to validate circuit behavior and construction. The constraining values can be different for different operating conditions, as a result of the varying environmental conditions at which the circuit can be operating.

EDA Approach

One possible mapping of desynchronization techniques into exemplary EDA flows is presented in the table below.

| Flow | Selected Desynchronization Topics |
| --- | --- |
| Feedforward synchronous design methodology | Desynchronization of synchronous circuits |
| Floorplanning, RTL Synthesis & Technology Mapping | Asynchronous controller design, including two-phase controller design Initial delay estimation and delay matching Clock gating Asynchronous controller design for resetting a de-synchronized circuit Voltage regulation circuits |
| Placement, Physical Synthesis & Clock Tree Synthesis | Delay matching Performance optimization |
| Routing | Bus-type routing for signal integrity and efficient communication to and from desynchronized circuits |

As is well understood by designers of modern digital circuits, decisions or assumptions made early in the design flow may have impact in later stages, in some cases such early decisions may be found to impose constraints that cannot be overcome in late stages of design; for example a particular floorplanning placement may require a media delay smaller than is possible using the given fabrication technology. In such cases a feedback loop in the design flow might have to be taken (e.g. clock tree synthesis may require a revision to floorplanning). The selected desynchronization topics as per the table above are disclosed henceforth in a top-down, breadth-first hierarchical fashion, successively disclosing further specifics in such detail is appropriate for the corresponding hierarchical depth.

Desynchronization Topic Overview

Referring to the topics identified in the table above, the sections to follow present a breadth-wise overview by brief discussion of each topic:

Overview of the Desynchronization Transformation and Synthesis of Desynchronized Circuits Two-Phase Controller Design and Delay Matching for Behaviorally Correct Circuit Operation Clock Gating for Activity Management of a Desynchronized Circuit Delay Matching for Performance of a Desynchronized Circuit Resetting a Desynchronized Circuit Automatic Voltage Regulation of a Desynchronized Circuit Efficient Communication To and From External Circuits Mathematical Modeling for Proof of Equivalence Overview of the Desynchronization Transformation and Synthesis of Desynchronized Circuits Presented herein are techniques for automatic synthesis and optimization of an asynchronous circuit description (model) given a synchronous circuit description.

As introduced above and indicated in operation 310, a digital design might be captured using some combination of netlists, schematic capture, hard macros, and hardware description language models expressed at the register transfer level (RTL). Description of synchronous designs in RTL is well understood, and the synthesis (e.g. transformation of RTL to structural logic cells) and technology mapping (mapping structural logic cells to corresponding cells designed for a particular fabrication process) of synchronous designs has been used in digital system design for decades. For example, synchronous designs captured in HDL (e.g. the Verilog HDL) might be synthesized by a logic synthesizer (e.g. Synopsys), and mapped to a technology library (e.g. a TSMC 0.8 micron technology library).

Most logic synthesis tools make assumptions about the synchronous nature of the design, and from those assumptions infer specific types of sequential elements (e.g. flip-flops, latches), and those assumptions result in a synchronous design. For reasons earlier introduced, an asynchronous design might be more appropriate for a given logic function. One technique to achieve an asynchronous design from an RTL description is to use a synthesis transformation specifically designed for synthesis of an asynchronous design. As discussed herein, an asynchronous design might be implemented using master/slave latches and a control layer instead of implementing using the traditional flip-flop and global clock techniques.

Figure 6:
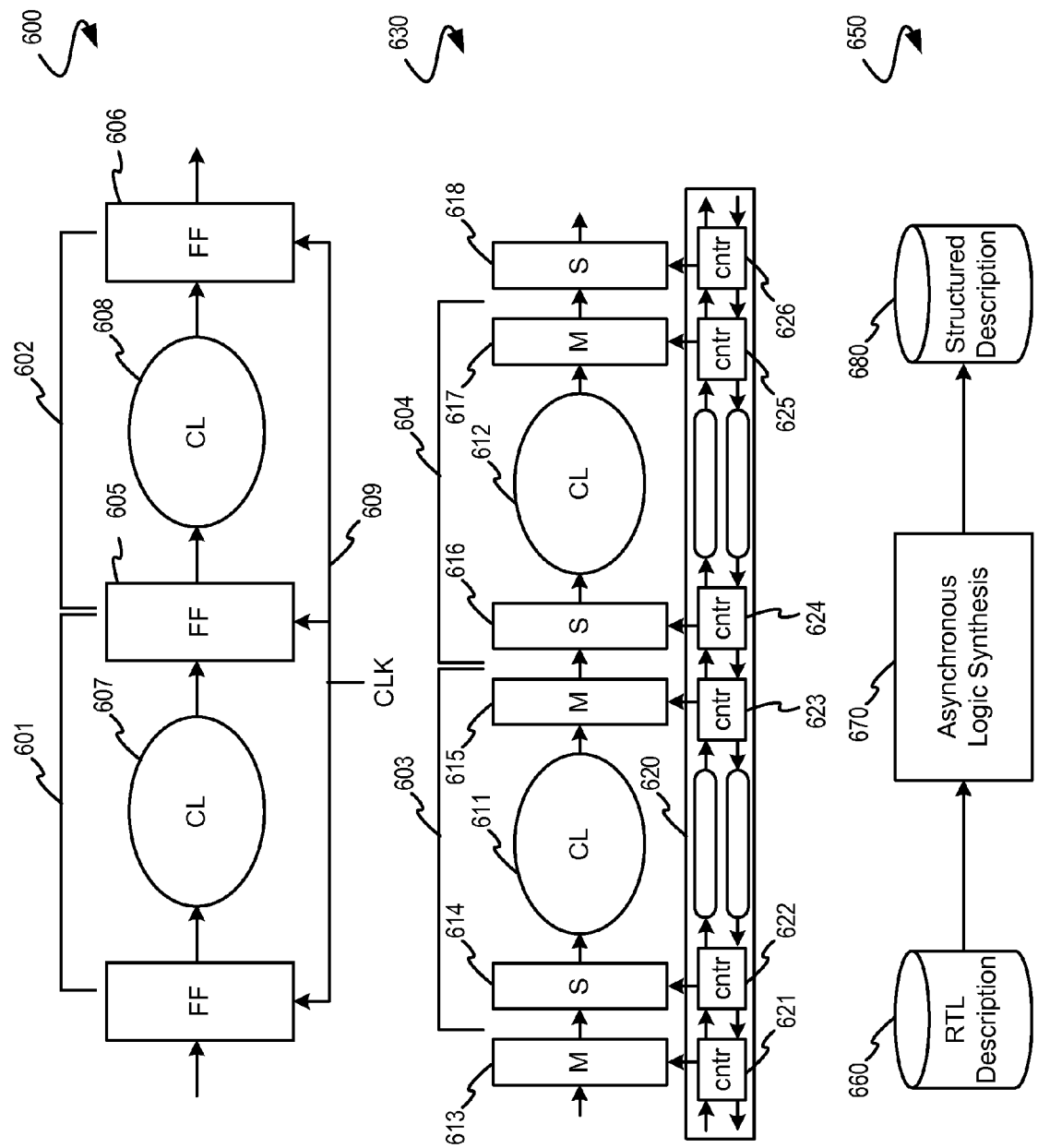
FIG. 6 depicts a synchronous circuit, a desynchronized equivalent asynchronous circuit, and a transformation that can be applied to a synchronous circuit to obtain a desynchronized equivalent asynchronous circuit, according to one embodiment.

FIG. 6 depicts an example of a synchronous design 600 characterized by occurrence of multiple stages 601, 602 demarked by sequential elements 605, 606 and having combinational logic 607, 608 associated with each stage, and a global clock 609. In contrast, and referring to the corresponding exemplary asynchronous design depicted at 630, although the asynchronous design shares elements of the synchronous design (e.g. stages 603, 604 corresponding to stages 601 and 602), and combinational logic elements (e.g. 611, 612 corresponding to 607 and 608) the sequential elements 613, 614, 615, 616, 617, and 618 differ. Also the desynchronized design at 630 includes a control layer 620 comprising controllers 621, 622, 623, 624, 625, and 626).

As shown at 650, to automatically synthesize a structural asynchronous design 680 from an RTL description 660 an automatic (e.g. computer-aided) design transformation operation 670 is performed. Various aspects of the transformation including circuit designs, delay and clocking techniques, initialization and performance optimization techniques, and various other techniques and algorithms are included in various embodiments of the transformation.

Two-Phase Controller Design: Description of the Control Layer

Figure 7:
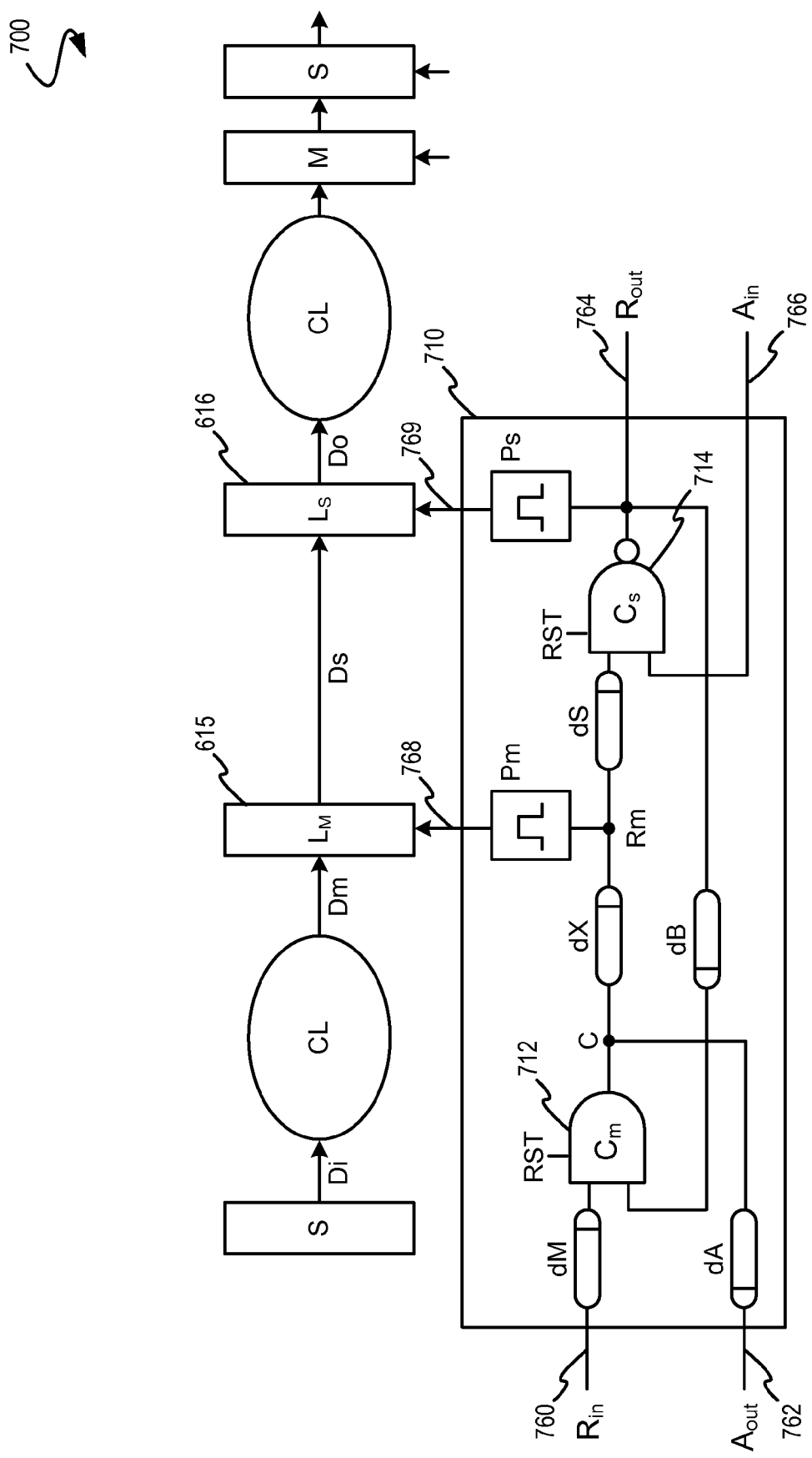
FIG. 7 depicts an abstraction of the control logic for a pair of master/slave latches after desynchronization, according to one embodiment.

Indeed, various embodiments of the present invention employ various schemes pertaining to the design of the control layer 620. One possible realization of the logic for such a scheme is depicted in FIG. 7. The logic within boundary 710 includes the control associated with a pair of master/slave latches 615, 616 which in turn correspond to a pair of master/slave latches 615, 616 as shown in FIG. 6. As shown, each controller 710 contains two resettable C-elements Cm 712 and Cs 714, five delays dM, dA, dX, dB, and dS and two pulse generators Pm and Ps. Also shown are signals Rin (request input) 760 and Aout (acknowledge output) 762, and signals Rout (request output) 764 and Ain (acknowledge input) 766. Each controller 710 might be connected to a preceding neighbor controller (not shown) via signals Rin (request input) 760 and Aout (acknowledge output) 762. Similarly, each controller 710, might be connected to another succeeding neighbor controller (not shown) via signals Rout (request output) 764 and Ain (acknowledge input) 766.

Figure 4:
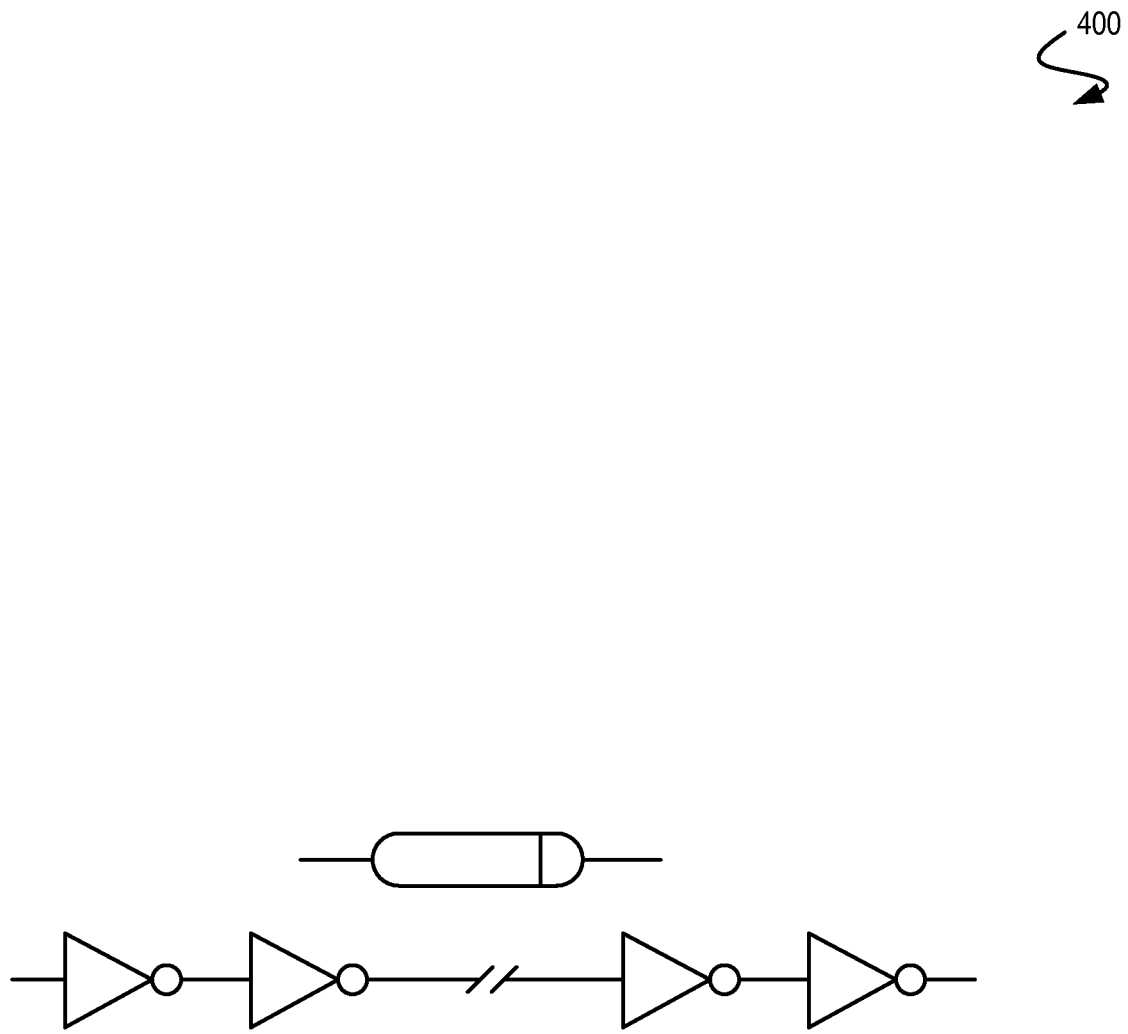
FIG. 4 depicts the symbol for, and a possible implementation of a delay.
Figure 5:
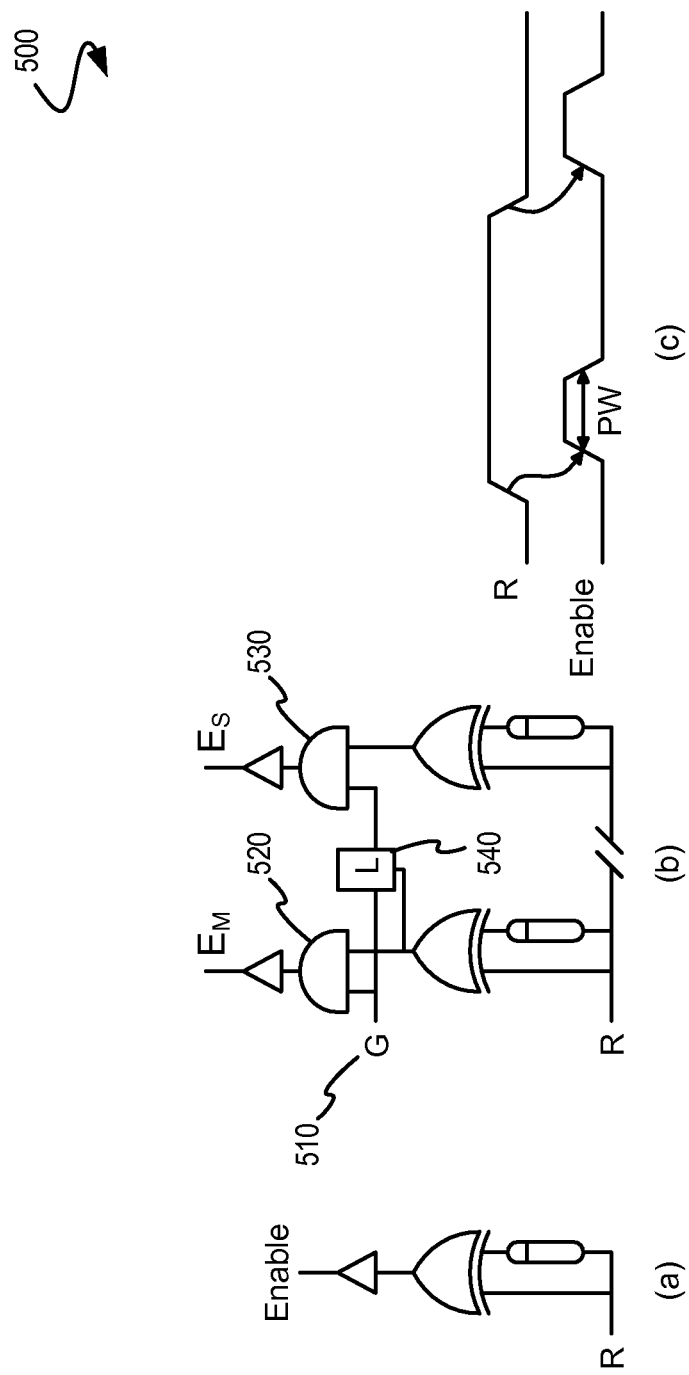
FIG. 5(a) depicts a circuit for a pulse generator, according to one embodiment.
FIG. 5(b) depicts the combination of two pulse generators and a clock gating circuit for a pair of master/slave latches, according to one embodiment.
FIG. 5(c) depicts a timing diagram showing the behavior of the pulse generator, according to one embodiment.

The pulse generators Pm and Ps of FIG. 7 can be implemented in real gates as shown in FIG. 4 and FIG. 5. More specifically, a delay (e.g. dM, dA, dX, dB, and dS) might be implemented by one or more buffers, or pairs of invertors, as shown in FIG. 4. Such an implementation of a delay might then be used to implement a simple pulse generator as shown in FIG. 5(a). Similarly pulse generators might be used in implementation of a gated clock generator as is shown in FIG. 5(b). Regardless of the implementation of a simple pulse generator as in FIG. 5(a) or a gated clock generator as shown in FIG. 5(b), operation results in a waveform substantially like the waveform shown in FIG. 5(c).

The devices and networks shown in FIGS. 5, 6, and 7 can be modeled formally (e.g. as a Marked Graph), and can thus be formally analyzed for Liveness, Safeness, Invariance, Equivalence, and other formal characteristics. Such formal modeling and analysis is presented in later paragraphs.

Clock Gating for Activity Management

Referring once again to FIG. 6, the synchronous design at 600 and a corresponding asynchronous realization at 630, in some situations entire phases (e.g. 601, 602, 603, 604) or even entire pipelines might be disabled, or held. Such disabling or holding a portion of digital design might be used for power management (e.g. turning 'off' a pipeline when not in use) or might be used for logic control (e.g. holding a pipeline during an interrupt or awaiting some external event), testing, or any other type of activity management. Regardless of the specific reason for disabling or holding, synchronous designs typically use clock gating to reduce the activity of the circuit (e.g. though a disable, or hold operation) when specific components do not need to perform any computation during certain periods of time. The usual way of implementing clock gating is by masking the clock with an AND gate. Typically the AND gate inputs include the clock, and a mask signal that determines when the clock is to be masked from the corresponding synchronous design flip-flops. For desynchronized designs, a mechanism with similar goals is presented in FIG. 5(b). The exemplary scheme of FIG. 5(b) includes a mask signal G 510 as an input into the AND gates 520 and 530, that then result in a gated clock signal that implements clock gating for each latch (e.g. master 615 and slave 616). As shown at 540, the mask signal for the slave latch is stored in an intermediate latch after it has been used by the master latch. In this way, the activity associated to the master latch can be resumed as soon as the data has been captured by the slave latch. Stated somewhat differently, the hold operation implemented as shown for master 615 and slave 616 actually hold the state of the pipeline phase. In other embodiments, including testing modes, both of the latches 615 and 616 might be set to become concurrently transparent.

An Approach for the Synthesis of Matched Delays

Figure 8A:
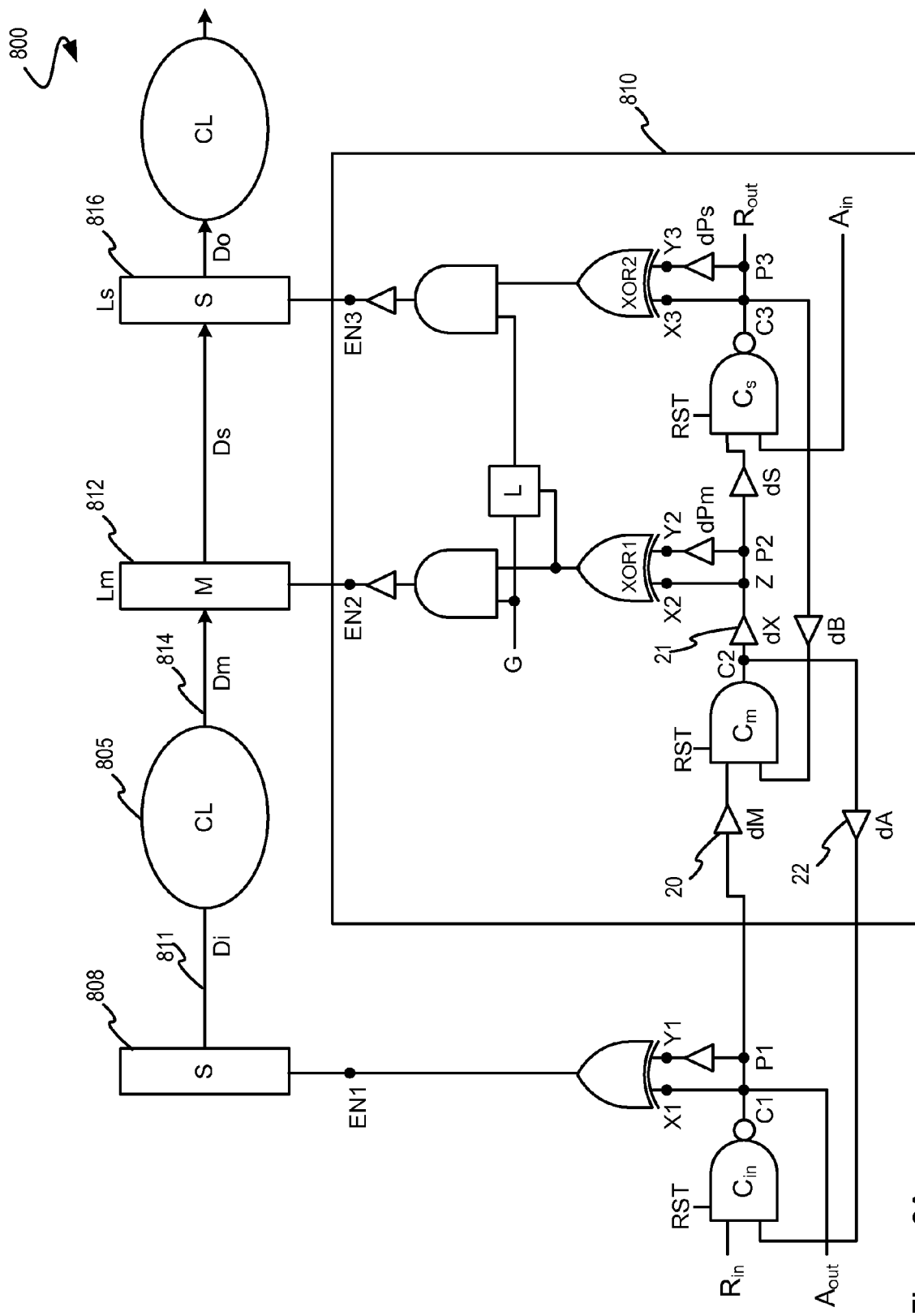
FIG. 8A depicts a possible implementation of the control logic for a block that has one input and one output channel, according to one embodiment.

FIG. 8A depicts the network of FIG. 7 including that the pulse generators Pm and Ps of the controllers are shown according to one possible realization using exclusive OR (XOR) gates. Additionally, FIG. 8A shows various delays of interest, abstracted as buffer gates dA, dM, dX, dB, dPm, dPs and dS. The aforementioned synthesis tools are capable of generating delays within a certain interval [dmin, dmax] using various techniques including gate sizing and buffer insertion. Specifications of delays in the form of min and max delays and/or relative timing constraints can be used as constraints to synthesis tools. Additional embodiments at various levels of abstraction are depicted in FIGS. 8B-8E.

As regards timing constraints for sequential circuits, these timing constraints are frequently described as "setup" and "hold" constraints. Setup and hold slacks are depicted in FIGS. 9-12. As a convention for notation, the minimum and maximum delays between a pair of pins, A and B, will be denoted by $\Delta min(A, B)$ and $\Delta max(A, B)$, respectively.

As earlier indicated, de-synchronized circuits of the varieties disclosed herein are variability aware. That is, dynamically, under actual operating conditions, the variability aware circuits compensate and optimize. To achieve this behavior, an initial 'good' estimation of typical delays is designed-in to the variability-aware circuits. Such a good estimate can result from analysis using various techniques involving static timing analysis and various correlated delays (that is, delays that would tend to affect all sub-circuits within a circuit) can be predicted based on formulas, data and characterization of the semiconductor process, the semiconductor devices, and the media used in the physical design of the semiconductor. Modern static timing analysis tools used in EDA design and verification flows often include timing analysis for setup/hold/recovery/removal in sequential elements, maximum/minimum pulse width checks, fanout/capacitance checks, analysis including transparent latches, derived clocks, latency, skew, parasitics, media delays and uncertainties over ranges of voltages and temperatures, and over process variations. Some, all or none of such timing analysis tools might be used in one or more operations in the practical application of the techniques disclosed herein. Moreover, the timing delays and constraints and the RTL and circuit models might be represented in any format, including some all or none of the industry-standard delay description formats (e.g. SDF, SPEF, DSPF, RSPF, SBPF, others) and constraint formats (e.g. SDC, UPF, others) and some all or none of the industry-standard modeling languages (e.g. Verilog, VHDL, DDC, EDIF, TDL) and/or formats (e.g. SPICE, CCS, NDLM, others).

As may be immediately recognized by those skilled in the art, the pulses presented at signals EN1, EN2, and EN3 of FIG. 8A must be aligned with the arrival of the data signals Di, Dm, and Ds in such a way that data flows correctly through the datapath; the aforementioned static timing analysis tools and methods aid in the alignment operations. The discussion of techniques for aligning clocking pulses with data availability and for calculating matched delays based on the models shown in FIGS. 8 through 12 are presented in a later section.

Also presented in a later section is a scheme for designing controllers with multiple input and output channels. Broadly speaking, a controller may receive data from several input blocks and deliver data to several output blocks. In this case, the C-elements of the controllers must be able to synchronize all of them. Elements and characteristics of such a multichannel controller are annotated on the circuit depicted in FIG. 13.

Optimizing Performance of a Desynchronized Circuit

Once again referring to FIG. 6, an important aspect of the presented control scheme is that the maximum performance of a particular pipeline phase can be achieved by tuning the handshake timing of the corresponding pair of controllers (e.g. 622, 623) to match the worst-case correlated delay of the corresponding combinational logic block (e.g. 611) between the latches 614 and 615. As may be readily intuited, a series of phases in a pipeline, each phase independently optimized is more likely to produce a better overall performing pipeline as compared to optimizing for performance given only a single global clock. In the former case, the existence and design of the controllers (e.g. 622, 623) at each phase (e.g. 603, 604) provides the mechanism for phase-by-phase optimization.

In other words, optimization of a particular phase (independent of other phases) is possible within the context of the asynchronous designs discussed herein because the occurrence of enable signals of the latches only depends on the handshake timing of the request and acknowledge signals from the neighboring controllers. In contrast, optimization of phase within the context of a synchronous design depends on the occurrence of an event on a global clock that controls all phases. Exploitation of this characteristic of the asynchronous circuits discussed herein allows obtaining maximum performance in a modular way. That is, the tuning optimization of one phase in the circuit does not affect the tuning optimization the other phases.

Figure 8B:
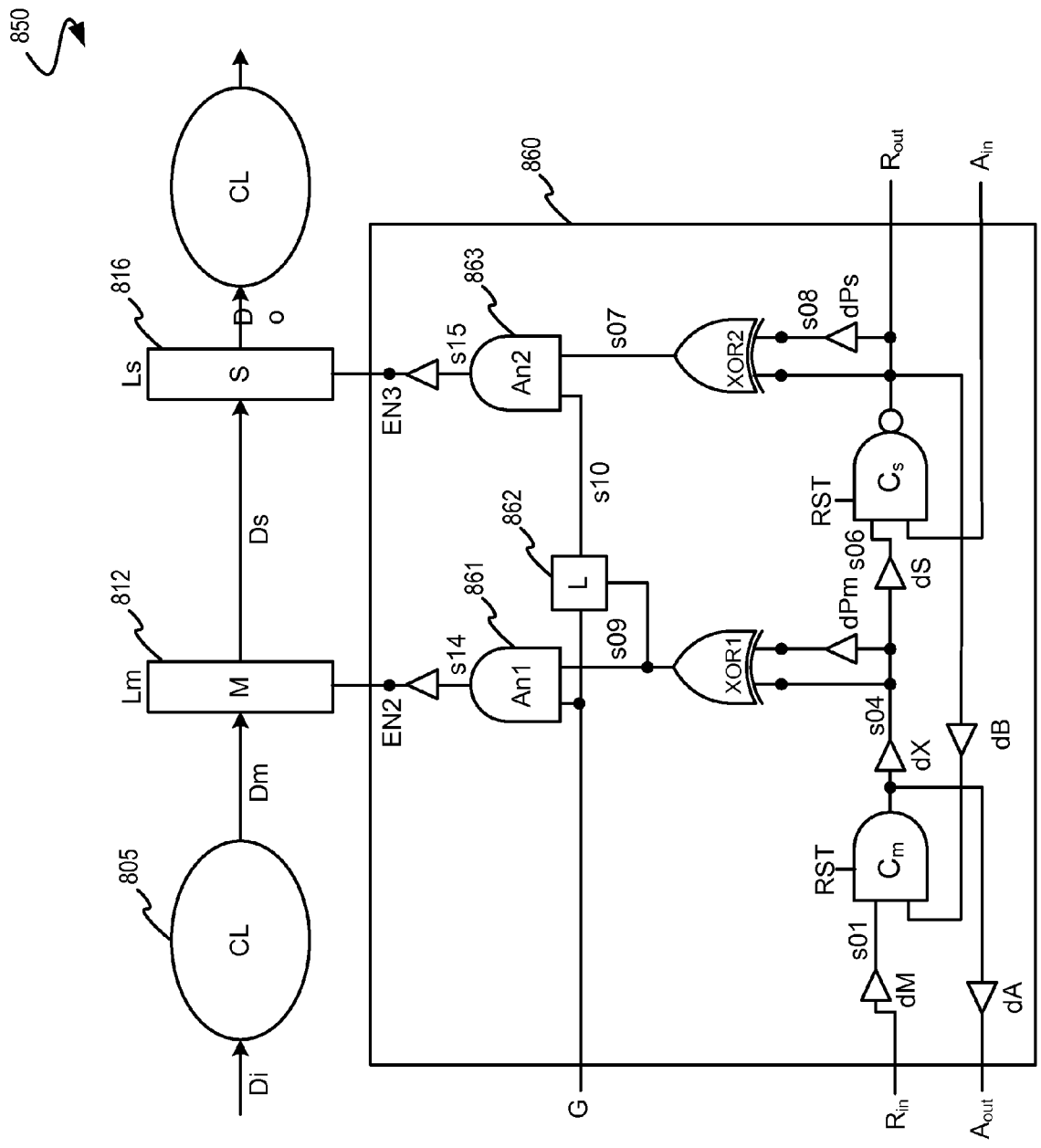
FIG. 8B depicts a possible implementation of the control logic, according to one embodiment.

FIG. 8B and corresponding text covers a representative example which example is discussed in detail in later paragraphs.

Resetting a Desynchronized Circuit

Traditional digital design flows include various techniques for handling the initial state of sequential devices. Typically designers follow a policy such that certain sequential elements in a given circuit must be initialized in a way such that the normal mode of operation starts in a known state. Typical in synchronous circuits, a reset/clear signal initializes some of the memory elements (registers). However, inasmuch as a sequential element with a reset/clear input will require more silicon area than a corresponding sequential without a reset/clear input, designers often adhere to policies such that not all registers need be initialized to a known value, and thus not all registers require a reset/clear input, and thus not all registers are directly initialized by the reset signal. This is reasonable in many situations, especially when the circuit operation involves an initialization phase (e.g. sequence of events) since some of the internal sequential elements may be reset/set by the propagation of known values from other sequential elements or from the environment after a certain number of cycles of the initialization phase. Of course, the initialization mechanism for a desynchronized circuit must properly initialize and synchronize the state information in the data and control layers. A possible resetting scheme is presented in FIG. 14.

Interaction with a Synchronous Environment

The descriptions of the desynchronized circuits of FIG. 6 have exemplified desynchronized circuits in the context of the inner phases of pipelines. Of course it is reasonable that a desynchronized circuit might interact with the environment (e.g. at the front-end or back-end of a pipeline) through external channels. In some cases, external circuits may operate at natural frequencies different from the natural frequencies of the front-end or back-end of a pipeline. In such cases, communication can be accommodated by defining a scheme for exchanging the data and handshake signals (req and ack). To accommodate the protocol of the desynchronized circuit with the protocol of the environment, different scenarios can be considered including one in which the external channels also follow the aforementioned two-phase protocol or the four-phase protocol. This interaction is illustrated in the timing diagram of FIG. 17A. Alternate protocols, embodiments and implementations are presented in FIGS. 15 and 16.

Automatic Voltage and Speed Regulation

Since asynchronous circuits are tolerant to the variability of delays, they can incorporate self-control mechanisms that adapt the speed and power supply of the circuit to the dynamic requirements of the environment.

Figure 18:
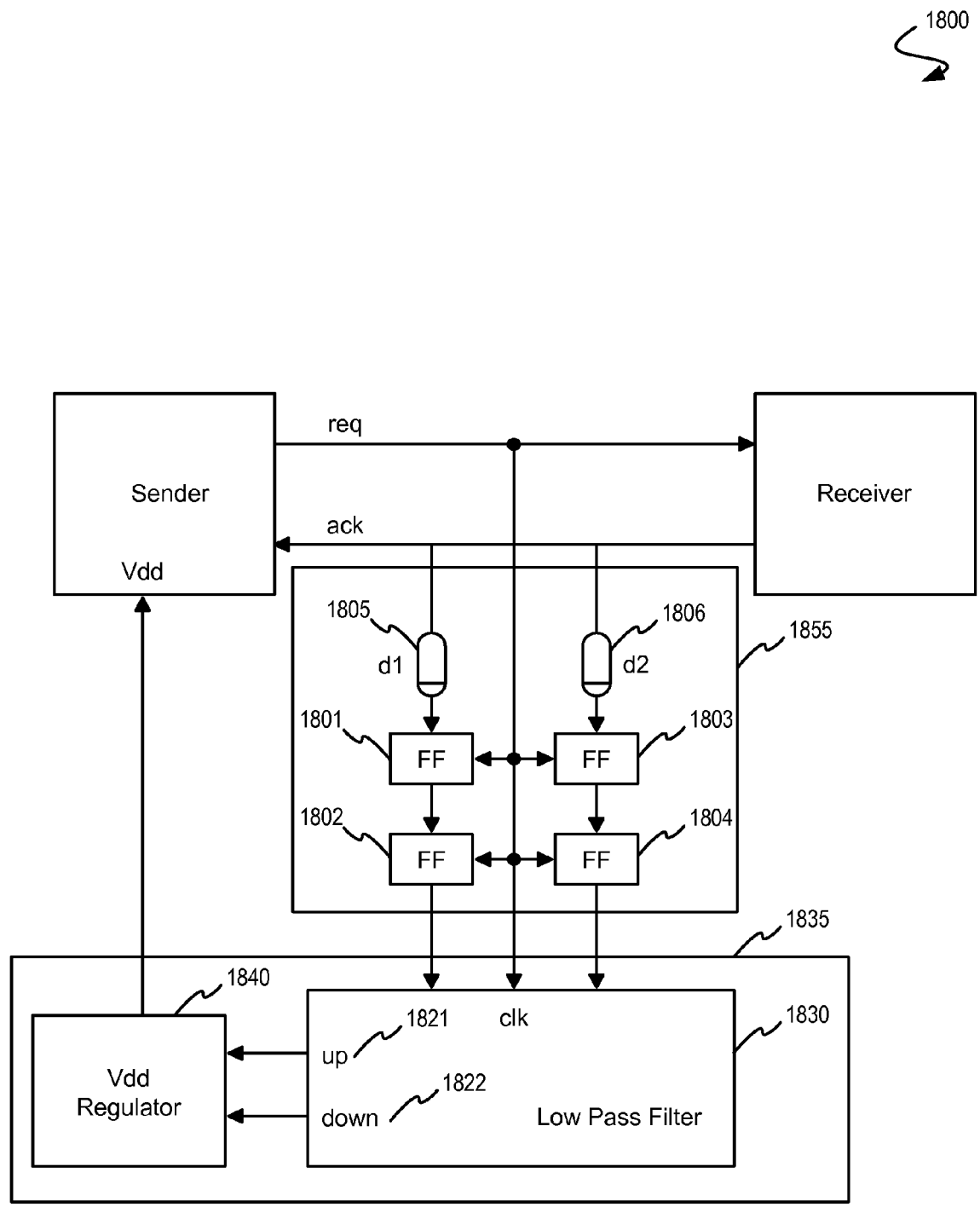
FIG. 18 shows a scheme for automatic voltage regulation, according to one embodiment.
Figure 19:
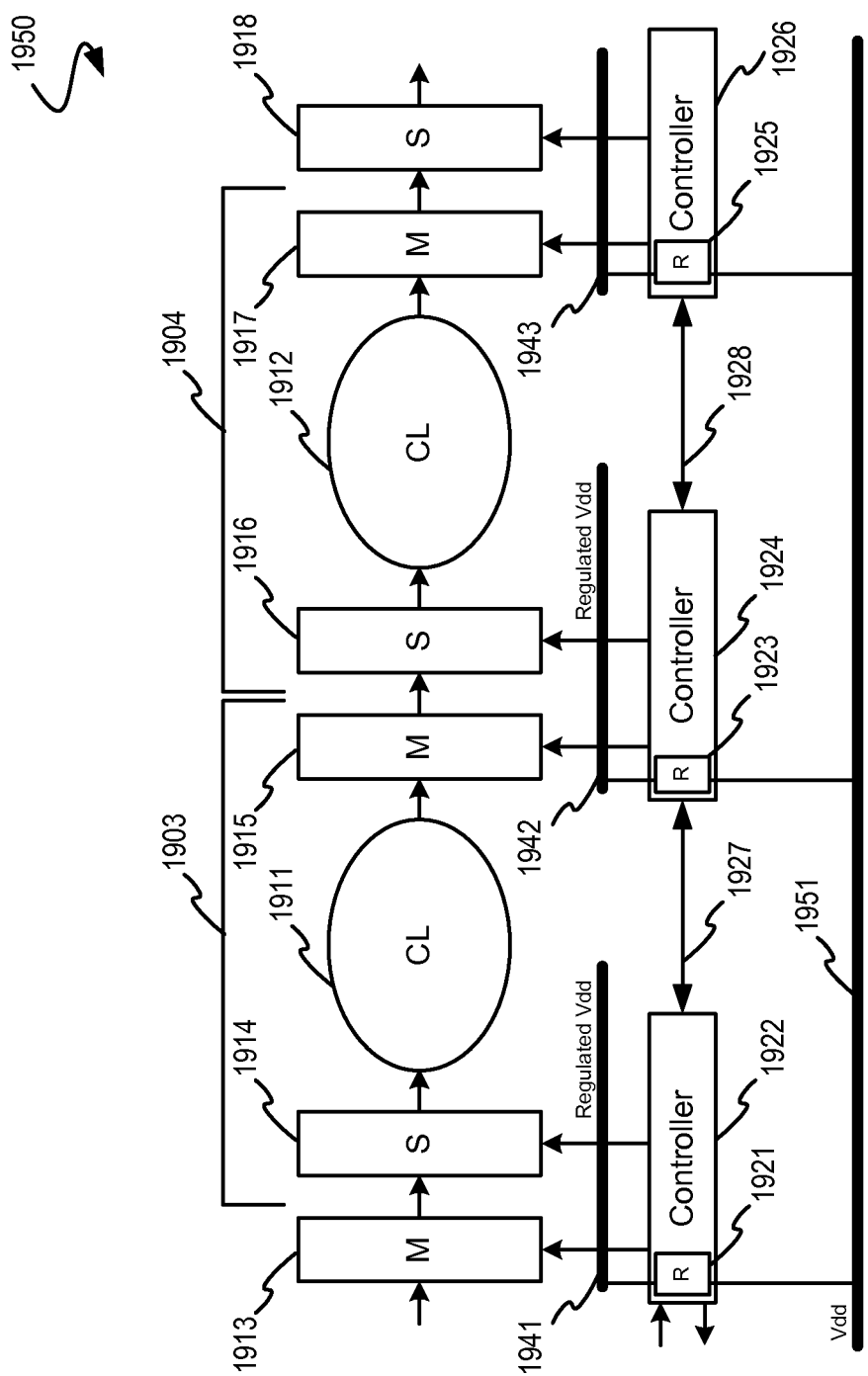
FIG. 19 depicts a diagram of a scheme for voltage regulation, according to one embodiment.

FIG. 18 depicts an exemplary embodiment of a circuit for automatic, dynamic voltage regulation. As shown, a Vdd regulator responds to a counter which in turn responds to actual conditions measured between two temporally related signals. FIG. 19 depicts additional embodiments of circuits for automatic, dynamic voltage regulation and environments suited for automatic, dynamic voltage regulation.

Theoretical Treatment of Desynchronization: Mathematical Modeling for Proof of Equivalence Presented herein are techniques for transforming a synchronous RTL circuit description into an equivalent asynchronous circuit. The term equivalent in this context refers primarily to equivalence of the circuit as measured by logic values stored in sequential elements at selected clock edges.

To show that the suggested techniques are sound, formal descriptions based on the theory of Petri nets are presented, and formal proofs are referenced, thus substantiating the equivalence of the resulting (synthesized) desynchronized circuit to the input synchronous circuit.

As is shown herein, equivalence between a synchronous circuit and its corresponding synthesized asynchronous circuit is rendered easier (or more challenging) depending on the precise definition of equivalence. The formal descriptions herein and certain formal definitions of equivalence provide a theoretical foundation for a desynchronization approach by proving a behavioral and temporal equivalence between a given synchronous circuit and its desynchronized counterpart. Formal descriptions and analysis presented herein and elsewhere includes use of a concurrent synchronization mechanism, and shows how handshake controllers can be derived from this concurrent model by concurrency reduction.

As pertains to the disclosure herein, the definition of equivalence does not require in-order reception of events on different physical signals. Additionally for our purposes, the definition of equivalence does not require that every module can detect or operate differently based on which inputs are irrelevant (i.e. "don't care") in a given operation cycle.

Stated differently, the definition of equivalence used herein assumes that all inputs to a combinational block are required to compute its output. This is a conservative approach, yet a popular approach found in synchronous design and in traditional EDA tools and flows. Of course equivalence insofar as behavioral equivalence can be shown in a variety of ways, in particular by showing that values captured at clocking events are the same for both the input synchronous circuit as well as for the desynchronized circuit. The top portion of FIG. 1I depicts a trace of a synchronous circuit in which values for 'A' and 'B' are captured on alternating clock events of the clock 'CLK'. As shown the clocked valued for 'A' are 1, 3, 0, 2, 1, etc., and the clocked valued for 'B' are 5, 1, 2, 3, 1, 4, etc. Referring now to the lower portion of FIG. 1I, the trace of the desynchronized behavior shows the same number of clocking events on signal 'A', and signal 'B', albeit the temporal occurrence of the events elastic—with the Nth event occurring sometimes earlier and sometimes later than the corresponding Nth clock event in the synchronous counterpart. By mere observation of the traces of FIG. 1I, it becomes clear that the value captured at the Nth event for 'A' and 'B' in the desynchronized trace is identical to the values captured at the Nth event for 'A' and 'B' in the desynchronized trace.

A marked graph (MG) is one of several formalisms used to model states and events. Marked Graphs are a subclass of Petri nets that can model decision-free concurrent systems. Within the context of desynchronization Marked Graphs can be constructed and analyzed to provide equivalence, at least to the extent of the relaxations of the definition of equivalence presented above.

Figure 1E:
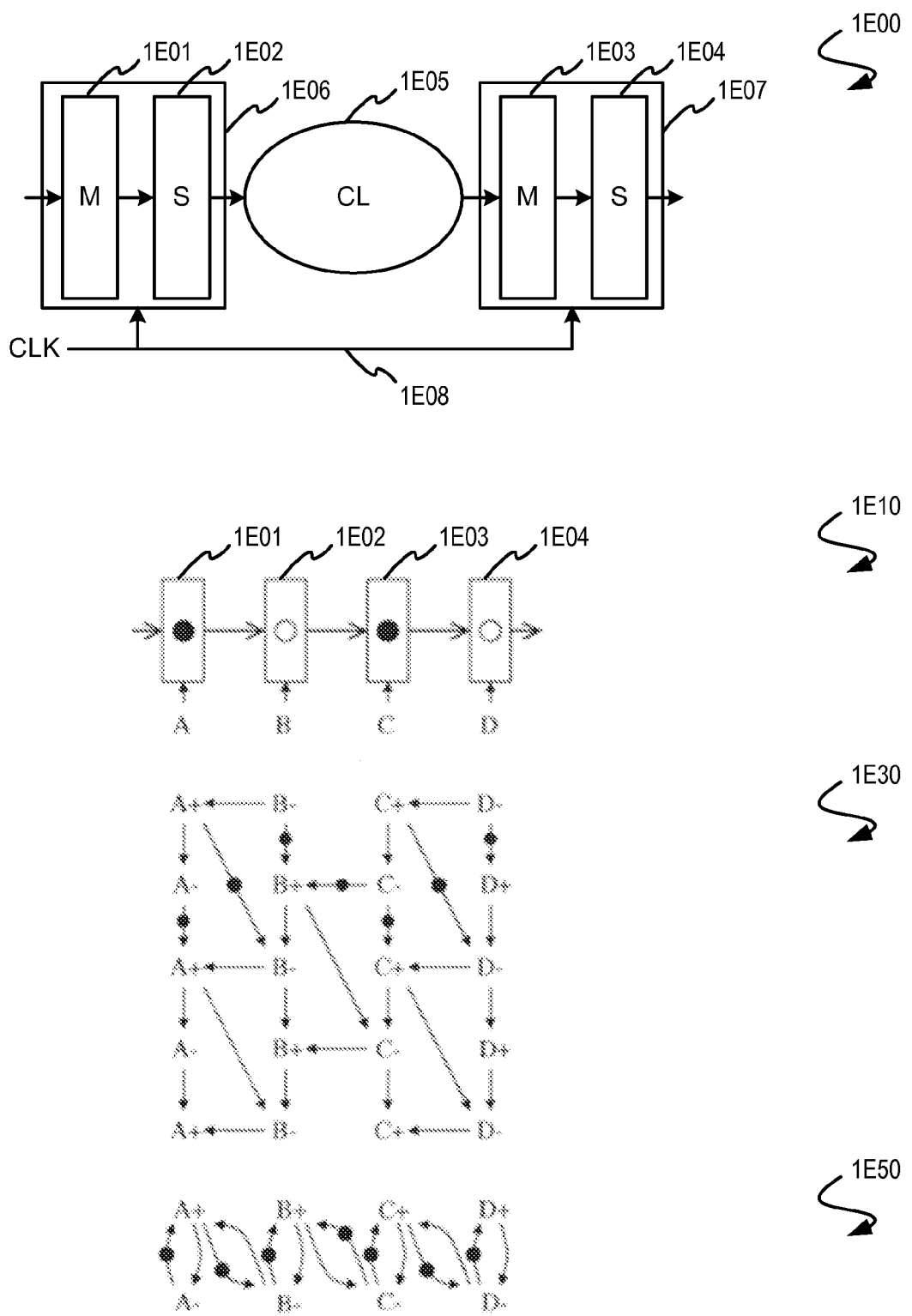
FIG. 1E depicts a system with states and events, and representations of that system using a Marked Graph.
Figure 1F:
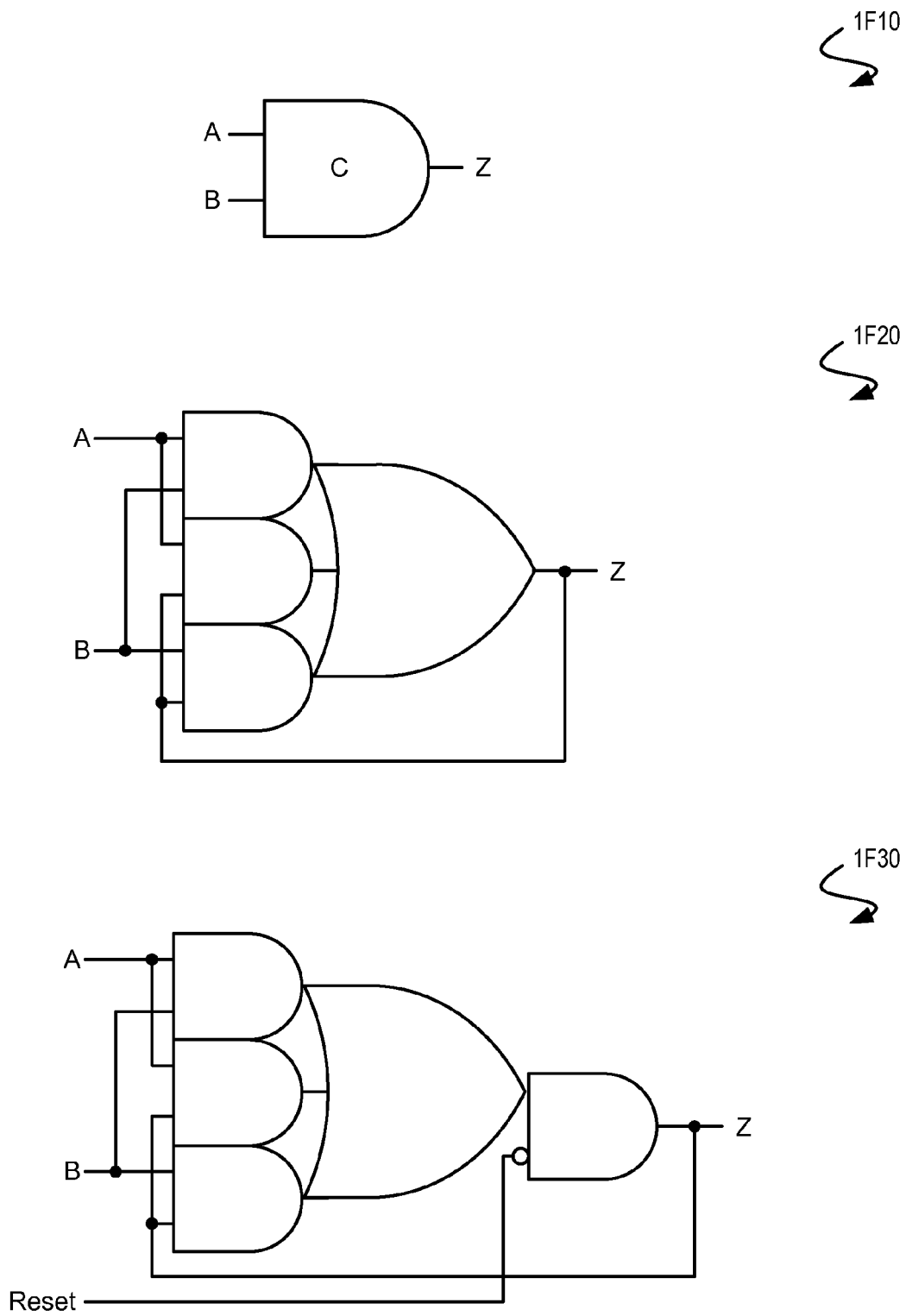
FIG. 1F depicts a symbol for a C-element, including possible implementations using combinational logic gates and a reset signal.
Figure 1G:
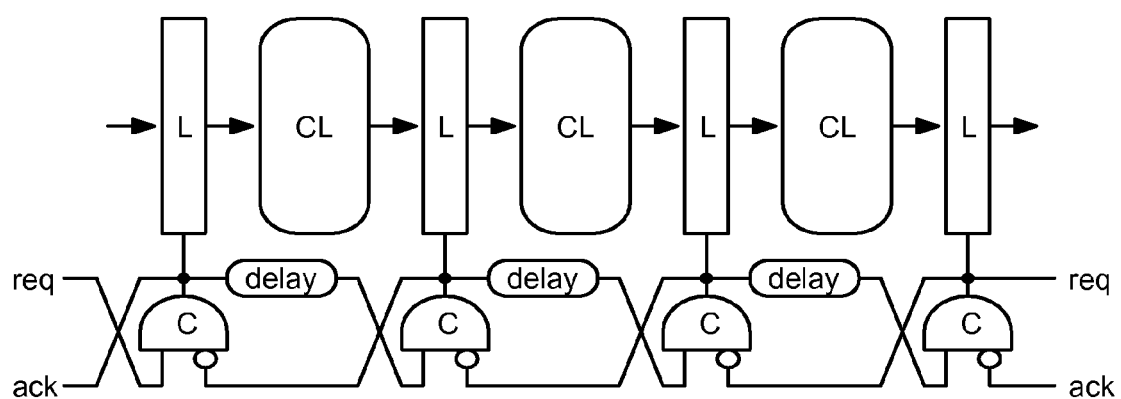
FIG. 1G depicts a Muller pipeline.
Figure 1H:
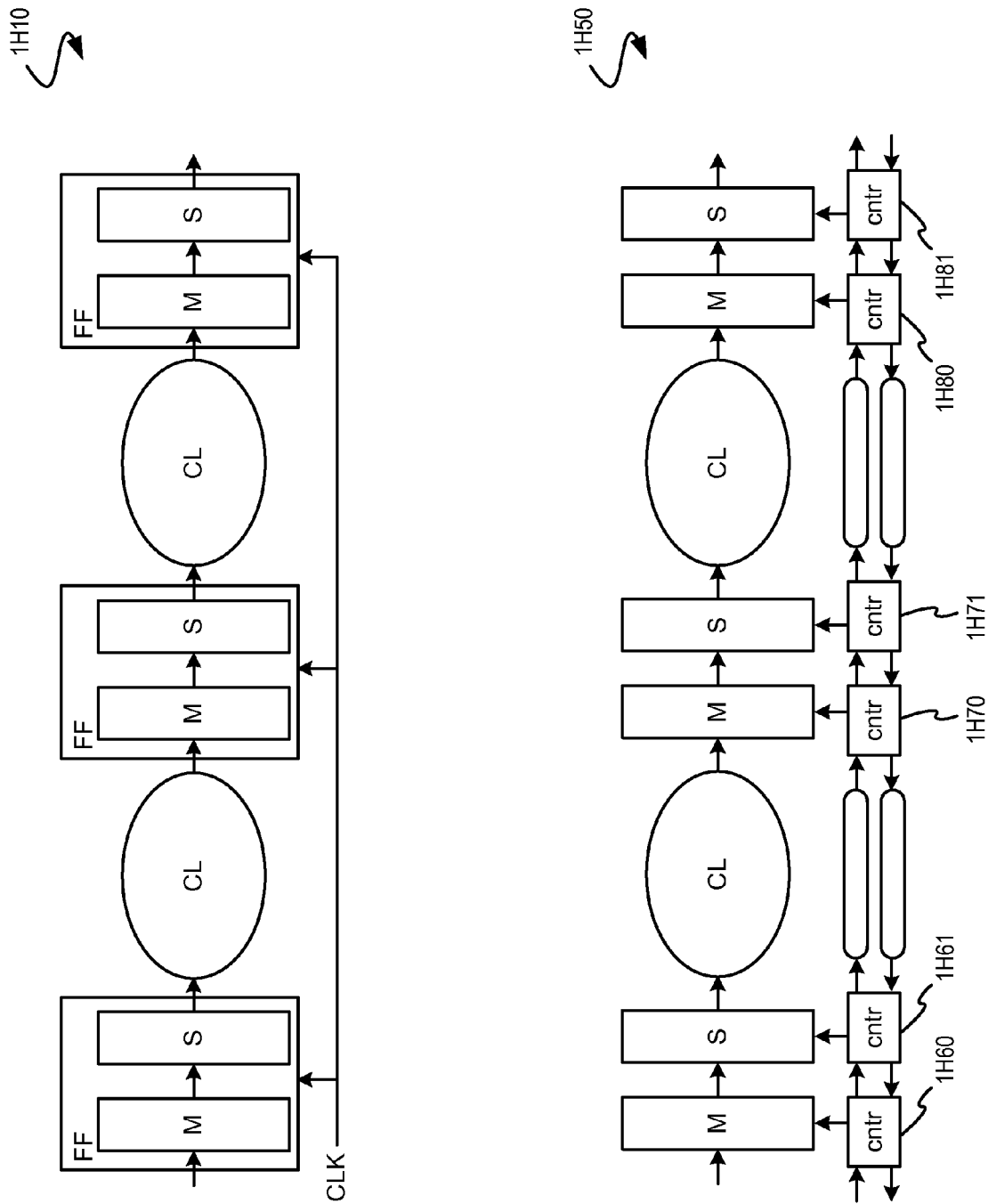
FIG. 1H depicts a schematic representation of a synchronous system using master/slave flip-flops as contrasted with a schematic representation of an asynchronous system using local controllers.
Figure 1I:
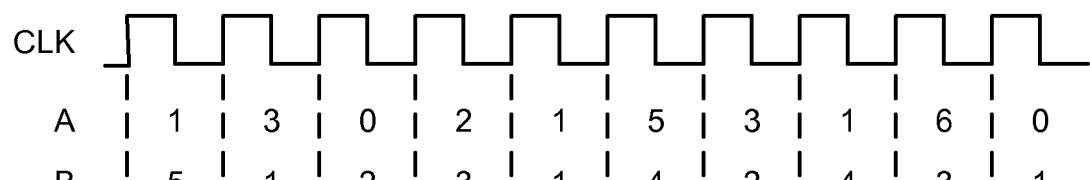
FIG. 1I depicts a behavioral equivalence diagram.
Figure 1I:
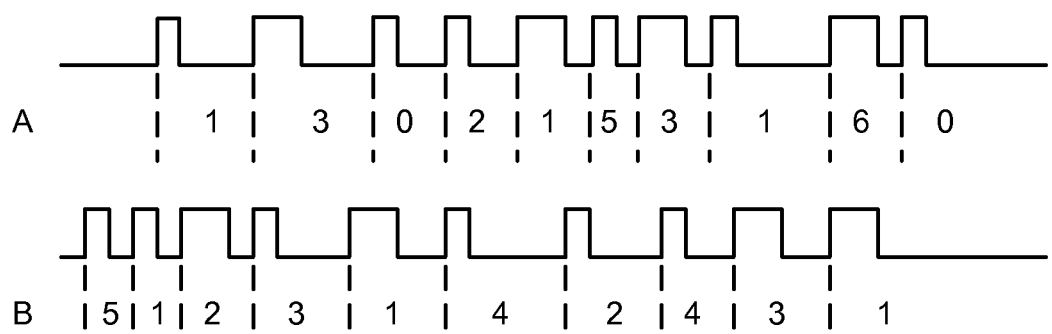

Turning to FIG. 1E, marked graph can be constructed to represent events (sometimes represented as a rectangle or other bounded shape) connected by arcs or edges (sometimes represented as lines or arrows), and with some initial marking of enabled events (sometimes represented as a solid dot). A simple MG of the synchronous pipeline of 1E00 is shown at 1E10. In particular the MG shows events 1E01, 1E02, 1E03, and 1E04, with an initial marking of enabled events 1E01 and 1E03.

In some cases, an MG might be represented in an unfolded representation, and the notation of an event might include two transitions for each event. In other words, if one were to consider an event as a pulse of non-zero duration, an event might be described as having a rising transition, and a falling transition. Such an unfolded representation is shown at 1E30. Continuing with simpler representations of the same marked graph (though no less formal), a folded version of the MG at 1E30 is shown at 1E50. Specifically referring to the example MG notation shown at 1E50, the events A+ and A− represent the rising and falling transitions of signal A, respectively, and B+ and B− represent the rising and falling transitions of signal B, etc.

Regardless of the style of representation, an event is considered to be enabled (ready to fire) when all its direct predecessor arcs have a token. When an enabled event fires, it can be depicted on a marked graph by removing one token from each predecessor arc and adding one token to each successor arc. As regards terminology used in this section, a sequence of events S is feasible for a marked graph M if the sequence S can be fired from an initial marking, denoted by M0. A marking M1 is reachable from M if there exists a sequence of events such that M can become the marked graph the marking M1. The set of reachable markings from M0 is denoted by [M0]. An MG is live if and only if M0 assigns at least one token on each directed circuit. An MG is invariant if and only if the token count in a directed circuit is invariant under any firing, i.e. M(C)=M0(C) for each directed circuit C and for any M in [M0], where M(C) denotes the total number of tokens on C. An MG is safe if and only if every arc belongs to a directed circuit C with M0(C)=1. With the foregoing modeling formalism and definitions, equivalence (as previously defined herein) can be proven. Accordingly, various embodiments and corresponding implementations of synthesized desynchronized circuits can be properly characterized as provably equivalent to their corresponding given synchronous circuits.

The above definitions and formal proofs that apply to the class of MGs used in the techniques presented herein ratify the desynchronization approach used herein by proving a behavioral and temporal equivalence between a given synchronous circuit and its desynchronized counterpart.

Implementation of Real Circuits based on the Desynchronization Model

Implementation of real circuits based on the desynchronization model presented in this section includes the substitution of the global clock by a set of asynchronous controllers that guarantee specific behaviorally and temporally equivalent behavior. Returning to the pipeline depicted at 1D00, the provably correct desynchronization transformation assumes that the given synchronous circuit has one or more combinational blocks 1D05 and two or more registers implemented with D flip-flops 1D06, 1D07, all of them working with the same clock 1D10.

In various embodiments, desynchronization transformation includes the following operations.

Convert the flip-flop-based synchronous circuit into a latch-based synchronous circuit.

Define independent clock signals for each master latch and each slave latch.

Optionally improve predicted performance through retiming, i.e. by moving latches across combinational logic.

Generate matched delay for implementation of a completion detector for the corresponding combinational block. Implement the local controllers (e.g. 1D60, 1D61, 1D70, 1D71).

The aim of said local controller implementation is to produce a set of distributed controllers that communicate locally with their neighbors and generate the control signals for the latches in such a way that the behavior of the system is preserved.

Of course both the sequential circuit and the desynchronized circuit can be modeled using MGs. For simplicity of modeling (though none less formal), a modeling relaxation that assumes all combinational blocks and latches have zero delay is used. Thus, the characteristic of interest in this type of simplified model is the sequence of events of the latch control signals.

Further, this type of model assumes that all latches become transparent when the control signal is high.

The marked graph at 1E50 represents the behavior of the latches inherent in the marked graph at 1E10. As shown:
1. The transitions A+, A−, A+, which denotes that the rising and falling transitions of each signal must alternate.
2. The transitions B−, A+, denotes the fact that for latch A to read a new data token, B must have completed the reading of the previous token coming from A. If this arc is not present, data overwriting can occur, or in other words, hold constraints can be violated.
3. The transitions A+, B−, denotes the fact that for latch B to complete the reading of a data token coming from A, it must first wait for the data token to be stored in A. If this arc is not present, B can "read a bubble" and a data token can be lost, or in other words, setup constraints can be violated.

Thus if a pair of controllers can be implemented to observe the sequence of transitions above, and if the implementation can be generalized to correspond to the aforementioned assumptions regarding latches, then a generalized controller scheme can be applied to implement a desynchronized circuit of the form shown at 1D50 that is equivalent to a given synchronous circuit of the form of 1D00.

Detailed Description of the Control Layer

From the foregoing descriptions and from corresponding figures, the operation of the logic of the control layer may be readily understood by those skilled in the art from the preceding description and figures, However, for purposes of disclosure of fully automatic synthesis of a synchronous circuit into a de-synchronized asynchronous circuit, more formal analysis is performed, and examples presented herein.

Returning to FIG. 8A, the block 805 with label CL represents the combinational logic between the input data 811 (Di) and the master latch 812 (Lm). The output of the combinational logic is represented by signal 814 Dm. In general, the input data 811 may come from another internal block of the circuit or from an external channel.

The controller 810 generates the enable signals EN2 and EN3 for latches 812 Lm (master) and 816 Ls (slave). Every controller 810 communicates with the neighbor controllers by means of a pair of handshake signals, typically called request (req) and acknowledge (ack). The req signal travels in the same direction as the data, and indicates that the associated data is valid or will be valid after some known period of time. The ack signal travels in the opposite direction and indicates that the data has already been consumed or will be consumed after some known period of time.

The events in the control signals follow a two-phase protocol. This means that every event on the req signal, either a rising event (from 0 to 1) or a falling event (from 1 to 0), produces a pulse on the corresponding enable signal of the latch. This protocol differs from the four-phase protocol, in which only one of the events (e.g. rising) activates the latch, whereas the other event (e.g. falling) is required to return the control logic to the initial state.

A key characteristic of two-phase protocols is that every triggering signal in the control layer (C elements and delays) switches to a new stable state only once at each data transfer. This characteristic contributes to simplify the timing analysis of the circuit and calculate the matched delays. In some embodiments, some signals within the controller follow a four-phase protocol, for example, signals within the pulse generators.

The functionality of the control layer is next explained, referring to the signals depicted in FIG. 7. The functionality is first described assuming that the master and slave latches initially contain irrelevant data and are ready to accept new values based on the incoming data from the input channel Di.

Any event produced on the input req signal Rin is propagated to signal Rm through the delay dM 820, the C-element Cm and the delay dX. The event on Rm generates a pulse on the enable signal of the master latch Lm. This pulse captures the data coming from Dm.

The event on Rm is also propagated to signal Rout through the delay dS and the C-element Cs. The event on Rout also generates a pulse on the enable signal S of the slave latch Ls. This pulse captures the incoming data from Ds and transfers it to Do.

The control logic also generates the ack signals in the upstream direction to stop incoming data when the latches still contain relevant data that has not been transferred to the outputs. Any event on signal C is propagated to Aout through the delay dA to indicate that the data sent to Di (and through combinational logic CL) will be captured by the master latch Lm after a certain period of time. Thus, the input channel is allowed to produce new data without overwriting the previous data.

In a similar way, the signal Rout is propagated to the C-element Cm through the delay dB to indicate that the data in Ds will be captured by the slave latch Ls after a certain period of time, thus indicating that new data will be able to be captured by the master latch Lm.

The signal Ain has a similar effect for the slave latch Ls. It indicates that the receiver has already captured the data in Do and, therefore, the slave latch Ls can safely capture new data without overwriting the previous contents of Do.

Figure 13:
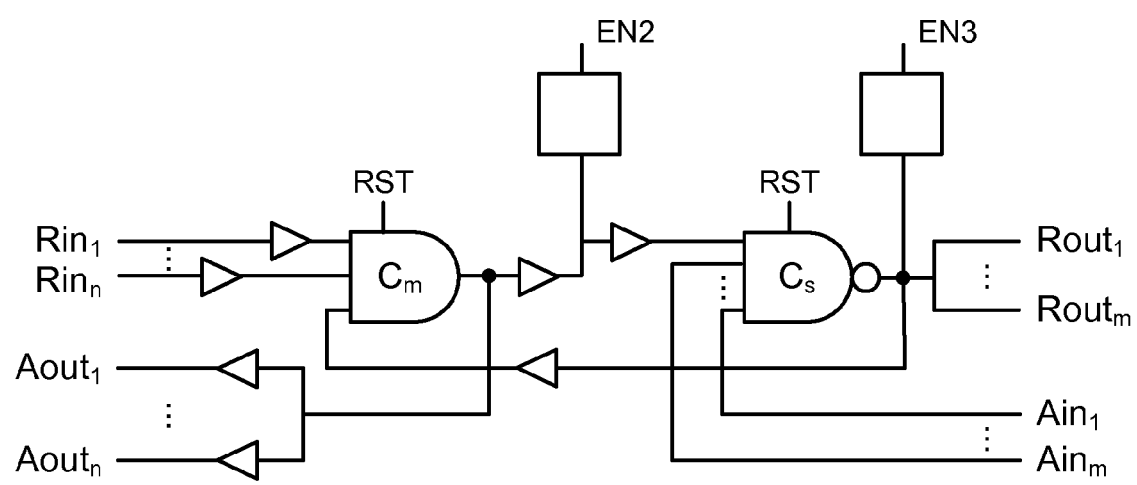
FIG. 13 depicts the scheme of the controller for a pair of master/slave latches when the block receives multiple input channels and delivers data to multiple output channels, according to one embodiment.

The foregoing paragraphs describe the behaviors of the components of a controller. Of course the controller design can be generalized and from a generalized description, a parameterized model can be constructed. Such generalized and parameterized descriptions might include (but are not limited to) the modeling of any input or output as a bus of parameterizable width, the modeling of any delay as a parameterizable delay (e.g. lumped delay) or a parameterizable series of delays (e.g. min, typ, max), or even pin-to-pin parameterizable delays. Indeed although the foregoing descriptions have referred to scalar signals Rin, Aout, Rout and Ain as scalar signals, Rin, Aout, Rout and Ain might be vectors (busses); one possible embodiment of which is shown in FIG. 13. Once such a parameterized model is constructed, it can be output, and its parameter values assigned during the execution of a synthesis operations as described in FIG. 3, in particular (though not exclusively) at operation 320.

A parameterized model might take the form of a hardware description language (HDL) model (e.g. a Verilog model, or VHDL model) with some portions of the hardware description described in structure (e.g. a netlist) and some portions described in other constructs (e.g. assign statements and/or other RTL constructs). Also, a parameterized model might include delays as represented directly in the hardware description language, or in a separate file, or both.

As regards delays, as is disclosed herein, delays are considered in the design and operation of asynchronous circuits, and as such it must be emphasized that any delay model might be used in description of any of the circuits disclosed herein. In particular, simple delay models (e.g. unit delay) or more sophisticated delays (e.g. min, typ, max, separate rise & fall, pin-to-pin, etc) might be used in such a parameterized model, and the resulting model might be used in one or more processes within the context of an EDA flow.

Of course, delays from point to point in a path have many contributors, and in some cases contributions from media and other physical design characteristic may carry first order magnitudes. In many design flows, delay characteristics, data and formulas including characteristics, data and formulas as relates to semiconductor fabrication process, parasitics, wire delays, gate delay, and other delays might be included in any delay analysis and/or back annotation.

Returning to FIG. 8B, the circuit 860 might be simplified, and in fact it might be simplified to eliminate any or all of the buffer elements, so long as certain temporal relationships remain in the resulting simplified circuit. Moreover, for purposes of illustrative representation, the gate-level descriptions might be abstracted to a higher level of hierarchy using model blocks (e.g. schematic symbols) for C-elements, pulse generators and clock gates. Such a representation is provided in FIG. 8C.

Figure 8C:
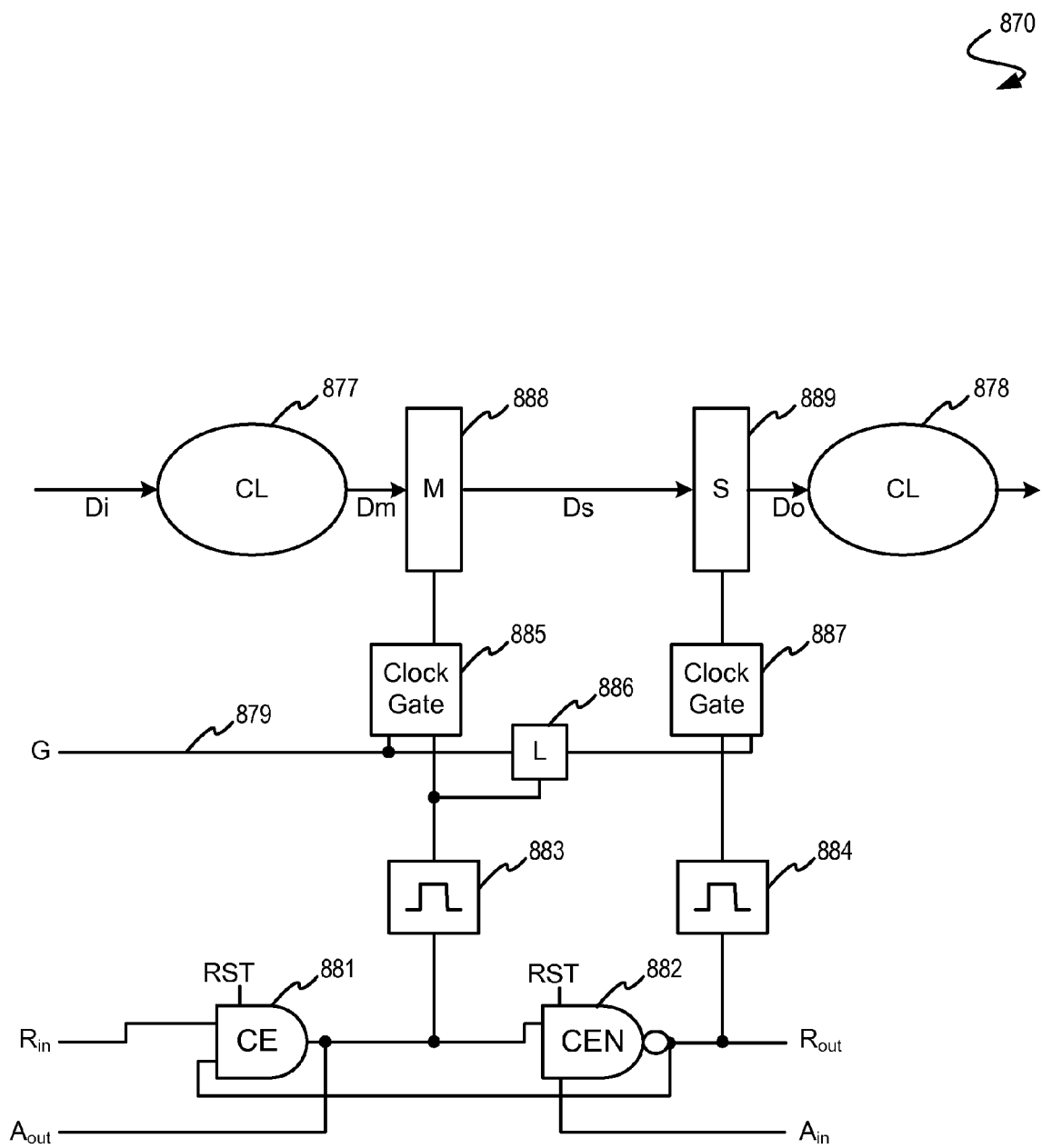
FIG. 8C depicts a possible abstraction of the control logic, according to one embodiment.

As shown, the circuit of FIG. 8C includes a first C-element 881 that generates a transition on a first control signal, a first pulse generator 883 that transforms every transition of the first control signal into a pulse operable to enable at least one level-sensitive latch 888 (with or without being gated by a clock gate 885). Also included is a second C-element (possibly with an inverted output) 882 that generates a transition on a second control signal used as an input to a second pulse generator 884 that transforms every transition of the second control signal into a pulse operable to enable at least one level-sensitive latch 889 (with or without being gated by a clock gate 887). Some embodiments use a clock gating technique that includes a gate signal 879 and a latch 886.

In these exemplary embodiments, the schematic symbols do not explicitly represent delays. The delays, however are used in the design and operation of real circuits, and may be tuned to correspond to the delays(s) of the combinational circuits 877, 878.

In somewhat less formal terms, the mechanism implemented in the controller design is called completion detection. Indeed, the controller can be said to operate to accomplish two objectives, namely (i) latch the data into the master latch as results from the completion of the logic operation of the preceding combinational cloud 877, and (ii) hold the slave latch data until the in the next combinational cloud logic 878 has completed. As earlier indicated, the conservative approach (e.g. ignoring earlier completion based on don't care paths) to determining completion (settling) of a real circuit using real combinational logic gates can be determined through static timing analysis.

One aspect inherent in the preceding paragraph is the occurrence of two separately controllable delays, namely, and as shown in FIG. 8A at delay element dX 821 (an execution path delay) and at delay element dA 822 (an acknowledge path delay), each of which is calculated based on the static timing analysis results of the corresponding combinational cloud. In some embodiments, delays might be calculated speculatively. That is, there is some delay inherent in real gates, and thus in the implementation of the controller. Also, it can be seen that without speculative delay calculations, slave latch signal does not reach the slave latch until all of the following occur in sequence, (i) after the completion of the corresponding combinational cloud, and (ii) after propagation of the completion signal to the C-element, and (iii) after the generation of the pulse (using real non-zero delay gates) to the slave latch. Accordingly, the delay dA might be adjusted (e.g. made smaller) to speculatively account for the delays inherent in the C-element and pulse generator.

In the scheme presented in FIG. 7, all req/ack signals are assumed to be zero at reset time, whereas the master latches contain the relevant stored information. Of course, real circuits in real systems may have some requirements for some reset/initialization to occur in sequential elements, possibly even before the data Di is known to be valid. Within this scheme, after reset, the first produced events are the pulses of the slave latches. For this reason, the C-elements producing those pulses (Cs) must be forced to have the value zero after the reset signal RST is asserted. Different schemes can also be devised for the similar or alternate purposes. For example, it would be also be possible to configure the circuit to hold data in the slave latches and produce the first pulses on the master latches.

Clock Gating

As earlier introduced, some synchronous designs use clock gating to reduce the activity of the circuit when, during certain periods of time, some specific components need not perform any computation. One way of reducing this activity is by masking the clock using an AND gate that includes a signal that determines when the activity must be canceled (logic zero), or when activity should occur (logic 1. In the case of the synchronous designs as embodied in the circuits of FIG. 6, flip-flops with a single clock signal 609 is used. The single clock signal 609, is routed internally to flip-flops 605, and 606.

For de-synchronized designs, a possible scheme includes a gating signal for each latch (e.g. master and slave). As shown in FIG. 8B, and referring to the circuit within the boundary 860, a signal G is supplied to the AND gates 861 and 863. However, the gating signal is stored in an intermediate latch 862 and supplied to the slave latch on the cycle after it has been used by the master latch. In this way, the activity associated to the master latch can be resumed as soon as the data has been captured by the slave latch.

The timing constraints associated to the gating signal may also be considered in the timing analysis. In particular, additional constraints to guarantee that the gating signal G arrives before the pulse EN1 is generated are included in the timing model. These constraints are similar to the setup and hold constraints required for the signals in the datapath. As regards the temporal juxtaposition of signal EN2 as compared to signal EN3, the latch enable signals EN2 and EN3 are temporally similar to same signals as were provided by the controller design 810 (see FIG. 8), except the enable signals are now ANDed with a gated clock enable signal G. Use of a latch 862 simplifies the timing analysis for the paths in circuit 860. In embodiments, the enable to output delay of intermediate latch 862 is selected to be smaller than delay dS.

When the delays have been calculated, and the timing constraints for (at least) setup and hold have been calculated in feed-forward fashion, a portion of the de-synchronized circuit may be held. This state of being held is analogous in the synchronous circuit situation as being controlled by a gated clock. Of course various manners of logical operations (e.g. stage hold, accumulate, pipeline halt, etc) and power operations (e.g. pipeline standby) might be controlled by one or more gating signals G.

The importance of the state of being held should not be underestimated. Inasmuch as the recent several generations of computer processor architecture has greatly increased reliance on more and longer (deeper) pipeline architectures, so has power consumption commensurately increased. In many cases of modem computer architectures, specialized pipelines are dedicated to perform specialized functions (e.g. floating point mathematics, graphics rendering, filtering, protocol realization, etc). However such special functions may not always be required at all times, and in such situations it might be possible to hold the pipeline or even multiple pipelines dedicated to the specialized function, thus greatly reducing the transistor switching in the circuit, and thus reducing power requirements.

The techniques of clock gating in asynchronous circuits might be used alone or in conjunction with other techniques for dynamic voltage/performance/power management, including but not limited to managing voltage based on external environmental effects (e.g. power conservation under low battery power conditions, power conservation based on operational modes, power conservation based on ambient temperature conditions, etc).

In a variety of real circuit cases, a de-synchronized circuit (even a single stage of a pipeline) might include a controller circuit that includes the use of a clock gating signal by latching the clock gate signal supplied to the master latch and presenting it after a delay to the slave latch. In somewhat more detail, and referring to FIG. 8D, a possible circuit 890 includes a gated clock asynchronous controller circuit section 895 that in turn includes circuit section 896 containing elements pertaining to clock gating. Strictly as an example a possible hierarchy of the circuit 890 might include a desynchronized circuit controller section 897 and a clock gating section 896.

Figure 8D:
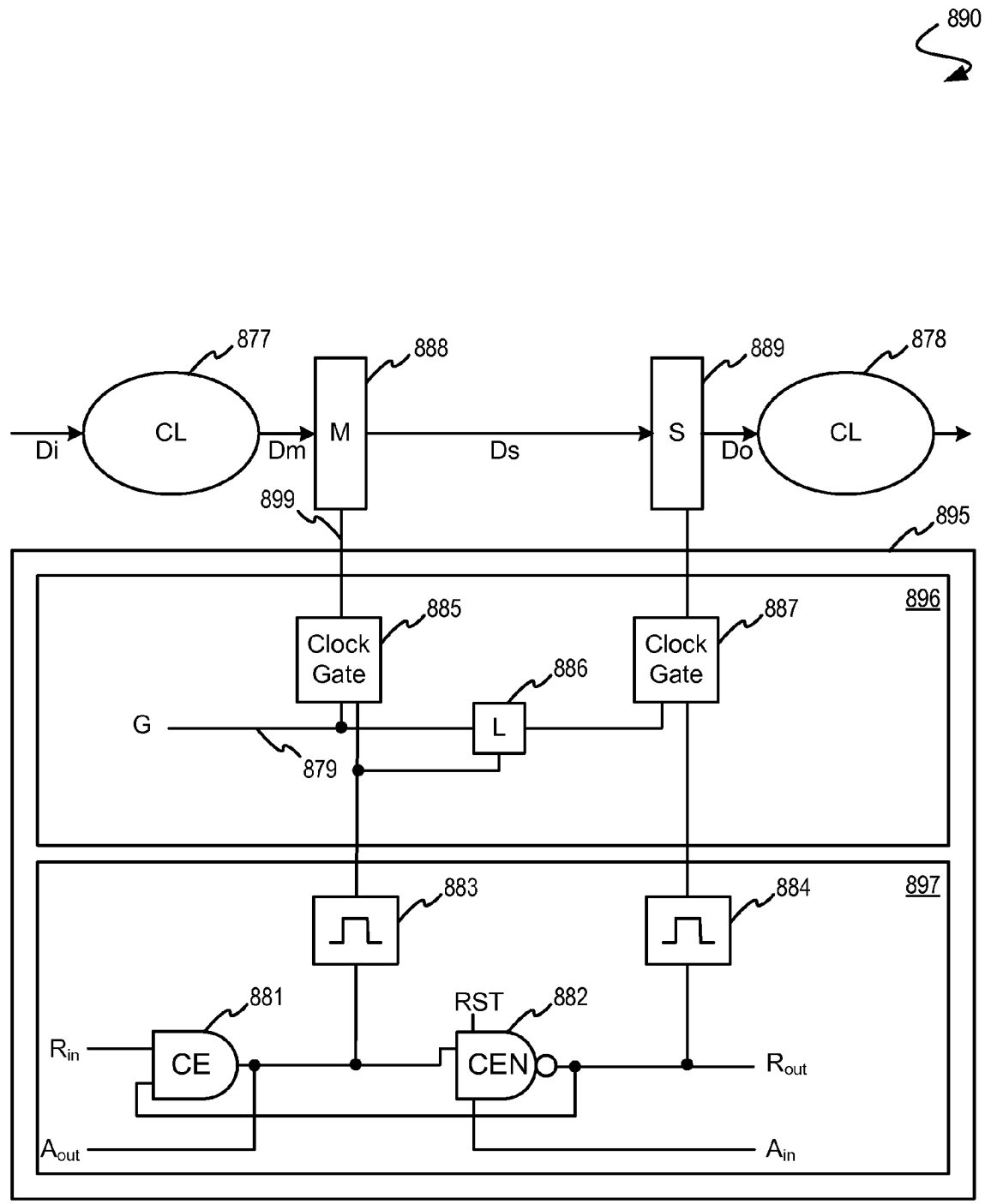
FIG. 8D depicts possible partitioning of the control logic, according to one embodiment.

In various embodiments, and as shown in FIG. 8D, the clock gating section 896 includes a clock gating circuit 885 connected to at least one clock gating signal 879 and capable of outputting an enable signal 899, in this example to latch 888. The clock gating signal 879 is stored into latch 886 upon a pulse from pulse generator 883, which latched value is in turn provided to clock gating circuit 887 upon a pulse from pulse generator 884.

Of course, within the context of automatic synthesis, various operations might be performed in support of performing logic synthesis and physical design in a gated clock desynchronized circuit controller. Specifically such operations might include:

determining timing characteristics of a gating signal 879;
evaluating timing constraints of latches (for example latches 886, 888 and 889);
analyzing correlated and uncorrelated timing characteristics of the gating logic 885 (if present); and.
analyzing correlated and uncorrelated timing characteristics affecting level-sensitive latches 886, 888 and 889.

Of course the analyzing steps presented above may include not only the timing constraints (e.g. setup and hold constraints) related to the input pins of the sequential devices (e.g. latches), but may also include timing constraints related to other paths. For example, the gate signal 879 might be required (constrained) to be available and stable some duration before assertion of other related signals.

Having then performed the evaluation and analysis steps, synthesis operations might continue by incorporating the clock gating circuit section 896 and a desynchronized circuit controller section 897 into a two-phase asynchronous controller circuit section 895, and then outputting a model of a two-phase asynchronous circuit controller section 895. Of course the two-phase asynchronous circuit controller including a clock gating circuit section 895 might be output as a single model module, or it might be output as multiple model modules including a clock gating circuit section 896 and a circuit controller 897 together with corresponding interconnects. It is understood that circuits described using a hardware description languages and/or specialized file formats for delay and constraint descriptions may be used to provide inputs to physical synthesis operations. As such, outputting the two-phase asynchronous circuit controller model might include outputting timing constraints pertaining to the clock gating circuit 896 and/or its internal components. It should be emphasized that the techniques disclosed herein include static timing analysis and constraint generation pertaining to the clock gating circuit model and may include outputting timing constraints to ensure correct and glitch-less operation by a clock gating circuit. In terms of correct operation, the timing analysis (and constraint generation) for the clock gate 885 may include analysis for constraints such that the gating signal 898 input to the clock gate 885 is a known (e.g. logic high or logic low) and stable value sufficiently in advance (i.e. resulting in a setup/hold constraint) of the clock pulse signal from clock pulse generator 883. In terms of glitch-less operation, the timing analysis (and constraint generation) for the clock gate 885 may include analysis for constraints such that all inputs to the clock gate 885, (possibly including the gating signal 898) is a known (e.g. logic high or logic low) and stable value sufficiently long (i.e. resulting in a setup/hold constraint) such that glitch-less operation is specified in the design model of the output two-phase asynchronous circuit controller 895.

Figure 8E:
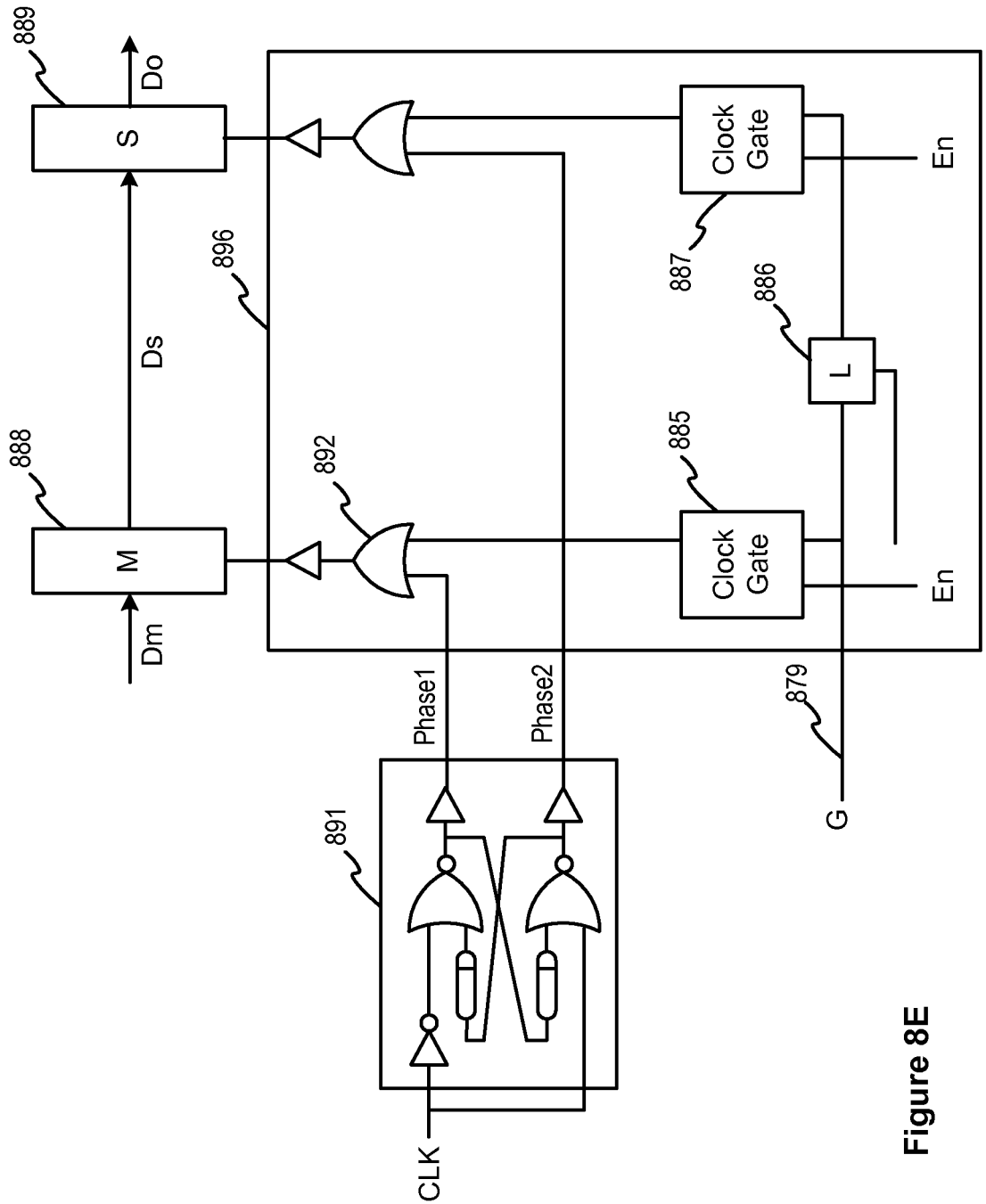
FIG. 8E depicts a possible implementation of the control logic including a circuit for synchronous testing and operation, according to one embodiment.

For testing purposes, and referring to FIGS. 8D and 8E, outputting the two-phase asynchronous circuit controller model (specifically referring to outputting any clock gating circuit 896) might include interface signals to at least one testability circuit 891. Such a testability circuit might be used to control the latch enabling signals in a manner independent from the clocking signals from pulse generators 883, 884. More generally, such a testability circuit might be used to control the latch enabling signals in a manner independent from a controller 897. Alternatively, such a testability circuit might be used to control the latch enabling signals in a manner in combination with the clock gate signal G (for example, as shown by OR gate 892). Such a testability circuit might be used to select between internal and external clocking signals As an example, use of a testability circuit in the logic to control a latch enable signal (e.g. latch 888) facilitates testing the datapath circuit in a fashion similar to testing a datapath circuit with a clocking scheme observing non-overlapping phases. As shown, testability circuit 891 permits latches 888 and 889 to be enabled by signal Phase1 and Phase2, respectively. Of course, any of the timing analysis described here might include the timing characteristics of the test circuit 891 and any/all of its inputs and outputs.

In some embodiments, the signals Phase1 and Phase2 might be supplied from some external source as inputs to the clock gating section 896, and might be generated externally through any known means. In other embodiments, the testability circuit 891 might occur in a single instance, and the signals Phase1 and Phase2 routed to one or more clock gating section 896. Of course the sample testability circuit 891 is exemplary only, and other embodiments are possible and envisioned, so long as signals Phase1 and Phase2 are operable to drive known logic values. As is readily understood by those skilled in the art, use of non-overlapping signals Phase1 and Phase2 permits control of the master sequential device 888 and the slave sequential device 889 in a similar manner as is typical of a synchronous circuit, and accordingly, control of control of the master sequential device 888 and the slave sequential device 889 in this manner is called synchronous mode.

Timing Behavior of the Controller for Predicted Behavior of the Datapath

Among other functions, the control layer provides clocking signals to the sequential devices in the datapath layer. In particular, certain timing constraints required by the sequential element implementations are synthesized, which timing is needed for a proper sequencing of data in the sequential elements (e.g. latches, flip-flops, etc.). Also, certain constraints related to the timing of paths between and including sequential elements in the datapath are synthesized. Of initial interest here are the so called setup, hold and minimum pulse width constraints of the sequential devices. As earlier indicated, sequential devices might include latches, or flip-flops. In some exemplary embodiments discussed below, and as shown in FIGS. 8A through 8D, the sequential devices are latches. In other embodiments, latches might be organized to implement flip-flops. Several types of constraints are discussed as follows.

The description of the exemplary circuits to follow assumes that the aforementioned sequential elements are latches, and that such latches are transparent when the enable signal has a logic high value (1) and is opaque when the enable signal has a logic low value (0). Of course a similar behavior could be described with the opposite polarity of the enable signal.

The setup and hold constraints define timing relationships between the input data signal of the latch and the enable signal. The setup constraint indicates that data at the input of a latch must be stable a certain period of time before occurrence of the falling edge of the enable signal. This constraint ensures that the correct (stable) input data is properly stored in the latch.

The hold constraint indicates that the data at the input of a latch must remain stable a certain period of time after the falling edge of the enable signal. This constraint ensures that the new incoming data will not overwrite the recently stored data.

For a behavior in accordance with the designs herein, the timing of the control logic must ensure that the data propagated through internal blocks of combinational logic is properly stored the latches. For that, timing related to the enable signals of the latches contribute to satisfaction of the setup and hold constraints of the latches. In various embodiments, the timing on the enable signals of the latches may be adjusted by a convenient design of the delays in and between each controller. Embodiments using exemplary controller designs are now discussed.

FIG. 8A depicts a detailed description of the control layer for the communication between two pipeline phases, including the delays required to generate the enable pulses and including the (optional) clock gating and clock distribution trees of the enable signals. The signals EN1, EN2 and EN3 denote the local enable signals produced by the control layer. The local enable signals EN1, EN2 and EN3 might be used as the latch enable signals, for example as shown for latches Lm 812 and Ls 816. In other embodiments where a flip-flop is used (e.g. combining latch 812 and latch 816 within a flip-flop 1D07), the enable signal EN3 might be used as the clock signal of the flip-flop.

Since various timing constraints (e.g. setup and hold constraints) involve timing relationships between the latch input (largely a function of datapath logic) and the latch enable (largely a function of the controller logic) the timing constraints to guarantee the intended operation of the circuit can be posed as inequalities between the delays of paths in the datapath circuit as compared with delays of paths in the control circuit. The delays in the datapath circuit can be abstracted by slacks between the local clocking signals (e.g. latch enable signals) that trigger the departure of data from one latch and the arrival of data to another latch. Of course it follows that in cases where a flip-flop is used instead of latches, the slacks and the calculations of timing constraints differ slightly from the precise, latch-oriented descriptions below.

Using the latch-oriented example of FIG. 8A, let us consider the setup constraint between the latch 808 (a slave latch) and the latch 812 (a master latch). A simplified control circuit 810 is reproduced in FIG. 9. The setup slack represents the delay separation between the rising edge of clocking signal EN1 and the falling edge of clocking signal EN2 that is required to guarantee the correct transfer of data from the sequential element clocked by signal EN1 to the sequential element clocked by signal EN2. This slack can be calculated by static timing analysis tools that may take into account the minimum and maximum delays of the clock trees, latches and combinational logic, and may take into account delay variability.

Inasmuch as embodiments of the invention disclosed herein includes solving (and optimizing) systems of multiple equations in multiple variables, the disclosure herein includes formal, mathematical descriptions of constraints (generally, inequalities) and other mathematical descriptions including cost functions. In general, any timing constraint can be specified as an inequality of the following form:

$$path1+slack<path2$$

Figure 9:
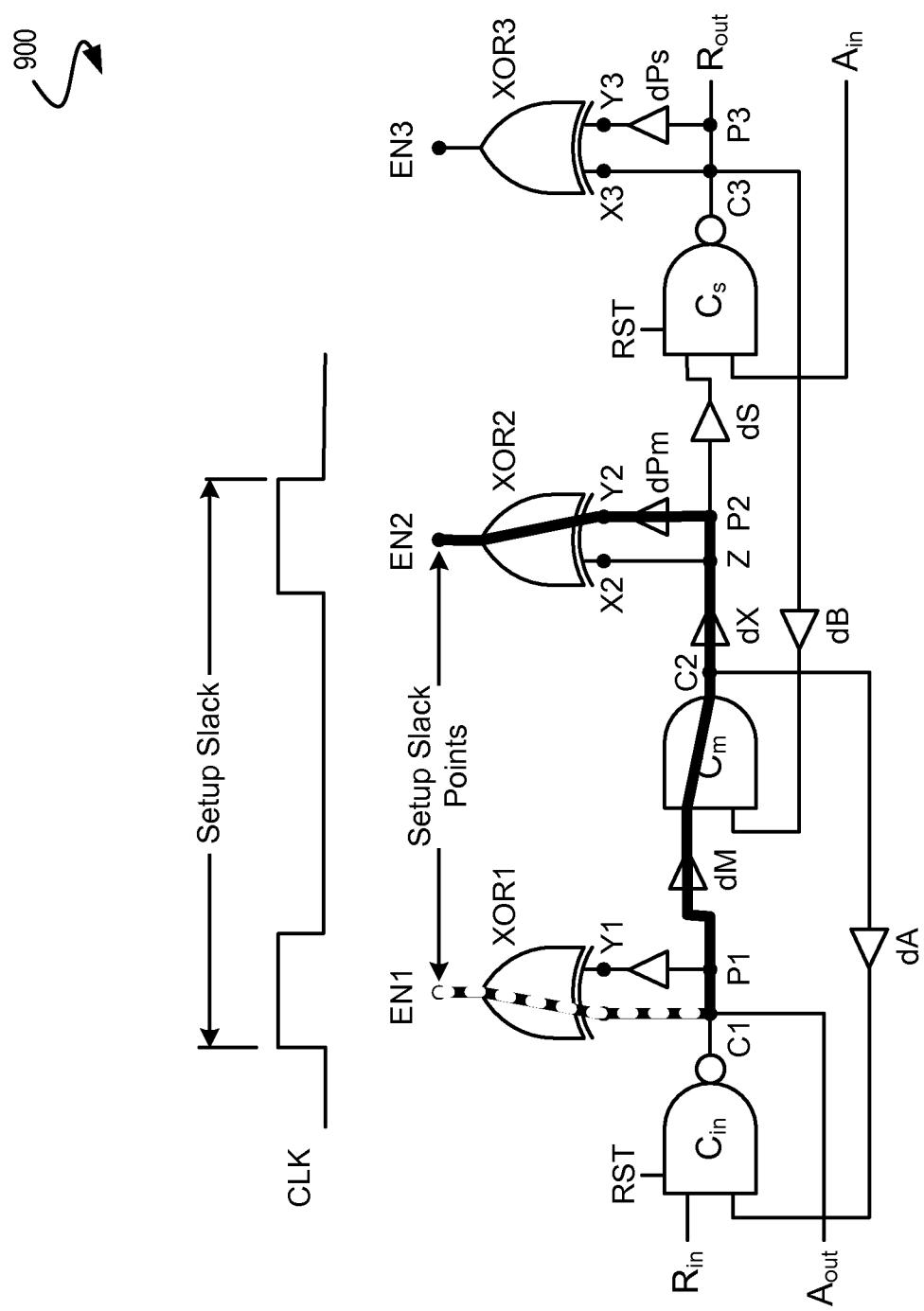
FIG. 9 depicts a setup constraint for the master latch, according to one embodiment.

For example, and as shown in FIG. 9, the setup constraint of the master latch includes the term path1, namely the path that goes from C1 to EN1 (dashed thick line), and includes the term path2, namely the path that goes from C1 to EN2 through the point Y2 (solid thick line). The other constraints follow a similar reasoning and mathematical form.

Figure 10:
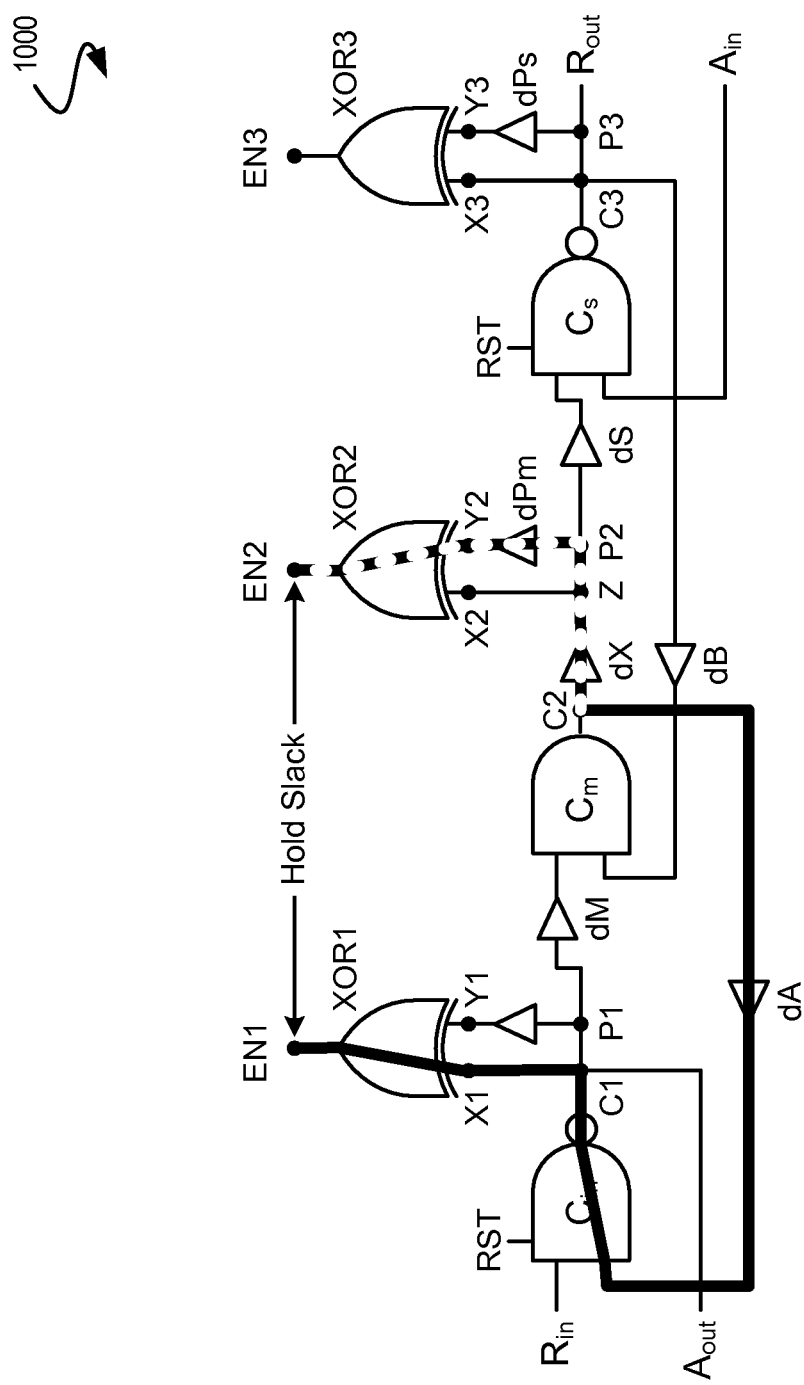
FIG. 10 depicts a hold constraint for the master latch, according to one embodiment.

FIG. 10 illustrates the hold constraint for the master latch. For predictable operation, it is required that the enable signal EN1 for the master latch goes low before the next data coming from the slave latch of the previous phase arrives at the input of the master latch. The required separation between the clock events in EN1 and EN2 is represented by the hold slack in the figure.

Figure 11A:
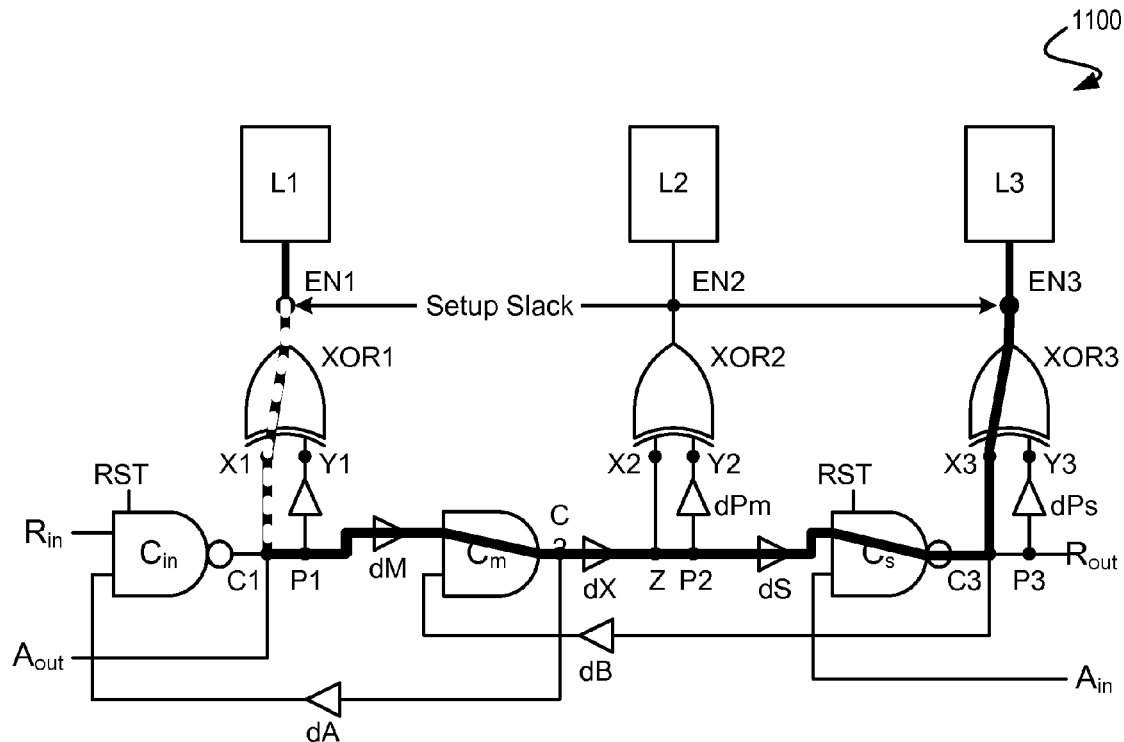
FIG. 11A depicts a setup constraint for a slave latch, according to one embodiment.

FIG. 11A depicts the paths involved in the setup constraint for the slave latch of the next pipeline phase. The constraint is specified as a relationship between the rising event in EN1 and the rising event in EN3. This particular constraint has two important points that must be emphasized:

Firstly, the master latch L2 is assumed to be transparent when the data from L1 arrives. Therefore, the events affecting signal EN2 are not critical in this constraint for the setup of the slave latch. This scheme uses the technique known as time borrowing in latch-based designs that includes using part of the transparent period of the latch to wait for the arrival of incoming data.

Secondly, the setup constraint refers to the rising edge of the enable signal of the slave latch and not to the falling edge. In the case that no time borrowing is used across different controllers, then all the delay constraints can be satisfied locally. If time borrowing would be allowed to satisfy the constraints between the slave latch of one block and the master latch of another block, the setup/hold constraints could be guaranteed by considering global paths across different controllers, however, that would make the timing analysis more extensive.

Figure 11B:
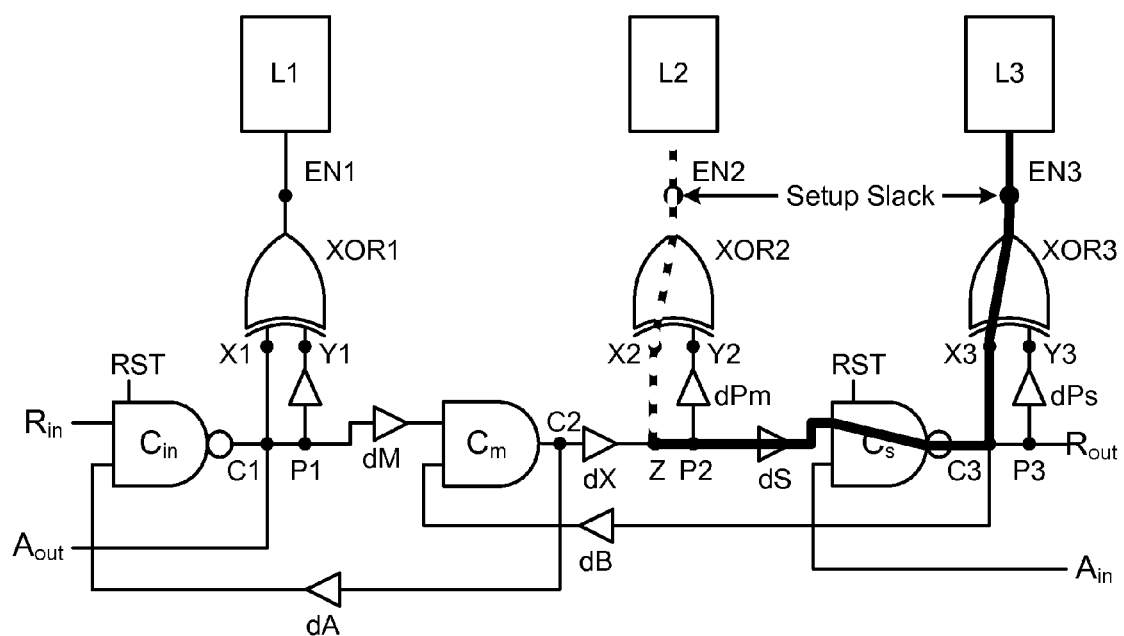
FIG. 11B depicts a setup constraint for slave latch, according to one embodiment.

FIG. 11B depicts the paths involved in a setup constraint from the master latch L2 to the slave latch L3. This constraint applies when the data coming from L1 must wait for the opening of L2 (i.e. no time borrowing). This situation may occur when L3 is not empty and blocks the arrival of data from L2.

Figure 12:
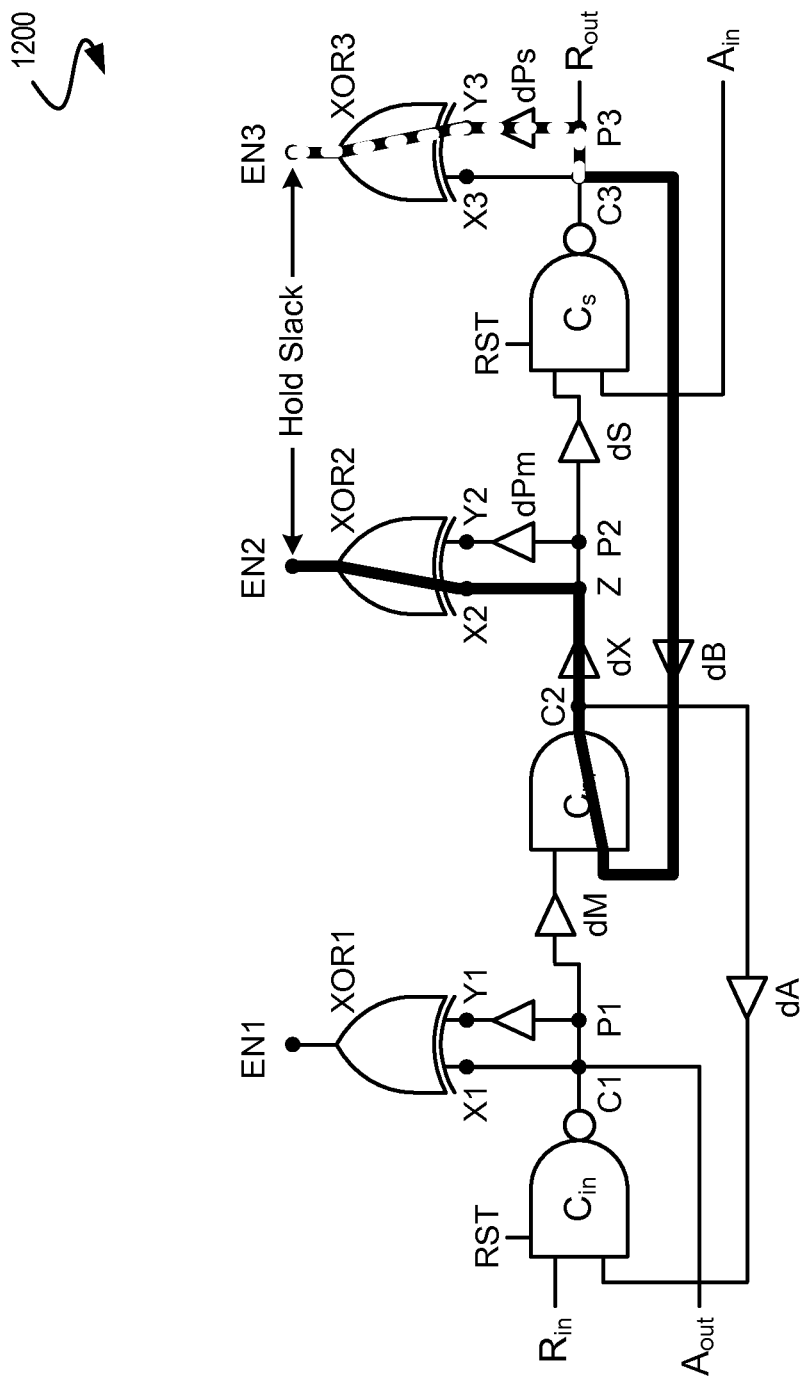
FIG. 12 depicts a hold constraint for the slave latch, according to one embodiment.

FIG. 12 illustrates the hold constraint for the slave latch, which constraint is symmetrically similar to the hold constraint for the master latch shown in FIG. 10.

Each constraint can be specified to account for the variability of the circuit delays. Thus, the inequality modeling a specific constraint can have the form $$\epsilon*(path1+slack)<path2$$

where $\epsilon$ is a de-rating or safety factor defined according to the potential variability that the two paths may manifest under a range of operating conditions. For example, for de-rating or safety factor purposes, if the left-hand-side of the inequality should be 15% larger than the right-hand-side, then $\epsilon$ should be assigned the value 1.15 (115%).

Now, given the examples as shown in FIGS. 9 through 12, a path can be described as sum of delays along the path. For example, and referring to FIG. 9, if we define path2 to be the path along the solid line from point C1 to EN2, and if we use the symbol A to represent delay, then a path delay equation might be expressed as follows:

$$\text{delay through path2} = \Delta dM + \Delta Cm + \Delta dX + \Delta Pm + \Delta XOR2$$

Of course the above simplified equation for the delay through path2 does not explicitly notate consideration of logical states or propagation of logical values, or differences between rising and falling delays or correlated or uncorrelated delays. These considerations are generally included in static timing analysis models, and in static timing analysis. For purposes of this disclosure of the following paragraphs, the simplified model above shall suffice.

The examples of FIGS. 9 through 12 show only a single channel, that is only a single pair of request signals, and a single pair of acknowledge signals. However, in general, a controller may receive data from any number of input blocks and deliver data to any number output blocks. In this case, the C-elements of the controllers must be able to synchronize all of them, as shown in the circuit 1300 depicted in FIG. 13. The setup and hold constraints for the latches must be satisfied for any of the inputs of the block.

With the above description of an exemplary controller, and returning to FIG. 7, a method for synthesizing timing constraints of a desynchronized circuit controller might be described as comprising steps including:

Synthesizing a structural representation of a controller 710

Calculating setup timing constraints for paths including clocking signal output 768 (see FIG. 9).

Calculating hold timing constraints for paths including clocking signal output 768 (see FIG. 10).

Calculating setup timing constraints for paths including clocking signal output 769 (see FIGS. 11A and 11B).

Calculating timing constraints including for paths clocking signal output 769 (see FIG. 12).

Adjusting timing constraints using calculated slack times for each corresponding path.

Including the timing constraints in or with the structural representation of the controller.

Of course as herein described, and referring to FIG. 13, the controller might include a plurality of request input signals Rin1–RinN, a plurality of request output signals Rout1–RoutN, a plurality of acknowledge input signals Ain1–AinN, and a plurality of acknowledge output signals Aout1–AoutN.

Particular emphasis is placed on the existence of at least two delays between any Request input signal Rin1–RinN and a corresponding Acknowledge output signal Aout1–AoutN. As shown in FIG. 7, the delays dM and dA are such independent delays, and might be independently specified (e.g. as part of a constraint) and independently controlled (e.g. by physical synthesis operations).

Insofar as any techniques for including the timing constraints in or with the structural representation of the controller, a variety of hardware descriptions languages and a variety of delay and constraint specification formats may be used. In some cases, a hardware description language (e.g. Verilog) contains constructs useful to describe delays. In other cases, structure and timing-related information is carried in two or more formats (e.g. a Verilog ".v" file and an SDF file).

Performance of the Desynchronized Circuit

To aid in the understanding of the approach for optimizing the performance of the matched delay controller, a working definition for performance is here introduced. In general, and referring to FIG. 8A, the selection of delays dM, dA, dX, dB, dS, dPm and dPs and the resulting path delays and slacks substantially determine the performance (i.e. delay-matching performance) of the controller circuit.

In contrast, in synchronous circuit designs, the clock period is defined in such a way that the propagation delays along the combinational logic and the registers are synchronized with the clock signal. In the last few years, the concept of useful skew has been introduced as an approach to reduce the cycle period using the minimum delays guaranteed by the combinational logic. By applying useful skew on the clock signal, a lower bound of the achievable clock period in a synchronous circuit design is determined by the cycle with the maximum mean cycle ratio. The mean cycle ratio is calculated as the sum of delays along the cycle, including combinational logic and registers, divided by the number of registers. That gives an average delay between registers that can be obtained by applying the appropriate skew to the clock of each register. Another constraint that determines the cycle time is the difference between the maximum and the minimum delay of the path between two registers. When the cycle period is shorter than the maximum delay, it is required that the minimum delay guarantees that more than one wave of data computation is flowing along the combinational logic without any overwriting.

In de-synchronized circuits, the cycle period achievable by useful skew can also be achieved by the local optimization of the delays dM, dA, dX, dB, and dS (see FIG. 7). By ensuring that the delay from Rin to Rout, through dM, dX, dS and the two C-elements, is not longer than the delay from Di to Do, the optimum performance is guaranteed for models that conform to the relaxed model that assumes all inputs into a combinational cloud must be present in order for the combinational element to fire. Additionally, the delay dA must be also defined in such a way that the cycle "dA+d(Aout, Rin)+dM+Cm" is not longer than the target cycle period, where d(Aout, Rin) is the sum of delay contributions of the neighbor controller (or environment) to the delay in the path from Aout to Rin. All these constraints can be incorporated in the calculation of the matched delays.

An important aspect of the presented control scheme is that the maximum performance can be achieved by properly defining the matched delays of a controller independently from the delays of other controllers in the circuit. This is possible because the occurrence of enable signals of the latches only depends on the arrival time of the request and acknowledge signals from the neighbor blocks, and not on the occurrence of a global event or of a global clock that controls all modules. This feature allows obtaining maximum performance in a modular way, i.e. the substitution of one block in the circuit does not affect the optimality of the matched delays included in the other blocks to achieve the optimum performance of the system.

Synthesis Flow for the Control Layer

In data-dominated circuits, the size of control layer of a de-synchronized circuit is small with respect to the size of the datapath. In a practical design flow, the synthesis of the control layer can be applied after placement and before the clock tree synthesis, aiming at optimizing the circuit for a target clock period. Given its reduced complexity, the synthesis of the control layer can be done using Engineering Change Order (ECO) techniques.

One possible first step for de-synchronization is termed clustering. In clustering, the set of registers of the circuit are partitioned into a set of clusters, each one grouping a set of registers. The inputs and outputs of the circuit may also be partitioned and grouped into input and output channels. The clustering step may take into account different design parameters trading-off the complexity of the control layer and performance of the circuit. A partition with few clusters is more area efficient since few controllers will be required to synchronize the circuit. On the other hand, a partition with many clusters may take advantage of the fine granularity of the control and obtain a better performance. Clustering may also take into account EMI aspects. All these parameters might be considered in an automated clustering step. Optionally, after the partitioning, the clustered registers are transformed into pairs of master/slave latches.

The clustering can be represented by a connectivity graph in which each node represents a cluster of registers and each edge represents the existence of a combinational path between the two clusters. This graph will be known as the cluster graph.

When clustering is complete, the clock trees (e.g. the paths in and around the signals EN1, EN2, and EN3 in FIG. 8A) are synthesized according to the load capacitance associated with the clock tree media and capacitance associated with the clocking signals of the sequential devices of the cluster. Even not strictly required for correctness, it is desirable to synthesize low-skew trees to minimize the negative impact in performance produced by the difference of arrival times at the enable signals of different latches within a cluster.

A next step is the synthesis of the pulse generators (XOR gates in FIG. 8A). The delays to generate the pulses can also be synthesized, guaranteeing that the width of the pulses is long enough to satisfy the minimum pulse-width constraint of the latches. A crucial pulse width is the one of the master latches (dPm in FIG. 8A), as that delay impacts the amount of time borrowing of the latch. This delay can be synthesized in subsequent steps, according to the performance requirements of the circuit.

Another step is the synthesis of the C-elements according to the connectivity represented in the cluster graph. Each controller will have two C-elements: one for the master latch and the other for the slave latch. The C-element associated to the master latch will receive the request signals from the predecessor clusters and the acknowledge signal from the C-element associated to the slave latch. The C-element associated to the slave latch will receive the request signal from the C-element associated to the master latch and the acknowledge signals from the successor clusters. This scheme is depicted in the circuit schematic 1300 of FIG. 13.

Another step is the synthesis of the delays of the control layer. They correspond to the delays named dM, dA, dX, dB, dS, dPm and dPs in FIG. 8A. These delays must guarantee the correct behavior of the circuit by enforcing the fulfillment of the setup and hold constraints of the master and slave latches. The delays can also be synthesized to optimize for various design parameters (e.g. area, performance, EMI, etc.). The next section describes a synthesis method for the matched delays.

An Approach for the Synthesis of Matched Delays

The methods presented in this section provide for the synthesis of the optimized matched delays dM, dA, dX, dB, dS, dPm and dPs, which delays are shown in the example of FIG. 8A-8B. As was earlier foreshadowed, and will become more apparent, the identification of the delays (dM, dA, dX, dB, dS, dPm, dPs) as independently controllable delays and the method of optimizing those delays (especially the independent delays dX and dA) results in higher performing circuits than was hitherto achievable.

The flow steps and calculations assumed include:
The control layer has already been synthesized into a structural representation. However, the bounding of the delays dM, dA, dX, dB, dS, dPm and dPs may or may not have been earlier performed, and any assignments/bounds/constraints (if calculated) may or may not be modeled in the structural representation. For a given a controller, independent delays dM and dA are synthesized for each input channel of the corresponding cluster.

The setup and hold slacks depicted in FIGS. 9-12 and the minimum and maximum delays between pairs of pins in the controller have been previously calculated by static timing analysis tools.

The physical synthesis tools are capable of generating delays within a certain interval [dmin, dmax] using gate sizing and/or buffer insertion and/or other techniques. Min and max delays and/or relative timing constraints can be used to pass such delay/constraint requirements to physical synthesis tools. The methods described in this section find optimal solutions to a set of constraints (equalities and inequalities) and an objective optimization (i.e. cost) function. One technique includes using techniques known in the field as 'mathematical programming'. Stated differently, the mathematical problem of finding optimal solutions (there may be multiple optimal solutions) to a system of N constraints in L variables can be understood as a mathematical programming problem with a cost function. Continuing this discussion in the context of the examples of FIGS. 8-12, the aforementioned L variables are delays (i.e. dM, dA, dX, dB, dS, dPm and dPs), and the N constraints are the (implied) timing constraint inequalities (i.e. slave-to-master setup constraint, slave-to-master hold constraint, slave-to-slave setup constraint, master-to-slave setup constraint, master-to-slave hold constraint, minimum pulse width constraint). Notation conventions and an exemplary set of constraint inequalities are next described.

Notation Conventions

The minimum and maximum delays between a pair of points, A and B, will be denoted by $\Delta min(A, B)$ and $\Delta max(A, B)$, respectively.

For each delay dZ to be synthesized, two delay variables are used: $dZ_{min}$ and $dZ_{max}$.

Constraints

Precision Constraint

For each delay dZ to be synthesized, the following precision constraint is defined:

$$dZ_{max} \geq \text{IntWidth} \cdot dZ_{min}$$

where IntWidth is a coefficient that represents the relative width of the interval [dZmin, dZmax]. For higher precision in the resulting optimized solution(s), this interval should be narrow (i.e. the value of IntWidth should only slightly larger than 1. On the other hand, if the interval is too narrow, the synthesis tools may not be able produce a real circuit that actually operates within such a narrow range between the minimum and maximum delay. The width of the interval is a trade-off between optimal performance and feasibility. An alternative constraint for the interval could be defined as:

$$dZ_{max} \geq dZ_{min} + \text{IntWidth}.$$

In this case, the width of the interval is defined as an absolute number that could be related to the minimum granularity for which synthesis tools can synthesize a delay.

Pulse Width Constraint

The delays dPm and dPs determine the pulse width of the enable signals of the master and slave latches. To guarantee a minimum pulse width, a constraint must be defined:

$$dPm_{min} \geq \text{MinPulseWidth}$$

$$dPs_{min} \geq \text{MinPulseWidth}$$

The set of inequalities to guarantee the setup and hold constraints are next described. See FIGS. 9-12 and corresponding disclosure:

Slave-to-Master Setup Constraint for Each Input Channel (Referring to FIG. 9)

$$\epsilon*[\Delta max(C1, EN1) + \text{SetupSlack}(EN1, EN2)] \leq dM_{min} + Cm_{min} + dX_{min} + dPm_{min} + \Delta_{min}(Y2, EN2)$$

where $Cm_{min}$ represents the minimum the delay from the input pin of the C-element Cm connected to the request signal of the input channel to the output of the same C-element.

Slave-to-Master Hold Constraint for Each Input Channel (Referring to FIG. 10)

$$\epsilon^*[dX_{max}+dPm_{max}+\Delta_{max}(Y2, EN2)+\text{HoldSlack}(EN1, EN2)] \leq dA_{min}+Cin_{min}+\Delta_{min}(C1, EN1)$$

where $Cin_{min}$ represents the minimum delay of the C-element from the input channel. In case the channel comes from the environment, the delay $Cin_{min}$ should represent the minimum delay of the environment producing new data after the arrival of an event in the acknowledge signal. The HoldSlack should also be calculated accordingly to the behavior of the environment.

Slave-to-Slave Setup Constraint (Referring to FIG. 11A $$\epsilon^*[\Delta_{max}(C1,EN1)+\text{SetupSlack}(EN1, EN3)] \leq dM_{min}+Cm_{min}+dX_{min}+dS_{min}+Cs_{min}+\Delta_{min}(C3, EN3)$$

where $Cs_{min}$ represents the minimum delay from the input pin of the C-element Cs connected to the request signal to the output of the same C-element.

Master-to-Slave Setup Constraint (Referring to FIG. 11B)

$$\epsilon^*[\Delta_{max}(Z, EN2)+\text{SetupSlack}(EN2, EN3)] \leq dS_{min}+Cs_{min}+\Delta_{min}(C3, EN3)$$

where Z is point Z, and $Cs_{min}$ represents the minimum the delay from the input pin of the C-element Cs connected to the request signal to the output of the same C-element.

Master-to-Slave Hold Constraint (Referring to FIG. 12)

$$\epsilon^*[dPs_{max}+\Delta_{max}(Y3, EN3)+\text{HoldSlack}(EN2, EN3)] \leq dB_{min}+Cm_{min}+dX_{min}+\Delta_{min}(Z, EN2)$$

where $Cm_{min}$ represents minimum the delay of the C-element from the input channel.

The previous inequalities describe theoretical minimum and maximum delays in the control layer to guarantee the setup and hold constraints. Theoretically, there are an infinite number of solutions (albeit non-optimal solutions) involving satisfying the constraints with arbitrarily large delays on the larger side of the inequality. However, if the delays are larger than required to just satisfy the inequality (i.e. just near the point the implied equality), the performance of the circuit will be suboptimal. By defining additional constraints and a cost function, the circuit can be optimized (for minimums or maximums as the case may be).

The cost function might be related to minimizing the period, as has been discussed above. Alternatively, the objective might be to optimize (minimize) electromagnetic interference and an appropriate cost function defined. Or, the cost function might be to optimize (minimize) power, etc.

As regards the optimization for throughput of the controller, one or more constraints, and a cost function involving minimizing the period of the controller might be defined. For example, if the most critical local cycle in the controller were the cycle including the delays dM and dA and the C-elements Cm and Cin, then for each input channel of the circuit, the following inequality can be defined:

$$dM_{max}+Cm_{max}+dA_{max}+Cin_{max} \leq \epsilon^*\text{Period}$$

where Period can be either a pre-defined target cycle period or a variable that can be minimized in a cost function. In this and other examples, a cost function can be defined to minimize the total amount of inserted delays and the cycle period. Again referring to the circuits of FIG. 7, an example of cost function could be the following:

$$\min \quad \Sigma_i(dM^i_{max}+dA^i_{max})+dX_{max}+dS_{max}+dPm_{max}+dPs_{max}+\lambda^*\text{Period}$$

where $dM^i$ and $dA^i$ refer to the delays associated to the i-th input channel of the controller and $\lambda$ is a weight factor that determines the importance of the period relative to other performance tradeoffs (not shown).

The previous systems of N constraints in L variables and a cost function can be solved using linear-programming techniques.

In more formal terms, and using a technique for optimizing multi-variable problems known as LaGrange Multipliers, we can define a system of N equations (actually the implied equality within each of the above inequalities) $f_1(d_1,d_2,d_3,\ldots d_L), f_2(d_1,d_2,d_3,\ldots d_L), f_N(d_1,d_2,d_3,\ldots d_L)$ and we can further define a cost function, $g(d_1,d_2,d_3,\ldots d_L)$. Then, using the aforementioned technique involving LaGrange Multipliers, we can find maximum and minimum solutions to the system of equations.

Of course, solving the system of inequalities for minimum delays (i.e. optimizing to a minimum within the constraints) results in a set of minimum delay values for each of dM, dA, dX, Ds, dPm and dPs. Solving the system of constraints for maximum delays (i.e optimizing to a maximum within the constraints) results in a set of maximum delay values for each of dM, dA, dX, dS, dPm and dPs. Thus, the obtained results from solving both systems of constraints will produce optimized minimum and maximum values for all delays.

It should be emphasized that although the examples above have been expressed in terms of linear inequalities, there exists a range of techniques for optimizing a set of non-linear inequalities, given a cost function. Again, a technique known as mathematical programming, and again, possibly including use of techniques involving LaGrange multipliers might be used to solve (optimize) systems including non-linear inequalities. Strictly as an example, the value for any term in an inequality might be expressed as a non-linear function (though not excluding linear functions) related to operational, environment and process corners. Specifically, operational, environmental, and/or process corners such as low voltage, high temperature, etc., might be included. Even more cost functions are considered and reasonable, namely (just for example), a toggling metric, an area calculation, a latency calculation, a frequency, etc.

Having mentioned techniques for solving for optimized solutions to systems of N constraints in L variables and a cost function does not eliminate the possibility for inconsistent systems of equations. Inconsistent systems of equations might occur as a consequence of values passed in from floorplanning and or static timing analysis tools. In such cases, a possible design flow includes feedback to previous floorplanning and synthesis steps.

Given the foregoing then, a possible design flow for the synthesis of the delays could be as follows:
  Define a cost function and the system of linear constraints for the delays based on the information provided from floorplanning and static timing analysis tools.
  Obtain optimized minimum and maximum values for the system of delays and constraints using a linear-programming or mathematical programming solver.
  Provide the optimized sets of timing constraints (e.g. dZmin and dZmax) to the physical synthesis tools.

Using more generalized terms, a possible design flow for the synthesis of the delays could be as follows:
  design the controller to contain multiple independent delay variables;
  define constraint inequalities (e.g. slave-to-master setup time constraint, slave-to-master hold time constraint, slave-to-slave setup time constraint, master-to-slave setup constraint, master-to-slave hold time constraint, master pulse width constraint, and slave pulse width constraint, cycle period, etc.)

relate each constraint inequality with respect to its constituent delays;

define a cost function expressed using at least one of the multiple independent delay variables;

solve for a minimum (or maximum) using the cost function and the implied equality within each of the inequalities;

annotate the design of the controller with the resulting delay values.

Within the context of this flow, the annotated design might be stored in a computer-readable format, possibly in memory, and possibly passed to a downstream EDA tool, or possibly stored in/on some tangible computer readable format (hard drive, CDROM, flash drive, etc).

Resetting a Desynchronized Circuit

Figure 14:
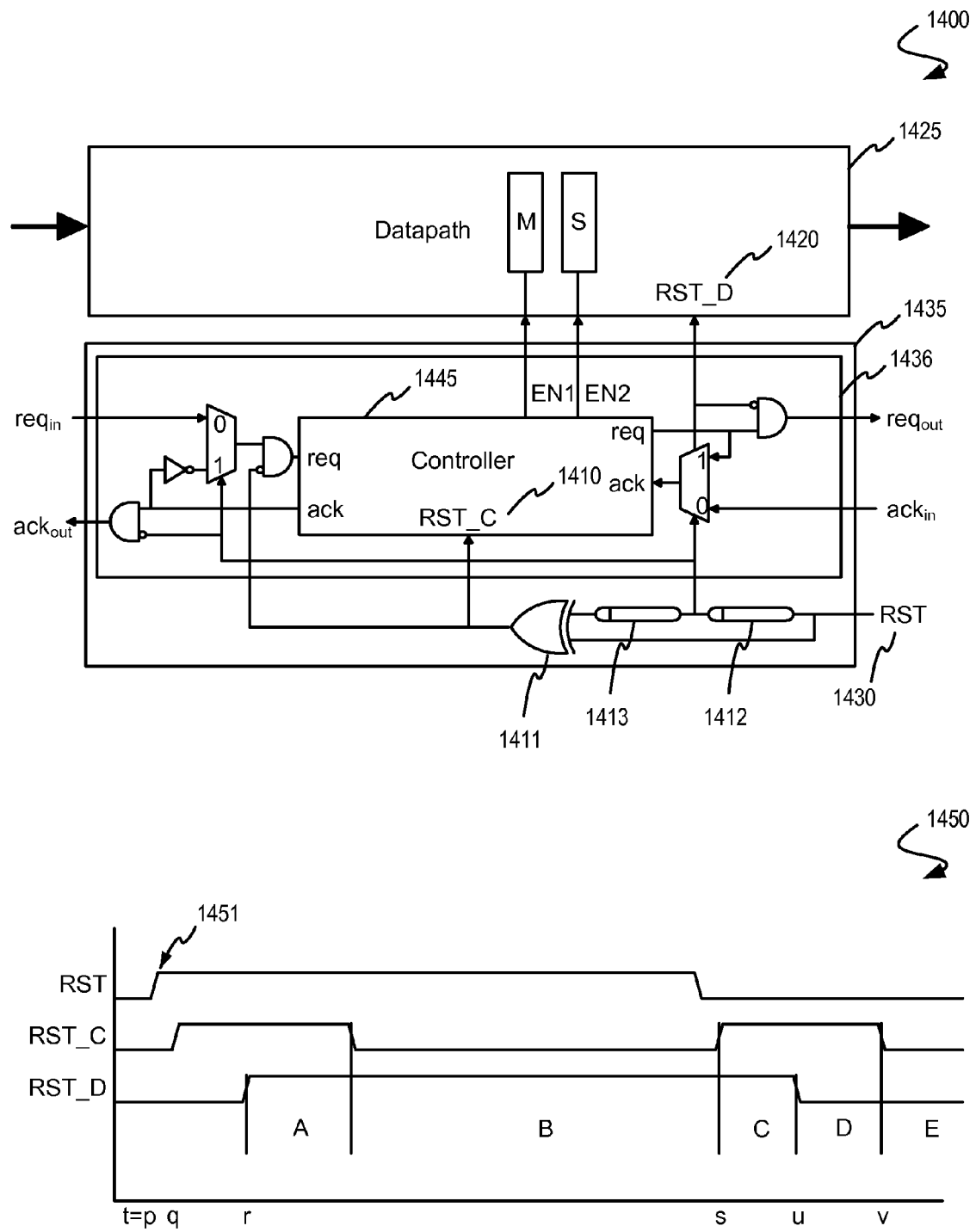
FIG. 14 depicts logic for resetting circuit, according to one embodiment.

A possible resetting scheme is presented in FIG. 14. The circuit 1400 as shown includes two derived reset signals: RST_C 1410 for the control layer and RST_D 1420 for the data layer. These derived reset signals RST_C 1410 and RST_D 1420 are derived from an external reset signal RST 1430 that comes from the environment.

In the embodiment shown in the circuits of 1400, the reset logic has one XOR gate 1411 and two delay elements 1412 and 1413. Each event on RST 1430 is operable to produce a pulse on RST_C. Also, each event on RST 1430 is operable to produce a pulse on RST_D. The operation of this reset logic in the context of the datapath circuit 1425 and desynchronized controller 1435 circuit serves to initialize all sequential elements controlled by the controller 1435. Of course the circuits shown at 1400 are but one stage of a pipeline and, in general, any number of datapath circuits together with their corresponding controllers might be connected or abutted.

Now, turning to the exemplary timing diagram of 1450, the diagram shows the external signal RST being asserted at 1451.

At time t=0, RST is low, and is asserted to logic high at t=p. After RST is asserted, RST_C goes high after the delay of XOR gate 1411, at time t=-q. Similarly after RST is asserted, RST_D goes high after the delay of delay element 1412, that is, at time t=-r.

At time t=r, phase A begins, and both RST_C and RST_D signals are asserted. Thus, the sequential devices (e.g. latch M and latch S) in the datapath receive a reset signal, and the control layer is similarly initialized (see element Cs of FIG. 8A). Of course it is possible and reasonable that not all sequential devices in the datapath are resettable devices, and those uninitialized sequential devices may later take on a known value within some number of cycles of normal operation of the datapath. At the end of phase A or a short time after the beginning of phase B, the datapath sequential elements become reset. In parallel, the controller, being reset during phase A, starts working and propagating values along the datapath. In some embodiments, phase B can persist long enough to reset the whole datapath, including any adjoining datapath pairs. This phase comes to completion when the RST signal is deasserted at time t=s. It is important to realize that the latches with reset still remain at their initial value.

After time t=s, both reset signals RST_C and RST_D are asserted. The situation is similar to phase A, but now sequential devices in the datapath have been initialized as intended by the propagation of values during phase B.

At time t=u, the reset signal for the datapath becomes deasserted. During this phase D, sequential devices in the datapath have been initialized as intended and the control layer is silent.

At time t=v, the reset signal for the control RST_C becomes deasserted, and the circuit 1400 commences functioning in normal operation mode.

It is important to realize that the duration of phase B depends in part on the duration of the RST pulse. Usually, the duration of the pulse on RST can be very long relative to the natural cycle times of the datapath elements, thus giving sufficient margin to initialize all internal sequential devices of the circuit.

The circuit also includes logic to interact with the input and output channels. This is important for phase B of the reset procedure. During that phase, the external channels must produce some handshakes to avoid a deadlock in the control layer. The multiplexers controlled by RST_D create a simple feedback from the handshake signals and generate an immediate response.

The hierarchical partitions indicated by the rectangular shapes of FIG. 14 are merely examples. In some embodiments each and every controller might contain the reset logic delays and gates as shown in rectangle 1435. In other embodiments, each and every controller might not contain the reset logic delays and gates as shown in rectangle 1435, and instead the controllers might be of the form more like the controller 1445 where the signals RST_C and RST_D are merely routed to the controller 1445. In such a case the signals RST_C and RST might be derived using (for example) only one XOR 1411, one RST_D delay 1412, and one RST_C delay 1413. As may be understood from the foregoing, a longer datapath might be formed by any combination of controllers with partitions 1425, 1435, 1436 and 1445.

Of course a variety of circuit realizations for generating a waveform 1450 with the phases A, B, C, D and E are possible and envisioned (e.g. using counters or other types of schemes to generate delays and waveforms), and the realization shown at 1400 is purely exemplary.

Also, other partitioning of circuits are possible and envisioned. In particular, the blocks of embodiment 1400 are described in the context of resetting circuits in a series of computation pipeline stages, and such a pipeline would be reasonably fabricated in a single semiconductor die, however, computation pipelines might also be embodied across multiple semiconductor die, or embodied across multiple boards, or even embodied across multiple chassis.

Automatic Voltage and Speed Regulation

Since asynchronous circuits are tolerant to the variability of delays, they can easily incorporate self-control mechanisms that adapt the speed and power supply of the circuit to the dynamic requirements of the environment.

Certain voltage regulation approaches are based on the dynamic load presented to the computing device. A typical situation where this approach can be applied is in a data-processing circuit that processes data received from queued input data. The processing speed of the circuit can be (partially) controlled by the supply voltage, which voltage can be supplied as a function of the amount of pending input items stored in the queue.

In other embodiments, the processing speed of a sender circuit can be partially controlled by the supply voltage, which voltage can be supplied as a function of the speed of the sender circuit relative to a receiver circuit. In intuitive terms, the sender circuit need not produce any faster than the receiver circuit can consume the production of the sender circuit, thus the sender circuit production might be slowed down (and hence achieve power saving) to a rate to just match the receiver circuit's ability to consume.

An embodiment of a system for automatic voltage and speed regulation as presented herein is depicted in FIG. 18.

The operation of this system is based on the observation that the communication between a producer (sender) and a consumer (receiver) occurs when the sender has available data (indicated by a req signal) and also when the receiver is ready to accept new data (indicated by an ack signal). If the req signal arrives before the ack signal repeatedly, and over a long period of time, this is an indication that either the sender is running too fast or that the receiver is running too slow. Vice versa, if the ack signal arrives before the req signal repeatedly, and over a long period of time, this is an indication that the receiver is running too fast or the sender is running too slow. The ideal scenario occurs when the req and ack events occur simultaneously or nearly simultaneously. This is the desirable situation in which the communicating components have adapted their speeds for a "just-in-time" synchronization.

With the information about the relative arrival of the req and ack signals in a channel, it is possible to make decisions affecting the voltage and speed of each component. For example, if the req signal arrives first, it could be convenient to lower the voltage of the sender or raise the voltage of the receiver. Using a scheme similar to that presented in FIG. 18, it is possible to control these actions continuously and automatically, and without requiring the intervention of software or other external intervention.

The system 1800 for voltage regulation includes several components. One is a detector, within which two synchronizers sample signals from a sender and a receiver. As shown, one such sampled signal is the ack signal (generated by the receiver) and the other signal is the req signal (generated by the sender). In this exemplary case, the req signal is used as a sampling event (e.g. a clock input to a flip-flop) so as to sample a value of the ack signal. A similar mechanism could be implementing by sampling the req signal using the ack signal as a sampling event. In fact, the sample event and sampled signal need not include the req and ack signals at all; the pair of signals corresponding (in any order) to the sampling event and the sampled signal might be some other pair of signals, one from the sender, and one from the receiver that are derived from any logic values coming from the sender or receiver, respectively. The inputs of the synchronizers 1801 and 1802 are delayed versions of the ack signal. The difference between the two delays 1805 and 1806 define a time window related to the arrival of the req signal. The arrival of the ack signal is expected to occur within this window when the speed of the sender and the receiver are similar. The window can also be defined by applying different delays to the req signal or with a combination of delays between the req and ack signals.

Referring again to FIG. 18, specifically the system 1800, the results of the detection operations are communicated to a compensator 1835, which in turn adjusts voltages. One embodiment of a compensator (and possible constituent components) is shown at 1835.

To prevent excessive oscillations of the voltage regulator (especially when operating at or near the optimal rates) a low pass filter may be included in the compensator circuit, as shown in the embodiment shown at 1800. This filter indicates a speed mismatch (i.e. up indication 1821, or down indication 1822) to the voltage regulator only when the arrival times of the req signal and the ack signal are consistently mismatched (on average) repeatedly over a selectable period of time. Of course the aforementioned selectable period of time is related to the operational speed of the sender and receiver. In some embodiments, the selectable period of time may be at least partially established by the architecture of the low pass filter 1830. For example, the low pass filter may store a selectable number of samples (T) and calculate an average over those samples (T). Such a low pass filter may store a new sample into a FIFO upon a request (or an acknowledge) event. In other embodiments of the low pass filter, the value for T may be initialized by the hardware, or T may be initialized under external control, or T may be dynamically varied on the basis of actual operating conditions, or any combination of such options. In some embodiments of the low pass filter, the number of available samples may be fixed (e.g. with a fixed-length hardware FIFO); however, the number of active samples (i.e. those samples actually included in the low pass filtering operation) might be varied dynamically by changing the number of active taps.

When a speed mismatch is reported by the filter, an action to raise or lower the voltage is taken. In the embodiment shown in FIG. 18, the low pass filter 1830 operates to signal to the voltage regulator 1840 to raise (e.g. send an up signal 1821) or lower (e.g. send a down signal 1822) the voltage. This action can either affect the sender or the receiver. This decision will depend on the topology of the system and on the requirements of the environment. In the example shown in FIG. 18, the voltage regulation affects the sender of the channel.

FIG. 19 depicts a system with multiple blocks and communication channels as shown at 1950. As shown, the voltage regulation can be applied to each block independently. By defining an external reference speed to interact with the environment, and by starting the system operation at the highest voltage that is sufficient to ensure that all blocks match their performance requirements, the blocks can progressively lower their voltage in order to adapt their speed to the speed of their neighbors. By a process of diffusion that propagates across the system, each block will stabilize to a voltage sufficient to meet the speed requirements determined by the environment and by their neighbors.

The embodiment at 1950 shows such a system with multiple controllers 1922, 1923 and 1925 and multiple communication channels 1927 and 1928, each communication channel including request and acknowledge signaling. In some embodiments, detecting a time separation between the speed of operation of a sender circuit and a receiver circuit is accomplished by detecting events on the request or acknowledge signals of a two-phase controller. In other embodiments, detecting a time separation between the speed of operation of a sender circuit and a receiver circuit is accomplished by detecting pulses on the request or acknowledge signals of a four-phase controller.

Once detection of a time separation between the speed of operation of a sender circuit and the speed of operation a receiver circuit is accomplished, an adjustor produces a regulated Vdd voltage on a voltage supply rail.

The voltage regulators 1921, 1923 and 1925 can be instanced to each controller independently. In the embodiment shown each regulator 1921, 1923 and 1925 is connected to a common power rail Vdd, and produces a regulated Vdd voltage on a voltage supply rail 1941, 1942, 1943 that in turn powers supply voltage connections to the circuit elements in the data path (which supply connections are not shown in the embodiment 1950).

The aforementioned descriptions apply to the two-phase controllers described herein. Notwithstanding, one or more of the techniques for regulating voltage to maximize power efficiency in a circuit might be applied in a system implementing a four-phase protocol. Moreover, while the aforementioned techniques disclose voltage regulation of the supply voltage, techniques to change voltage biasing might as well be applied within the context of the embodiments of the invention herein.

The electronic systems into which various embodiments of the present invention might be based on CMOS transistor technologies, or they might be based on bipolar transistors (e.g. ECL emitter coupled logic) or other logic families for that matter. Regardless, the techniques disclosed herein might be applied within other logic families and produce predictable results.

Of course other embodiments are possible and envisioned. In particular, the blocks of embodiment 1950 are presented in the context of a series of computation pipeline stages 1903, 1904, and such a pipeline would be reasonably fabricated in a single semiconductor die, however computation pipelines might be embodied across multiple semiconductor die, or embodied across multiple boards, or even embodied across multiple chassis.

Interaction with the Environment

In some cases, a desynchronized circuit must interact with the environment. Scenarios considered here include:
1. A desynchronized circuit interacting with an external circuit that is an asynchronous circuit with a 2-phase controller: For example, a this type is one in which the external channels observe a two-phase protocol compatible with the two-phase protocol herein disclosed. In this case, an external channel comprising a direct connection of the wires may be sufficient to interact with the environment.
2. A desynchronized circuit interacting with an external circuit that is an asynchronous circuit with a 4-phase controller: This scenario includes situations in which the environment observes a four-phase protocol. In that case, a 2-phase to 4-phase protocol converter might serve to permit asynchronous exchange of data exchange following a 2-phase to 4-phase (or conversely 4-phase to 2-phase) handshaking protocol.
3. A desynchronized circuit interacting with a circuit that is a synchronous circuit: This scenario is presented (for example) when the desynchronized circuit must interact with a synchronous environment. In this case, embodiments supporting a communication scheme that synchronizes the synchronous circuit to the desynchronized circuit using an external clock signal is appropriate.

In exemplary cases of the first scenario, a desynchronized circuit might interact with desynchronized circuit in the environment through external channels that are operable to communicate both data and a 2-phase synchronization protocol of handshake signals (e.g. request and acknowledge).

Figure 15:
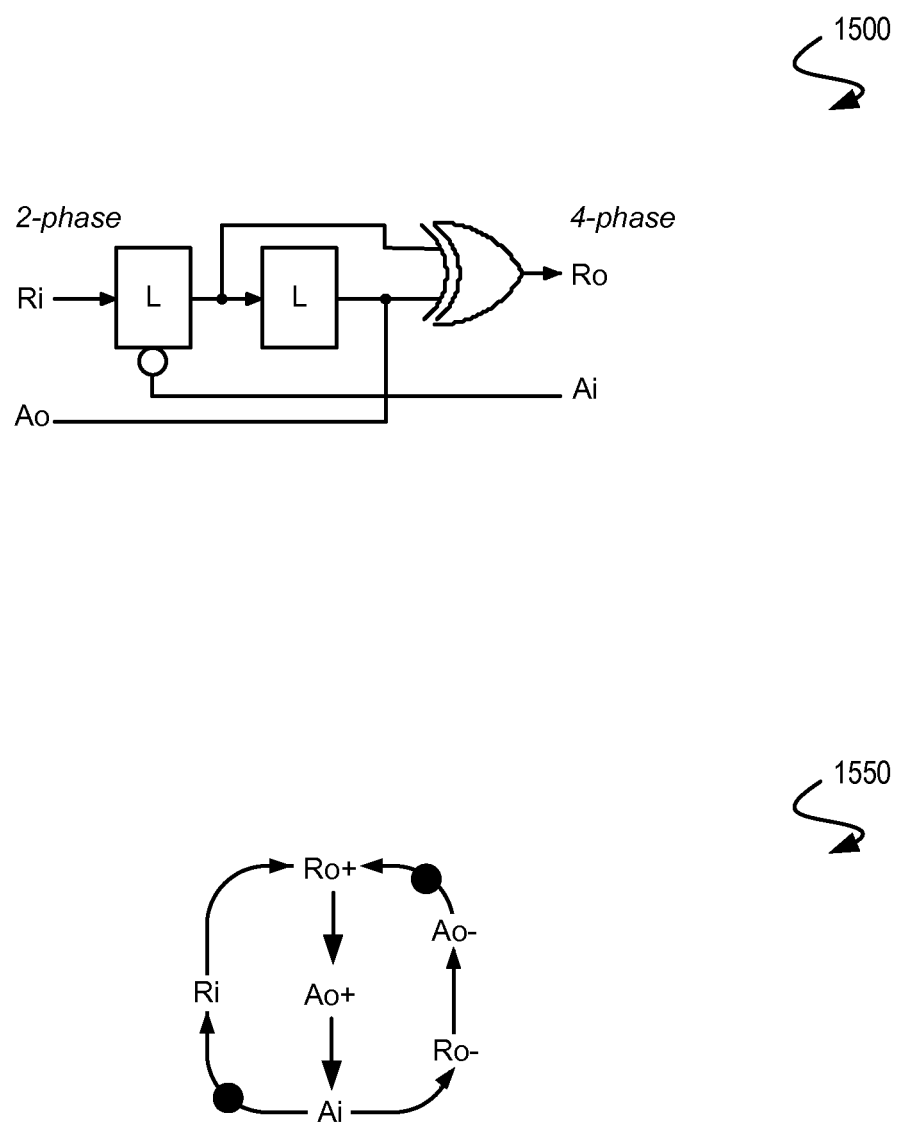
FIG. 15 depicts the behavior and circuit of a two-phase to four-phase protocol converter, according to one embodiment.

In exemplary cases of the second scenario, a desynchronized circuit might interact with a desynchronized circuit in the environment through external channels that are operable to communicate both data and 2-phase to 4-phase (or conversely 4-phase to 2-phase) protocol of handshake signals (e.g. request and acknowledge). Such a scheme is depicted in FIG. 15, in which a Signal Transition Graph 1550 specifying the behavior of the controller and a possible implementation of the controller 1500 are shown.

In exemplary cases of the third scenario, a desynchronized circuit might interact with a synchronous circuit in the environment through external channels that are operable to communicate data and handshake protocol signals including request and acknowledge as well as a synchronous clock and an external reset.

Figure 16:
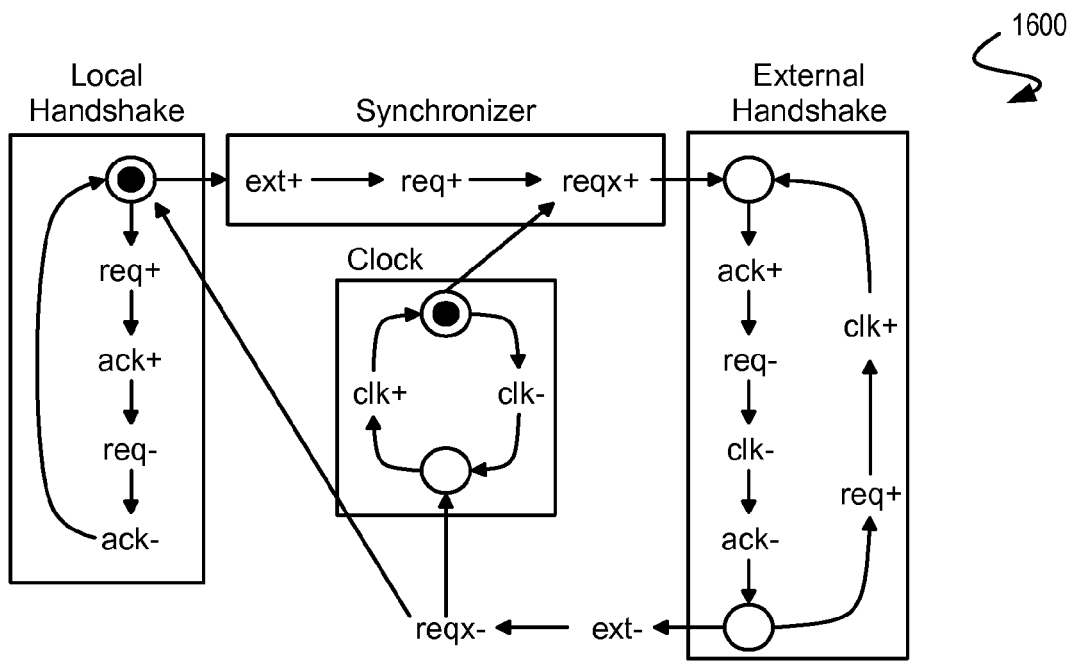
FIG. 16 depicts the behavior and circuit of an interface between an asynchronous device and an external circuit using a four-phase protocol and a synchronous device, according to one embodiment.
Figure 16:
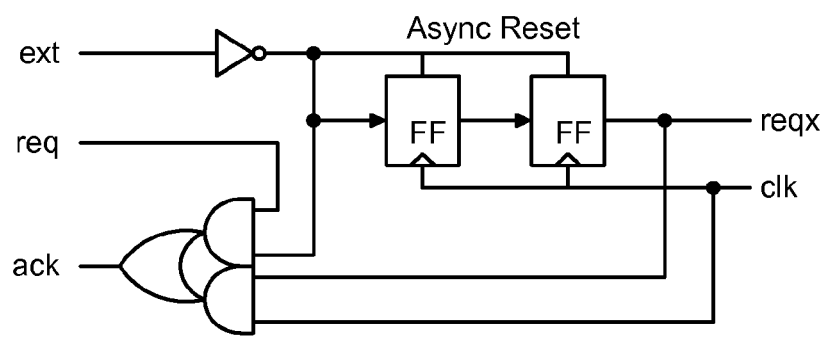
Figure 17A:
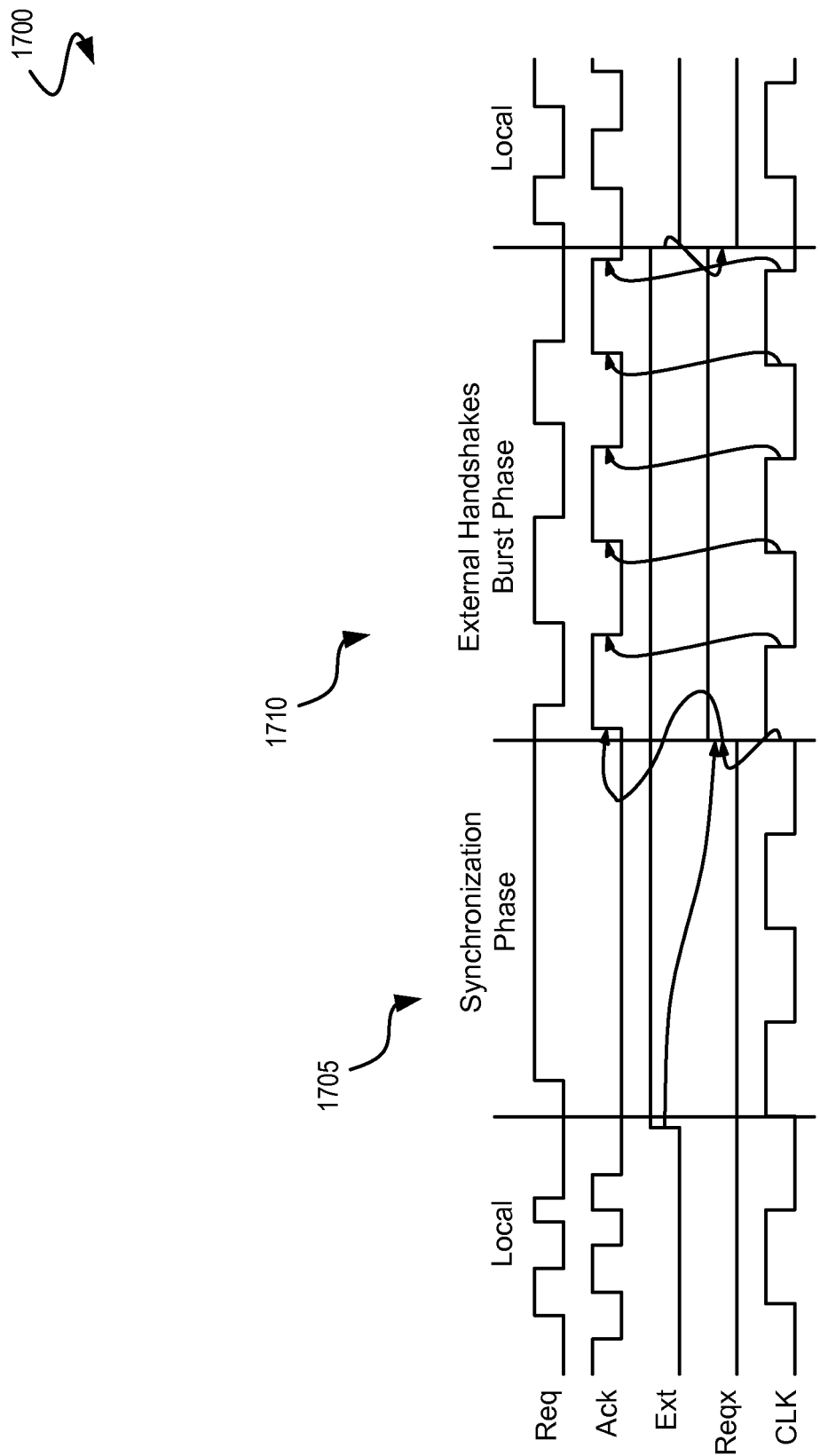
FIG. 17A depicts a timing diagram that describes the behavior of the interface between an asynchronous device and an external circuit, according to one embodiment.

A possible scheme for a synchronous-asynchronous interface is depicted in FIG. 16. It corresponds to a communication channel in which the circuit has an asynchronous interface and the environment has a synchronous interface. The behavior is described by the Signal Transition Graph 1600. A possible implementation of the corresponding controller 1650 is shown in FIG. 16. The circuit implements a four-phase handshake for the request (Ri) and acknowledge (Ao) signals of the asynchronous interface. In case the circuit requires a two-phase protocol, the protocol and interface 1500 depicted in FIG. 15 can be connected to adapt the protocols.

It should be recognized that the aforementioned synchronous circuit might well operate completely independently from the desynchronized circuits. In fact a synchronous circuit might have its own clock, and operate in a very different frequency range from the interfaced desynchronized circuit(s).

Figure 17B:
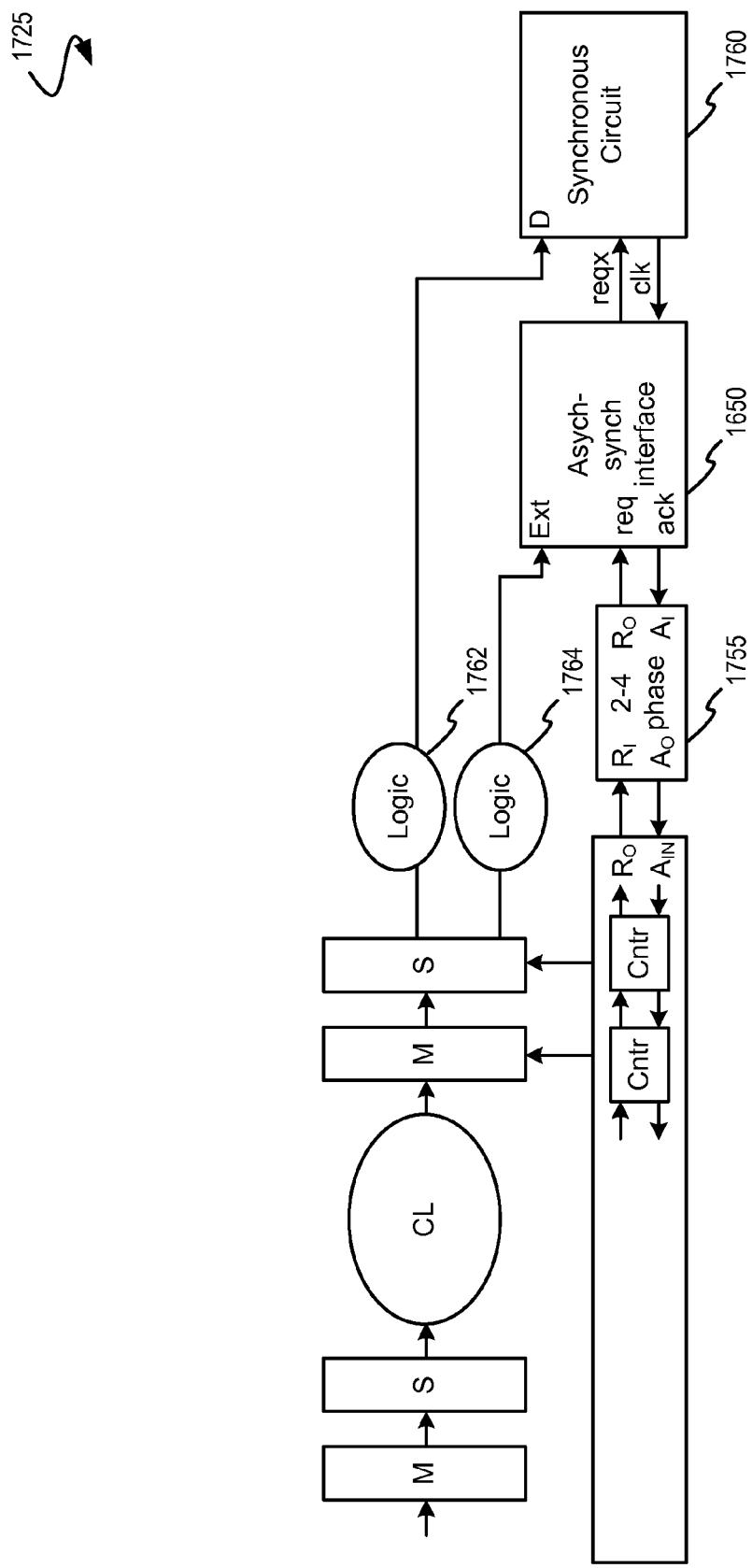
FIG. 17B depicts a block diagram that describes the interconnection of the interface between an asynchronous device and an external circuit, according to one embodiment.

The signal ext (external) indicates when the desynchronized circuit is willing to interact with the environment (ext=0, no external interaction; ext=1, external interaction). The synchronous interface has two control signals: reqx that indicates that the circuit is willing to interact with the environment, and clk that corresponds to the clock of the environment. An example is shown in FIG. 17B. In this example, the external circuit 1760 is a synchronous circuit (running on its own synchronous clock). The synchronous circuit periodically receives data at input D and samples D at each clock clk after assertion of signal reqx. As shown, the circuit 1725 might implement the logic of the circuit 1650.

When there is no external interaction (ext=0), the ack signal follows the behavior of the req signal, whereas the reqx signal remains at 0. During this phase, the clk signal is ignored and the circuit operates at the maximum speed allowed by the internal logic. This behavior is illustrated by the local phase in FIG. 17A.

When the circuit wants to interact with the environment, it raises the ext signal. After that, the next request (req=1) is propagated to the synchronous interface through a synchronizer, which in this example is composed of several flip-flops. These flip-flops are used to synchronize the req signal with the clock and avoid metastable behavior at the reqx signal. The events that might occur after raising the ext signal correspond to the 'Synchronization' phase shown in FIG. 17A.

During the interaction with the environment, the clock plays the role of the ack signal in the handshake. If the circuit interchange calls for multiple cycles of data exchange, such multiple exchanges may occur during the External Handshakes phase as shown in the timing diagram 1700, with no extra synchronization penalty required for the subsequent handshakes. This mode of operation operates when the circuit has a response time shorter than the cycle period of the clock minus the time required for the handshake logic. 17A Of course the aforementioned handshake method for interfacing an asynchronous circuit with a synchronous circuit might be implemented as shown in FIG. 17B. Referring to the circuit boundaries and signals as shown in FIG. 17B, specifically, the communication mechanism has two modes of operation:
Independent Mode: When ext=0, both sides (i.e. the asynchronous circuit and the synchronous circuit) run independently (no interaction). In this mode, each side operates as if disconnected from each other.
Synchronized Mode: When ext=1, the asynchronous circuit indicates that it wants to communicate with the synchronous circuit.

It should be emphasized that this scheme allows the asynchronous portions to run at optimum speed whenever not communicating with the external, synchronous portion. And similarly this scheme allows communication (when enabled) to proceed at the speed of the clock of the external synchronous circuit.

As shown, the protocol converter shown in FIG. 16 converts from a synchronous circuit signaling protocol (e.g. reqx and clk) to a 4-phase asynchronous handshake protocol (e.g. signals req and ack). Of course the four-phase protocol can be converted to a two-phase protocol by including a two-phase to four-phase converter 1755. As earlier described, a possible realization of a two-phase to four-phase converter shown in FIG. 15.

In further detail, the operation of the circuit in FIG. 16 is as follows. When ext=1, the asynchronous circuit starts handshaking with the synchronous circuit. This process continues for a finite number of cycles to properly synchronize the handshake signals of the asynchronous circuit with the clock of the synchronous circuit. These finite number of cycles serve for the synchronous circuit to read the reqx signal unambiguously (i.e. without metastability). The asynchronous to synchronous converter circuit 1650 shows a chain of two FFs. In fact however, the chain of two FFs could be an arbitrary chain of flip-flops (this is called a synchronizer). Use of an asynchronous to synchronous converter circuit is especially appropriate when the synchronous and asynchronous agents communicate through bursts of information (e.g. sending a burst of 16 items). The design implementation shown at 1650 requires only a short synchronization phase before engaging in bursting data. Indeed, a feature of this embodiment is that the synchronization latency is only paid once at the beginning of a burst (and not at each item of the burst). For example, and referring to the specific embodiment as shown at 1650, in order to send 16 items from an asynchronous circuit to a synchronous circuit, the protocol would incur two cycles for synchronization followed by 16 cycles (for communicating the burst of 16 items). Similarly, in order to send 1024 items from an asynchronous circuit to a synchronous circuit, the protocol would incur two cycles for synchronization followed by 1024 cycles (for communicating the burst of 1024 items).

Of course, a method for synthesizing an appropriate interface circuit corresponding to the type of external circuit includes steps to classify the circuit in the external environment as belonging to one of the aforementioned scenarios, namely, a 2-phase desynchronized circuit, a 4-phase desynchronized circuit, or a synchronous circuit. Once classified, the interface circuit can be synthesized directly by outputting a model of the logic gates depicted in interface embodiments 1500, or 1650, or any logical equivalent.

Now, in slightly more general terms, herein is disclosed a method for interfacing a desynchronized circuit with a synchronous environment that includes (1) operating the desynchronized circuit while concurrently operating the synchronous circuit, (2) signaling a synchronization request between the desynchronized circuit and the synchronous circuit; and (3) exchanging handshakes between the desynchronized circuit and the synchronous circuit.

The handshakes might include signals corresponding to a two-phase handshake protocol or via a four-phase handshake protocol; moreover the handshake protocol might include a synchronization phase 1705 and a burst phase 1710.

Those skilled in the art will immediately recognize that the exchanging handshake protocol of 1700 includes a short synchronization phase (just long enough to avoid metastability) and a burst phase of an arbitrarily number of cycles, or of an arbitrarily long period.

Of course, from the discussion of an automated flow for synthesis of desynchronized circuits, emerges a method for synthesizing an interfacing circuit for interfacing a desynchronized circuit with an external synchronous circuit, said method comprising steps including (1) classifying the desynchronized circuit if it is a two-phase desynchronized circuit or a four-phase desynchronized circuit (2) outputting the corresponding two-phase desynchronized interface or four-phase desynchronized interface 1700, and (3) outputting an asynchronous to synchronous communication interface circuit 1650.

Again, those skilled in the art will immediately recognize as distinctive characteristics of the exemplary asynchronous to synchronous communication interface circuit 1650 for transmitting data between a desynchronized circuit and a synchronous circuit said circuit comprising is free of any memory or register file, or FIFO, or any sequential/storage device of any sort used for storing the data transmitted during the burst cycles.

Implementation Options

The circuits, methods and systems described herein system may be implemented in either hardware or software or any combination of hardware and software.

As pertains to the hardware implementation, any circuit might be embodied in a hardware model (e.g. Verilog, VHDL, etc) or in/on a silicon substrate (e.g. within a semiconductor die or dies), or within a semiconductor package, or on a printed circuit board, or in, on or within or as part of any electronic system (e.g. a motherboard, or backplane, or chassis or rack).

As pertains to the software implementation, the invention comprises software that includes a plurality of computer executable instructions for implementation on a computer system with or without acceleration. Prior to loading into a general-purpose computer system, the software may reside as encoded information on a computer readable medium, such as a magnetic floppy disk, magnetic tape, and compact disc read only memory (CD-ROM). In one hardware implementation, the invention may comprise a dedicated processor including processor instructions for performing the functions described herein. Circuits may also be developed to perform or accelerate the functions described herein.

Figure 20:
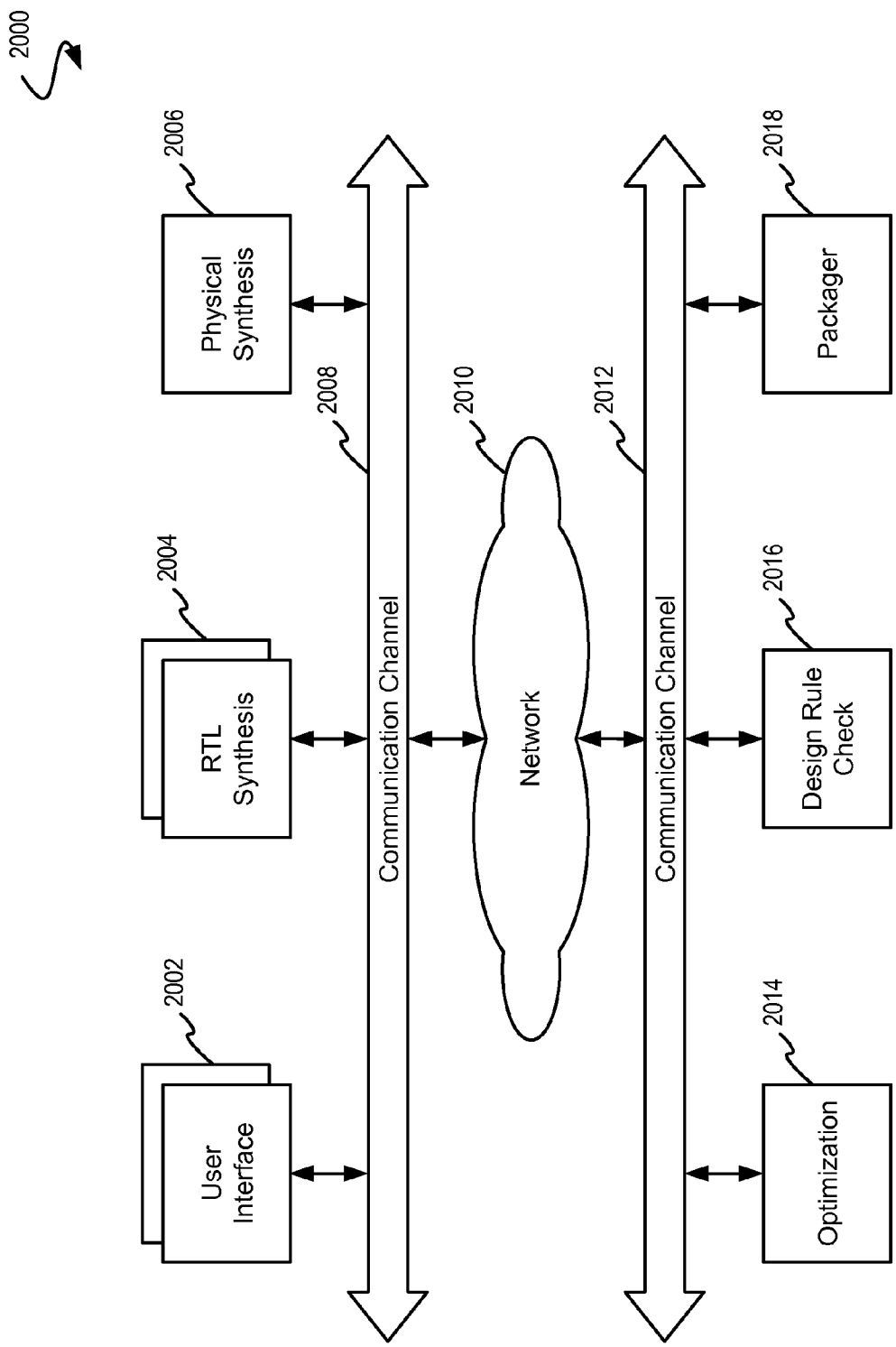
FIG. 20 is an illustration of an environment in which the methods herein might be practiced, according to one embodiment.

In some embodiments, circuits and systems described herein system may be implemented in a collection of components or modules. FIG. 20 depicts a possible mapping of a system for practicing the methods described herein. As shown, a user interface component 2002, an RTL synthesis component 2004, and a physical synthesis 2006 are all in communication, one with another via a first communication channel 2008. Similarly, the optimization component 2014, the design rule check component 2016, and packager 2018 are in communication via a second communication channel 2012, as shown. In some embodiments, there may be optionally a network cloud 2010 for communication between the first communication channel 2008 and the second communication channel 2012, possibly through any number of subnetworks (which themselves may contain subnetworks) within the cloud 2010. Also, in some embodiments, the first communication channel 2008 may be the same, or otherwise indistinguishable, from the second communication channel 2012. Within the flexibility of such possible mappings, one skilled in the art can readily see that the user interface component 2002 might be adapted to be operable on a laptop computer in communication with, for example, the design rule check component, with such communication taking place over the network. In exemplary embodiments, there may be more than one instance of a user interface component 2002, and in some embodiments, a given instance of a user interface component 2002 may share some or no similarities to a second or nth user interface component 2002, in fact a user interface component might have a one-to-one correspondence to any component (or sub component) present in the system 2000.

In some embodiments, circuits and systems described herein system may be implemented in whole or in part in a client-server arrangement. In fact, the aforementioned components for carrying out the methods or for producing the circuits disclosed here (e.g. 2002, 2004, 2006, 2014, 2016, and 2018) might be implemented in one or more software modules.

Although the present invention has been described in terms of specific exemplary embodiments, it will be appreciated that various modifications and alterations might be made by those skilled in the art without departing from the spirit and scope of the invention.

What is claimed is:

1. A system for regulating voltage to a plurality of circuit elements in a datapath to maximize power efficiency in a desynchronized circuit, the system, comprising:
    a first controller circuit, the first controller circuit comprising at least a first pulsed latch enable signal, a request signal output and an acknowledge signal input;
    a second controller circuit, the second controller circuit comprising at least second pulsed latch enable signal, a request signal input and an acknowledge signal output;
    a request event conductor to transmit the request signal output of the first controller circuit to the request signal input of the second controller circuit;
    an acknowledge event conductor to transmit the acknowledge signal output of the second controller circuit to the acknowledge signal input of the first controller circuit;
    a detector component, comprising a filter circuit, to detect a speed mismatch over a selectable period of time to determine a time separation between a first time of arrival of a request event signal assertion on the request signal output and a second time of arrival of an acknowledge event signal assertion on the acknowledge signal output, wherein the selectable period of time is based at least in part on a selectable number of samples; and
    a compensator circuit to adjust a supply voltage to the plurality of circuit elements in the data path based on the detected time separation.

2. The system as set forth in claim 1, wherein the compensator circuit is operable for being initialized using at least one of, a hardware initialization, a software initialization, or an external initialization.

3. The system as set forth in claim 1, wherein the compensator circuit comprises at least one of, a signal to raise a voltage, a signal to lower a voltage, a signal to select a number of samples.

4. The system as set forth in claim 1, wherein the detector component comprises at least one of, detecting a two-phase controller event, detecting a four-phase controller event, detecting a synchronous clock event.

5. The system as set forth in claim 1, wherein the compensator circuit to adjust the voltage comprises adjusting at least one of, a supply voltage, a bias voltage.

6. The system of claim 1, wherein the compensator circuit lowers the voltage of the first controller circuit when the first time of arrival of a request event signal assertion occurs before the second time of arrival of an acknowledge event signal assertion.

7. The system of claim 1, wherein the compensator circuit lowers the voltage of the second controller circuit when the second time of arrival of an acknowledge event signal assertion occurs before the first time of arrival of a request event signal assertion.

8. The system of claim 1, wherein the first pulsed latch enable signal is operable to enable a first level-sensitive latch.

9. The system of claim 1, wherein the second pulsed latch enable signal is operable to enable a second level-sensitive latch.

10. The system of claim 1, further comprising a pulse generator that transforms every transition of the first control signal into a pulse operable to enable the first level-sensitive latch.

11. The system of claim 1, wherein the filter comprises a number of samples that is initialized under external control.

12. The system of claim 11 wherein the number of samples are dynamically varied based at least in part on actual operating conditions.

13. The system of claim 1, wherein the filter comprises a fixed-length hardware FIFO.

* * * * *